United States Patent
Prince et al.

(10) Patent No.: US 11,742,440 B2
(45) Date of Patent: Aug. 29, 2023

(54) ALL-BACK-CONTACT PEROVSKITE SOLAR CELLS

(71) Applicants: Alliance for Sustainable Energy, LLC, Golden, CO (US); Colorado School of Mines, Golden, CO (US)

(72) Inventors: Kevin Joseph Prince, Golden, CO (US); Colin Andrew Wolden, Denver, CO (US); Lance Michael Wheeler, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 17/498,448

(22) Filed: Oct. 11, 2021

(65) Prior Publication Data
US 2022/0115547 A1    Apr. 14, 2022

Related U.S. Application Data

(60) Provisional application No. 63/089,627, filed on Oct. 9, 2020.

(51) Int. Cl.
*H01L 31/0224* (2006.01)
*H01L 31/0216* (2014.01)

(52) U.S. Cl.
CPC ............ *H01L 31/022441* (2013.01); *H01L 31/02167* (2013.01)

(58) Field of Classification Search
CPC ......... H01L 31/022441; H01L 31/0516; H01L 51/42–448; H01L 31/02167
See application file for complete search history.

(56) References Cited

U.S. PATENT DOCUMENTS

| | | | |
|---|---|---|---|
| 2014/0158193 A1* | 6/2014 | Desphande | H01L 31/1896 438/98 |
| 2015/0287843 A1 | 10/2015 | Cheng | |
| 2018/0261708 A1 | 9/2018 | Hayase et al. | |
| 2018/0286596 A1* | 10/2018 | Snaith | H01L 51/4226 |

FOREIGN PATENT DOCUMENTS

| | | | | |
|---|---|---|---|---|
| CN | 111312901 A | * | 6/2020 | |
| EP | 3389096 A1 | * | 10/2018 | H01L 31/022425 |

OTHER PUBLICATIONS

Properties of SiO2 and Si3N4 at 300K, <https://eesemi.com/sio2si3n4.htm>, 2004 (Year: 2004).*

(Continued)

*Primary Examiner* — Andrew J Golden
(74) *Attorney, Agent, or Firm* — Michael A. McIntyre

(57) ABSTRACT

The present disclosure relates to an all-back-contact photovoltaic device that includes, in order, a substrate, a first electrode having a first surface, an insulator, a second electrode having a second surface, and an active material, where the insulator and the second electrode form a cavity, the active material substantially fills the cavity and is in physical contact with the first surface and the second surface, the insulator includes a first layer and a second layer with the second layer positioned between the first layer and the second contact, and the first layer is constructed of a first material that is different than a second material used to construct the second layer.

13 Claims, 54 Drawing Sheets

(56) References Cited

OTHER PUBLICATIONS

CN-111312901-A English machine translation (Year: 2020).*
Resistivity of Aluminum Oxide, The Physics Factbook, < https://hypertextbook.com/facts/2006/EuniceHuang.shtml#:~:text=Alumina%20has%20an%20electrical%20resistivity,from%2094%25%20to%2099.9%25.>, 2006 (Year: 2006).*
Keding et al, Study of the Electrical Insulation of Dielectric Passivation Layers and Stacks for Back-Contact Back-Junction Silicon Solar Cells, 28th European PV Solar Energy Conference and Exhibition, Sep. 30-Oct. 4, 2013, Paris, France (Year: 2013).*
Wang et al, Efficient Inverted Planar Perovskite Solar Cells Using Ultraviolet/Ozone-Treated NiOx as the Hole Transport Layer, Sol. RRL 2019, 3, 1900045 (Year: 2019).*
Baca, D.M. et al., "Solution-processed antireflective coating for back-contact perovskite solar cells," Optics Express, vol. 28, No. 9, Apr. 2020, 11 pages.
Deluca, G. et al., "Transparent Quasi-Interdigitated Electrodes for Semitransparent Perovskite Back-Contact Solar Cells," Applied Energy Materials, 2018, vol. 1, 6 pages.
Fang, G. et al.., "Optimized analysis of back-contact perovskite solar cells architectures," Optik—International Journal for Light and Electron Optics, vol. 207, 2020, 6 pages.
Hu, Y. et al., "Perovskite solar cells with a hybrid electrode structure," AIP Advances, vol. 9, 2019, 5 pages.
Hu, Z. et al., "Transparent Conductive Oxide Layer and Hole Selective Layer Free Back-Contacted Hybrid Perovskite Solar Cell," Journal of Physical Chemistry C, vol. 121, 2017, 6 pages.
Huo, Q. et al., "Back-contact perovskite solar cells with honeycomb-like charge collecting electrodes," Nano Energy, vol. 50, 2018, 7 pages.
Jumabekov, A.N. et al., "Back-contacted hybrid organic-inorganic perovskite solar cells," Journal of Materials Chemistry C, vol. 4, 2016, 6 pages.
Jumabekov, A.N. et al., "Fabrication of Back-Contact Electrodes Using Modified Natural Lithography," Applied Energy Materials, vol. 1, 2018, 6 pages.
Lin, X. et al., "Dipole-field-assisted charge extraction in metal-perovskite-metal back-contact solar cells," Nature Communications, vol. 8, 2017, 8 pages.
Lin, X. et al., "Honeycomb-shaped charge collecting electrodes for dipole-assisted back-contact perovskite solar cells," Nano Energy, vol. 67, 2020, 8 pages.
Song, Y. et al., "Efficient lateral-structure perovskite single crystal solar cells with high operational stability," Nature Communications, vol. 11, 2020, 8 pages.
Fainter, G.D. et al., "Long-Range Charge Extraction in Back-Contact Perovskite Architectures via Suppressed Recombination," Joule, vol. 3, 2019, 14 pages.
Wang, K. et al., "Surface Treatment on Nickel Oxide to Enhance the Efficiency of Inverted Perovskite Solar Cells," Hindawi International Journmal of Photoenergy, 2019, Article ID 4360816, 7 pages.
Wong-Stringer, M. et al., "A flexible back-contact perovskite solar micro-module," Energy Environmental Science, vol. 12, 2019, 10 pages.
Yang, W. et al., "Optical design and optimization for back-contact perovskite solar cells," Solar Energy, vol. 201, 2020, 8 pages.
Yoshikawa, K. et al., "Silicon heterojunction solar cell with interdigitated back contacts for a photoconversion efficiency over 26%," Nature Energy, vol. 2, Mar. 2017, 8 pages.
Ma, T. et al., "Unveil the Full Potential of Integrated-Back-Contact Perovskite Solar Cells Using Numerical Simulation," ACS Applied Energy Materials, vol. 1, 2018, 6 pages.
Richter, A. et al., "n-Type Si solar cells with passivating electron contact: Identifying sources for efficiency limitations by wafer thickness and resistivity variation," Solar Energy Materials and Solar Cells, vol. 173, 2017, 10 pages.
Yang, Z. et al., "Device physics of back-contact perovskite solar cells," Energy & Environmental Science, vol. 13, 2020, 13 pages.

* cited by examiner

Incomplete NiO$_x$
after 300°C Anneal

Homogeneous NiO$_x$
after UV-Ozone

ALL-BACK-CONTACT PEROVSKITE SOLAR CELLS

CROSS-REFERENCE TO RELATED APPLICATIONS

This application claims priority from U.S. Provisional Patent Application No. 63/089,627 filed Oct. 9, 2020, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

Thin-film photovoltaic (PV) technologies traditionally utilize a planar architecture where the absorbing active material is positioned between selective carrier contacts. This architecture allows sequential planar depositions on substrates which can be processed at relatively high speeds compared to wafer processing. However, the transparent selective contact and electrode can absorb or reflect photons and prevent them from being absorbed by the active layer. Thus, there remains a need for novel PV device architectures that address these deficiencies.

SUMMARY

An aspect of the present disclosure is an all-back-contact photovoltaic device that includes, in order, a substrate, a first electrode having a first surface, an insulator, a second electrode having a second surface, and an active material, where the insulator and the second electrode form a cavity, the active material substantially fills the cavity and is in physical contact with the first surface and the second surface, the insulator includes a first layer and a second layer, the second layer is positioned between the first layer and the second contact, and the first layer is constructed of a first material that is different than a second material used to construct the second layer. In some embodiments of the present disclosure, the active material includes at least one of a perovskite, CdTe, a CIGS material, a CZTS material, silicon, and/or an organic material.

In some embodiments of the present disclosure, the first material may include at least one of a first polymer and/or a first inorganic material. In some embodiments of the present disclosure, the first polymer may include at least one of poly(methyl methacrylate), a cellulose, a polyimide, a polychloroprene, polyethylene terephthalate, a polyester, a polyolefin, polystyrene, and/or polyvinylchloride. In some embodiments of the present disclosure, the first metal oxide may include at least one of aluminum oxide, silicon dioxide, zirconium dioxide, beryllium oxide, magnesium oxide, iron oxide, aluminum nitride, silicon carbide, and/or hafnium oxide. In some embodiments of the present disclosure, the second material may include at least one of a second polymer and/or a second inorganic material. In some embodiments of the present disclosure, the second polymer may include at least one of poly(methyl methacrylate), a cellulose, a polyimide, a polychloroprene, polyethylene terephthalate, a polyester, a polyolefin, polystyrene, and/or polyvinylchloride.

In some embodiments of the present disclosure, the second metal oxide may include at least one of aluminum oxide, silica, beryllium oxide, magnesium oxide, iron oxide, aluminum nitride, silicon carbide, or hafnium oxide. In some embodiments of the present disclosure, the first layer may include silica and the second layer may include alumina. In some embodiments of the present disclosure, the first layer may have a thickness between about 1 nm and about 100 µm. In some embodiments of the present disclosure, the second layer may have a thickness between about 1 nm and about 100 µm. In some embodiments of the present disclosure, the insulator may have a resistance greater than $10^9$ Ohm*cm.

In some embodiments of the present disclosure, the cavity may have a cross-sectional area between about 1 $nm^2$ and about 1 $mm^2$ or between about 10 $nm^2$ an about 100 $µm^2$. In some embodiments of the present disclosure, the first electrode may include a first contact layer and a first charge transport layer, wherein the first contact layer is between the first charge transport layer and the substrate. In some embodiments of the present disclosure, the first contact layer may include at least one of a metal and/or a doped metal oxide. In some embodiments of the present disclosure, the metal may include at least one of gold, silver, aluminum, copper, and/or titanium, In some embodiments of the present disclosure, the doped metal oxide may include at least one of indium-doped tin oxide, aluminum-doped zinc oxide, and/or indium-doped zinc oxide. In some embodiments of the present disclosure, the first charge transport material may include an electron transport material. In some embodiments of the present disclosure, the electron transfer material may include at least one of $TiO_2$, $SnO_2$, ZnO, CeO, $WO_3$, $In_2O_3$, $Fe_2O_3$, $Nb_2O_5$, C60, and/or PCBM. In some embodiments of the present disclosure, the first charge transport material may include a hole transport material.

BRIEF DESCRIPTION OF DRAWINGS

Some embodiments are illustrated in referenced figures of the drawings. It is intended that the embodiments and figures disclosed herein are to be considered illustrative rather than limiting.

FIGS. 22A-D illustrate statistical data for various PV metrics as a function of the diameter of the pillars at a fixed pitch, according to some embodiments of the present disclosure.

REFERENCE NUMERALS

Figure 1:
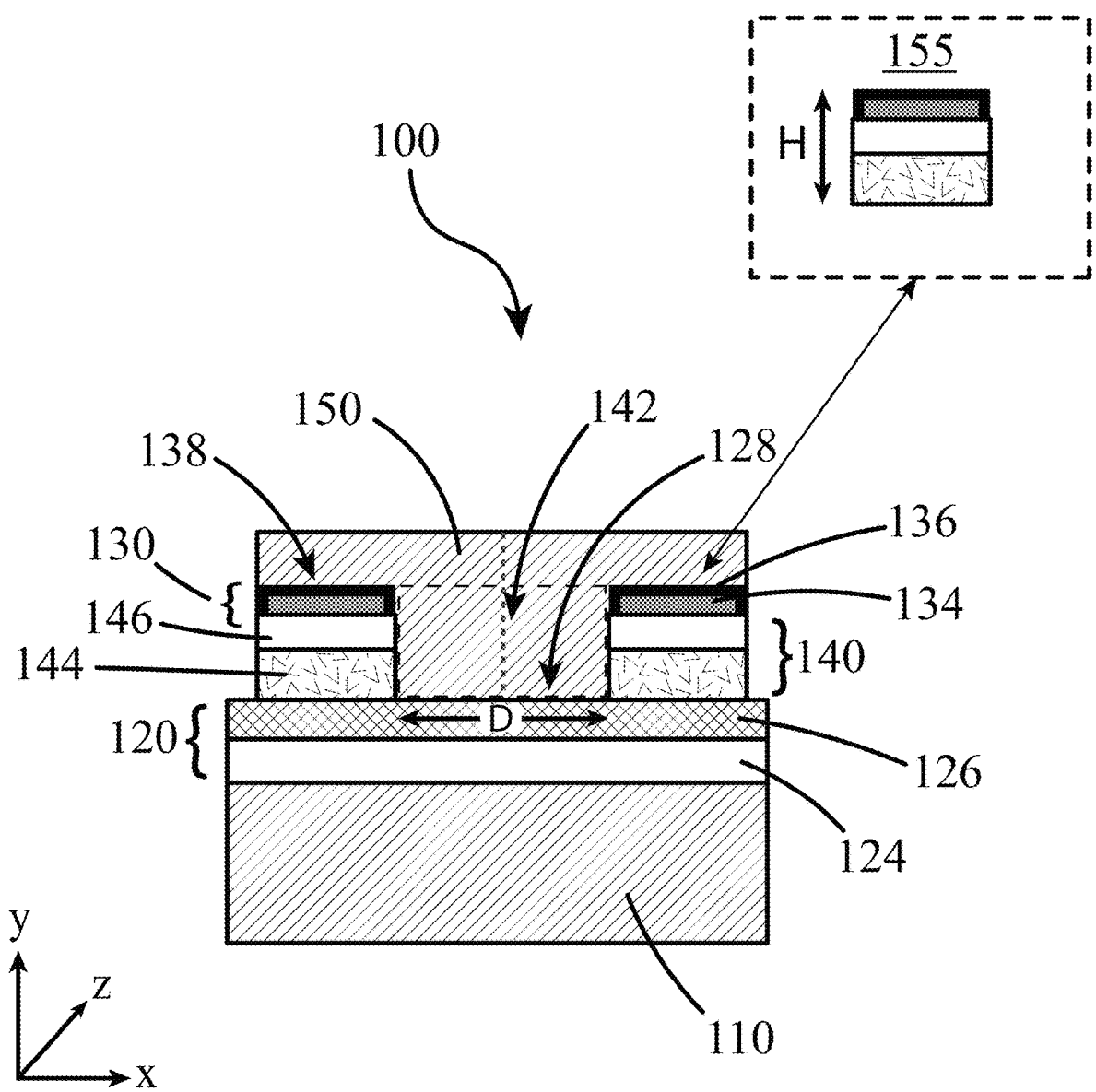
FIG. 1 illustrates a device, according to some embodiments of the present disclosure.

100 . . . all-back-contact device
110 . . . substrate
120 . . . first electrode
124 . . . first contact layer
126 . . . first charge transport layer
128 . . . first surface
130 . . . second electrode
134 . . . second contact layer
136 . . . second charge transport layer
138 . . . second surface
140 . . . insulator
142 . . . cavity
144 . . . first layer of insulator
146 . . . second layer of insulator
150 . . . active material
155 . . . stack

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, +0.7%, +0.6%, ±0.5%, +0.4%, +0.3%, ±0.2%, or ±0.1% of a specific numeric value or target.

The all-back-contact (ABC) architecture for solar cells, for example, perovskite solar cells, represents untapped potential for higher efficiency and enhanced durability compared to conventional vertical architectures. Interface engineering has been pivotal for both high efficiency and good stability in perovskite solar cells, but it is more complex in ABC designs because both the electron and hole transport layers are simultaneously exposed during processing. Described herein are ABC perovskite solar cell designs that demonstrate state-of-the-art power conversion efficiencies greater than 10% by, among other things, careful control of interface processing. For example, manipulation of a hole selective contact increased the work function of a NiO$_x$ hole transport layer and reduced the density of charged interface defects, resulting in higher voltage and improved current collection. This disclosure highlights the importance of coupled interface formation to enable a new class of high-efficiency architectures for perovskite solar cells.

FIG. 1 illustrates an all-back-contact (ABC) photovoltaic device 100, according to some embodiments of the present disclosure. This exemplary device 100 has a device architecture that includes a substrate 110, a first electrode 120 having a first surface 128, an insulator 140, a second electrode 130 having a second surface 138, and an active material 150. The insulator 140 and the second electrode 130 form a cavity 142 (as designated by the box defined by the dashed line), such that the active material 150 substantially fills the cavity 142 and is in physical contact with the first surface 128 and the second surface 138. More specifically, a cavity 142 may be defined as the volume formed between the boundaries of the first surface 128, the second surface 138, and the vertical walls (aligned in the y-direction) formed by the second electrode 130 positioned on the insulator 140. The insulator 140 includes a first layer 144 and a second layer 146 with the second layer 146 positioned between the first layer 144 and the second electrode 130. Further, the first layer 144 is constructed of a first material that is different than the second material used to construct the second layer 146. As shown below, the combination of stacked layers, insulator layers (144 and 146) and electrode layers (134 and 136) form a single composite film surrounding a plurality of separated distinct cavities 142. This combination of stacked layers is referred to herein as a "stack" and is indicated in the dotted boxed panel in FIG. 1 as reference numeral 155. Thus, a stack 155 may be defined by a height (H) and defines the outer boundaries of the cavities 142 and their diameter (D), as shown in FIG. 1. Further, the distance between center points (vertical dashed gray line) of adjacent cavities 142 is referred to herein as the pitch. As shown herein, in some embodiments of the present disclosure, the cavities 142 defined by the surrounding stack 155 may have a circular cross-section in the xz-plane. However, other cross-sectional shapes fall within the scope of the present disclosure; e.g., square, triangular, hexagonal, and/or any other suitable polygon.

Referring again to FIG. 1, an active material 150 may include at least one of a perovskite, a CdTe material, a CIGS material, a CZTS material, an organic material, and/or any other photovoltaically active material. In some embodiments of the present disclosure, the first material used to construct a first layer 144 of an insulator 140 may include at least one of a first polymer and/or a first inorganic material. A first polymer used for constructing a first layer 144 of an insulator 140 may include at least one of poly(methyl methacrylate), a cellulose, a polyimide, a polychloroprene, polyethylene terephthalate, a polyester, a polyolefin, polystyrene, and/or polyvinylchloride. In some embodiments of the present disclosure, a first metal oxide used to construct a first layer 144 of an insulator 140 may include at least one of aluminum oxide, silica, beryllium oxide, magnesium oxide, iron oxide, aluminum nitride, silicon carbide, and/or hafnium oxide.

In some embodiments of the present disclosure, the second material used to construct a second layer 146 of an insulator 140 may include at least one of a second polymer and/or a second metal oxide. A second polymer used for constructing a second layer 146 of an insulator 140 may include at least one of poly(methyl methacrylate), a cellulose, a polyimide, a polychloroprene, polyethylene terephthalate, a polyester, a polyolefin, polystyrene, and/or polyvinylchloride. In some embodiments of the present disclosure, a second metal oxide used to construct a second layer 146 of an insulator 140 may include at least one of aluminum oxide, silica, beryllium oxide, magnesium oxide, iron oxide, aluminum nitride, silicon carbide, and/or hafnium oxide. In some embodiments of the present disclosure the materials used to construct the first layer 144 and the second layer 146 of an insulator 140 may be the same material, of different materials, or combinations thereof.

In some embodiments of the present disclosure, a first layer 144 of an insulator 140 may be constructed of silica, with a second layer 146 of the insulator 140 constructed of alumina. Further, both the first layer 144 and the second layer 146 of an insulator 140 may have individual thicknesses between about 1 nm and about 100 µm. In some embodiments of the present disclosure, both the first layer 144 and the second layer 146 of an insulator 140 may have individual thicknesses between about 10 nm and about 500 nm. In some embodiments of the present disclosure, both the first layer 144 and the second layer 146 of an insulator 140 may have individual thicknesses between about 10 nm and about 60 nm. In some embodiments of the present disclosure, an insulator 140 of a device 100 may have a resistance greater than $10^9$ Ohm*cm (measured as the total resistance across both the first layer 144 and the second layer 146). Further, referring again to FIG. 1, in some embodiments of the present disclosure, a cavity 142 may have a diameter (D) between about 1 µm and about 20 µm, or between about 1 µm and about 10 µm. In some embodiments of the present disclosure, the pitch between the center points of adjacent cavities 142 may be between about 1 µm and about 50 µm, or between about 1 µm and about 20 µm. In some embodiments of the present disclosure, the height of a stack may be between about 1 nm and 10 µm, or between 50 nm and 500 nm.

In some embodiments of the present disclosure, a cavity 142 may have a cross-sectional area (i.e., the area of the first surface 128 of the first electrode 120 in contact with the active material 150 in the xz-plane) between about 1 $nm^2$ and about 1 $mm^2$ or between about 10 $nm^2$ an about 100 $µm^2$. In some embodiments of the present disclosure, the surface area of the second surface 138 of the second electrode 130 in contact with the active material 150 in the xz-plane may be between about 1 $nm^2$ and about 1 $mm^2$ or between about 10 $nm^2$ an about 100 $µm^2$.

Referring again to FIG. 1, a first electrode 120 may include a first contact layer 124 and a first charge transport layer 126, where the first contact layer 124 is between the first charge transport layer 126 and the substrate 110. In some embodiments of the present disclosure, a first contact layer 124 of a first electrode 120 may include at least one of a metal and/or a doped metal oxide and the first charge transport layer 126 of the first electrode 120 may be constructed of a first charge transport material. In some embodiments of the present disclosure, a metal used to construct the first contact layer 124 of a first electrode 120 may include at least one of gold, silver, aluminum, copper, and/or titanium. In some embodiments of the present disclosure, a doped metal oxide used to construct the first contact layer 124 of a first electrode 120 may include at least one of indium-doped tin oxide, aluminum-doped zinc oxide, and/or indium-doped zinc oxide. A first charge transport material used to construct the first charge transport layer 126 of a first electrode 120 may be an electron transport material or a hole transport material. In some embodiments of the present disclosure, an electron transfer material used to construct the first charge transport layer 126 of a first electrode 120 may include at least one of $TiO_2$, $SnO_2$, C60, and/or PCBM. In some embodiments of the present disclosure, a hole transfer material used to construct the first charge transport layer 126 of a first electrode 120 may include at least one of nickel oxide, copper oxide, spiro-MeOTAD, and/or EH44.

Referring again to FIG. 1, a second electrode 130 may include a second contact layer 134 and a second charge transport layer 136, where the second contact layer 134 is positioned between the second charge transport layer 136 and the insulator 140. In some embodiments of the present disclosure, a second contact layer 134 of a second electrode 130 may include at least one of a metal and/or a doped metal oxide and the second charge transport layer 136 of the second electrode 130 may be constructed of a second charge transport material. In some embodiments of the present disclosure, a metal used to construct the second contact layer 134 of a second electrode 130 may include at least one of nickel, gold, silver, aluminum, copper, and/or titanium. In some embodiments of the present disclosure, a doped metal oxide used to construct a second contact layer 134 of a second electrode 130 may include at least one of indium-doped tin oxide, aluminum-doped zinc oxide, and/or indium-doped zinc oxide. A second charge transport material used to construct a second charge transport layer 136 of a second electrode 130 may be an electron transport material or a hole transport material. In some embodiments of the present disclosure, an electron transfer material used to construct a second transport layer 136 of a second contact 130 may include at least one of $TiO_2$, $SnO_2$, C60, and/or PCBM. In some embodiments of the present disclosure, a hole transfer material used to construct a second charge transport layer 136 of a second electrode 130 may include at least one of nickel oxide, copper oxide, vanadium oxide, copper iodide, copper thiocyanate, spiro-MeOTAD, polytriarylamine, and/or EH44. In some embodiments of the present disclosure, each of the layers used to construct the first electrode 120 (its first contact layer 124 and first charge transport layer 126) and the second electrode 130 (its second contact layer 134 and second charge transport layer 136) may have a thickness greater than about 10 nm.

All-back-contact (ABC) devices having architectures as described above, that employ both electrodes on the same side of the active material offer several potential benefits. Among other things, an ABC device can eliminate reflection and parasitic absorption associated with front electrodes, which increases the amount of light that reaches the active material (e.g., perovskite) and thus the maximum achievable current and efficiency. In addition, an ABC device can remove the charge transport from the front interface, allowing a host of passivation and encapsulation strategies that do not require idealized charge transport to be employed. Further, an ABC device can enable unique in-situ characterization techniques that probe the perovskite under device operation.

Figure 2A:
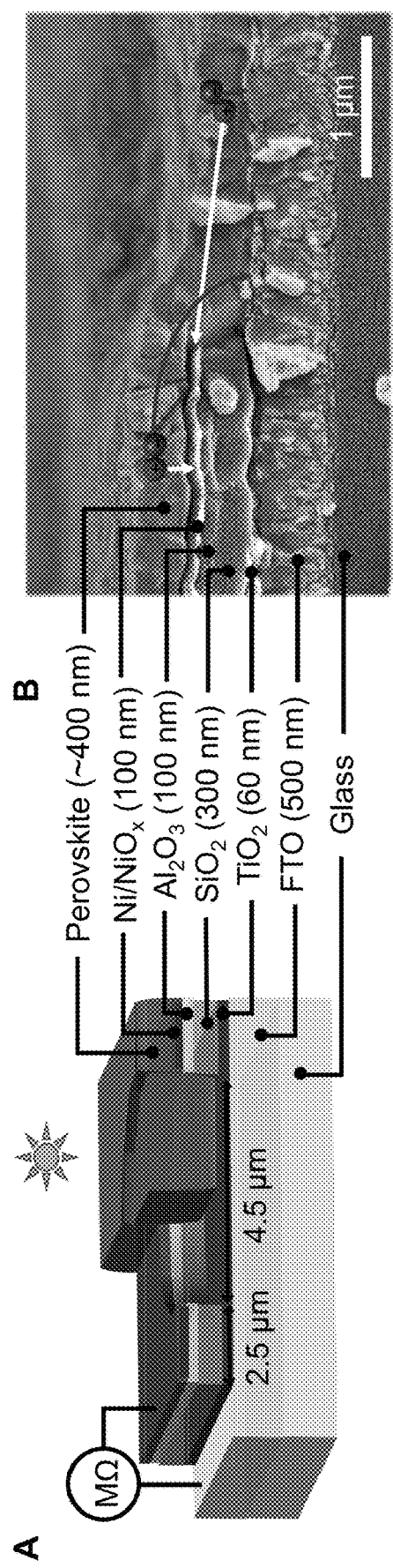
FIG. 2A illustrates (Panel A) a device schematic highlighting the electrode architecture and coupled interfaces and (Panel B) a false-colored cross-section scanning electron microscopy (SEM) image of a completed ABC device highlighting the dual insulator and conformal perovskite layer, according to some embodiments of the present disclosure.
Figure 2B:
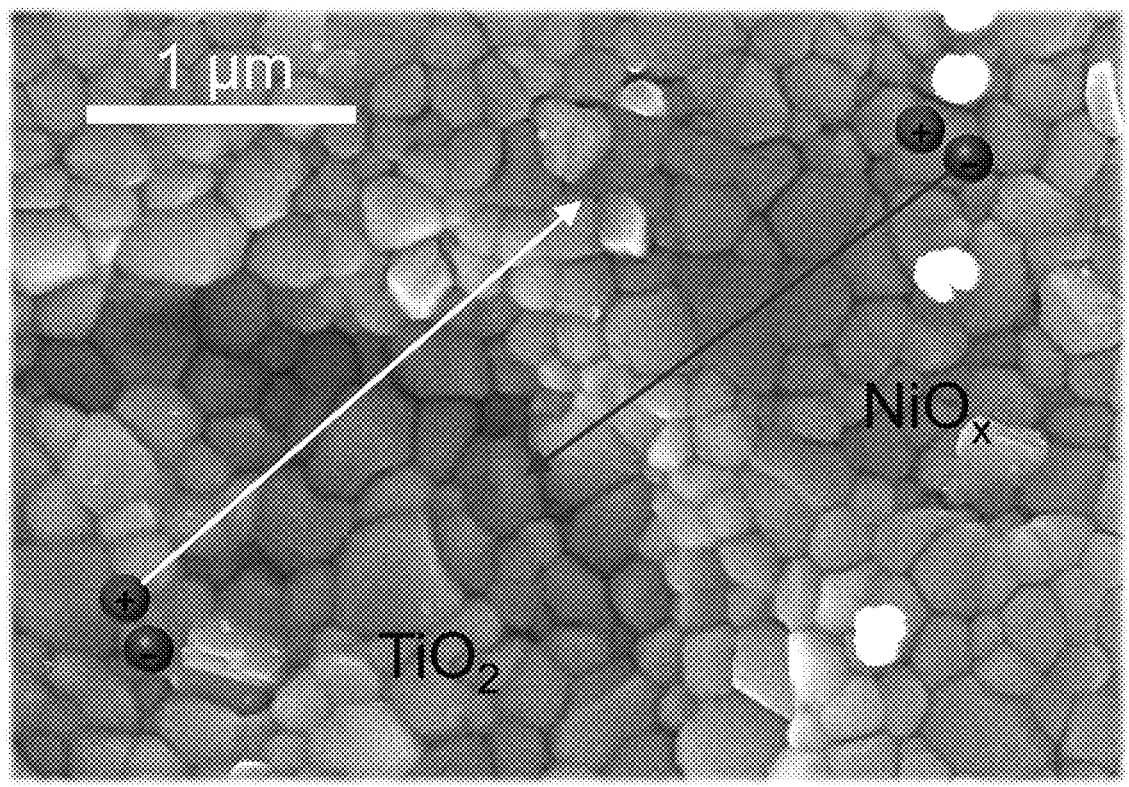
FIG. 2B illustrates a false-colored plan-view SEM image at the interface of the transport layers, according to some embodiments of the present disclosure. The spheres illustrate extraction pathways for generated electrons (−) and holes (+).

Among other things, ABC electrode fabrication should address at least the following three manufacturing areas: (1) patterning the electrodes with resolution at scales less than, or equal to, the diffusion length of photogenerated carriers in the active material (e.g., perovskite), (2) achieving high shunt resistance between the two electrodes, and (3) maintaining optimum interfaces throughout formation of the device. These three areas are addressed herein by, among other things, utilizing device having a 7 μm pitch (pitch is defined as the distance between center points in the cavities) with 4.5 μm diameter holes (see Panel A of FIG. 2A) in a honeycomb array (see FIG. 2C). A high shunt resistance was achieved by using an insulator having two layers of insulators, each constructed of a different material, (e.g., two layers of an insulator) to electrically isolate the two electrodes (see Panels A and B of FIG. 2A). Single insulator layers (144 and 146) of alumina or silica of equivalent thickness provided only kΩ range resistance from two-point ohmmeter measurements (see Table 1). However, in some embodiments of the present disclosure, deposition of a second insulator layer 146 of alumina sequentially over a first insulator layer 144 of silica drastically increased the shunt resistance from the kW range to >1 MΩ.

TABLE 1

Two probe ohmmeter measurements of bare electrodes after lifting off the photoresist. Eight devices with two measurements for each device gave the average values.

| Insulator separation between FTO/$TiO_2$ and Ni | Average 2-point ohmmeter measurement between FTO and Ni |
|---|---|
| 400 nm $SiO_2$ | 29.4 kQ ± 21.8 kQ |
| 300 nm $SiO_2$ + 100 nm $Al_2O_3$ | 8.04 MΩ ± 1.00 MΩ |

Figure 2C:
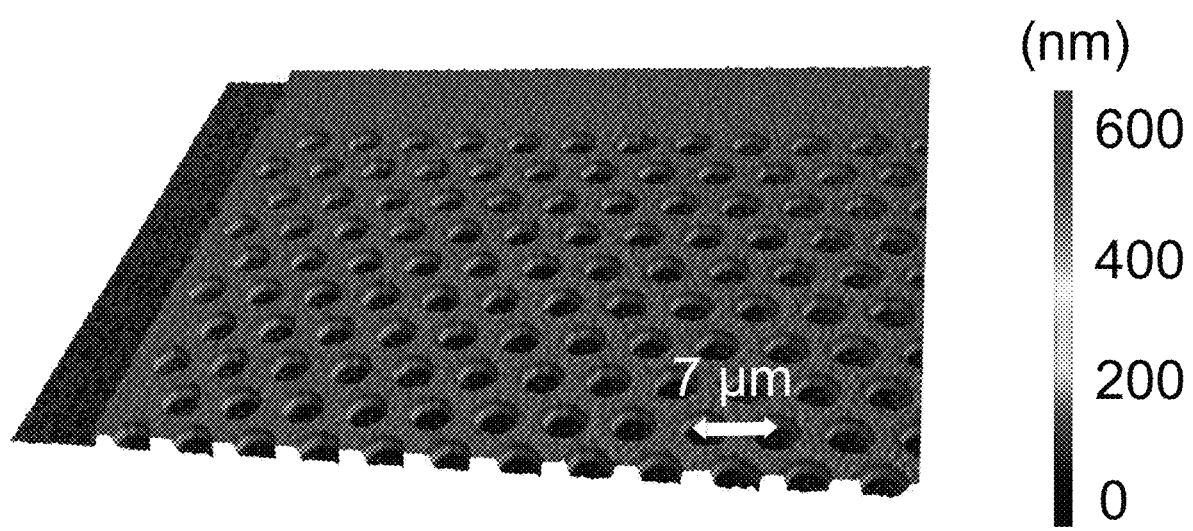
FIG. 2C illustrates 3D profilometry image of the bare honeycomb quasi-interdigitated electrodes, according to some embodiments of the present disclosure.
Figure 2D:
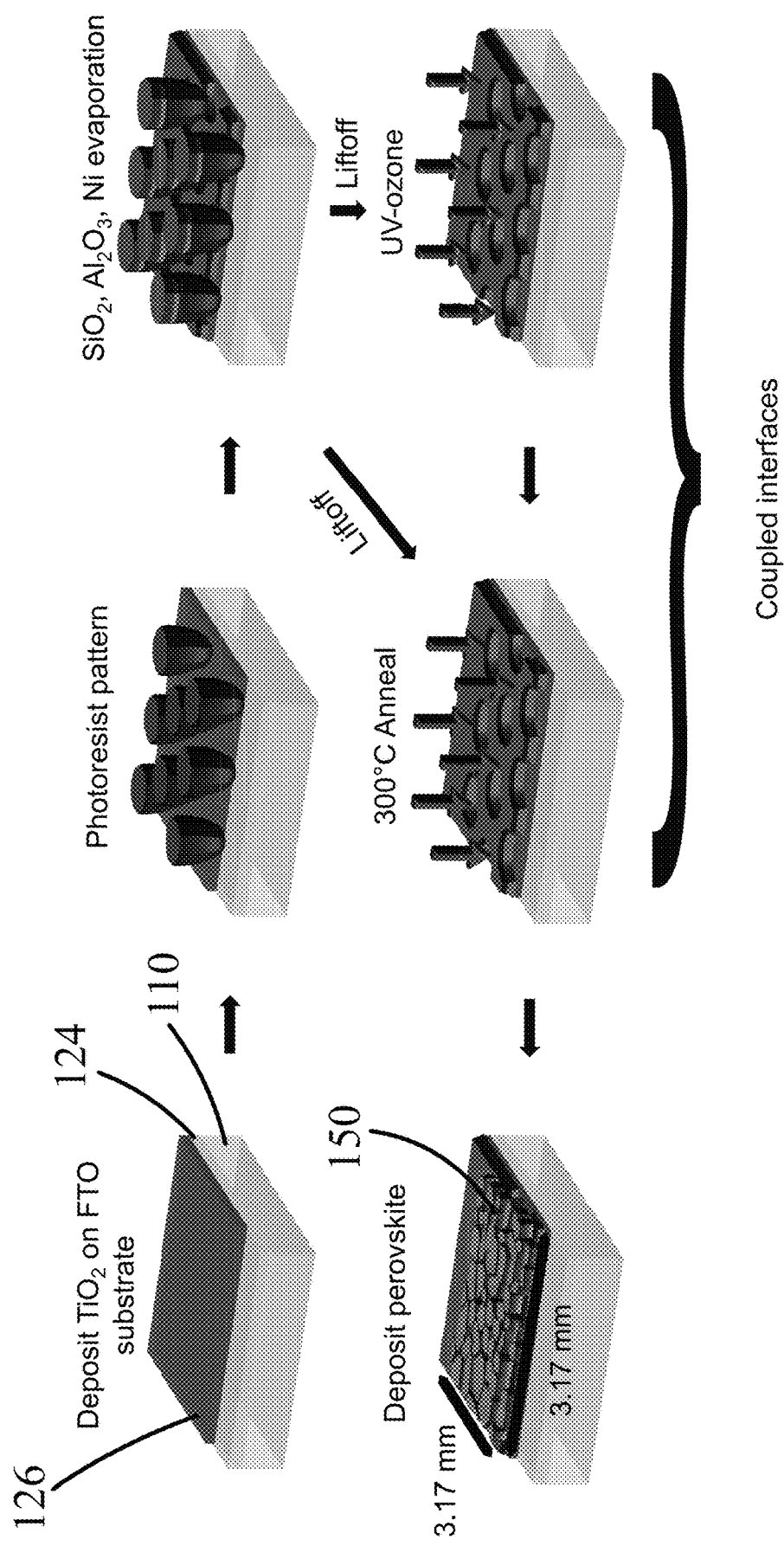
FIG. 2D illustrates a fabrication procedure highlighting the UV-ozone and anneal steps used to prepare both surfaces to interface with the perovskite, according to some embodiments of the present disclosure.

The fabrication of an ABC device can present a unique challenge compared to conventional planar devices because both the electron and hole transport layers (i.e., charge transport layers 126 and 136) are exposed before the depositing of the active material (e.g., perovskite) (see FIGS. 2C and 2D). Interface processing should simultaneously prepare both selective contact surfaces to form effective interfaces with the active material 150 (e.g., perovskite). Patterning can limit the choice of charge transport materials because organic options can be damaged during photolithography processing. As described herein, oxide transport layers ($NiO_x$ and $TiO_2$) may be used for the second charge layer 136 of the second electrode 130 and the first charge transport layer 126 of the first electrode 120, respectively. The $TiO_2$ first charge transport layer 126 of the first electrode 120 was deposited by a standard spin-coating procedure. The nickel oxide ($NiO_x$) second charge transport layer 136 of the second electrode 130 was formed in situ by partial oxidation of the nickel metal contact through air annealing and/or UV-ozone (UVO) exposure after the patterning process (see FIG. 2D). Due to the coupled interface challenge of the ABC architecture (see FIG. 2D), these treatments also affect the $TiO_2$ electron transport layer below. Metal oxide charge transport properties were controlled by defect chemistry and oxidation state ratios that are tuned during the oxidation processes.

Figure 3A:
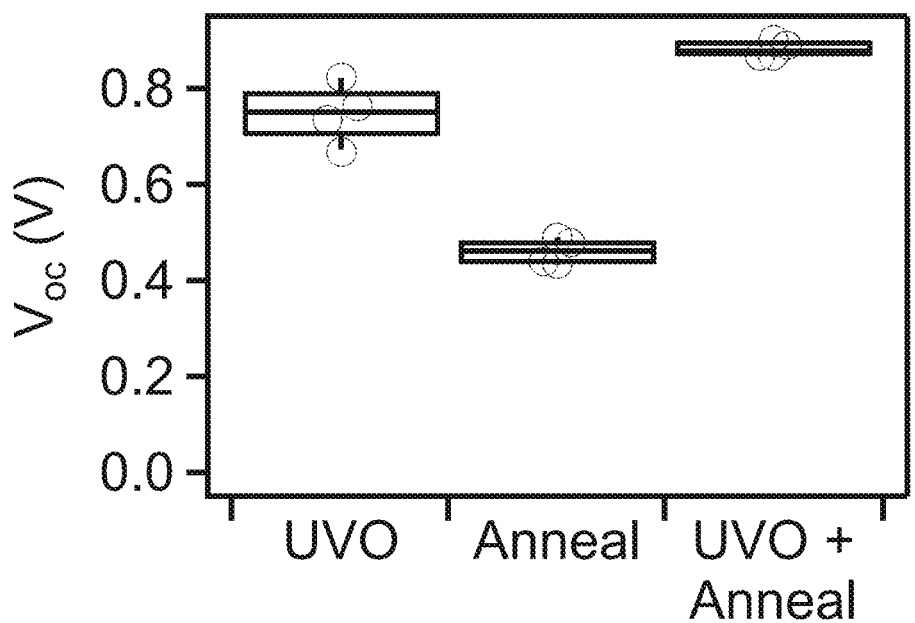
FIG. 3A illustrates box plots of reverse-scan device performance parameters from four devices at each interface treatment, according to some embodiments of the present disclosure. (Panel A) open-circuit voltage ($V_{oc}$) and (Panel B) short-circuit current density ($J_{sc}$)
Figure 3A:
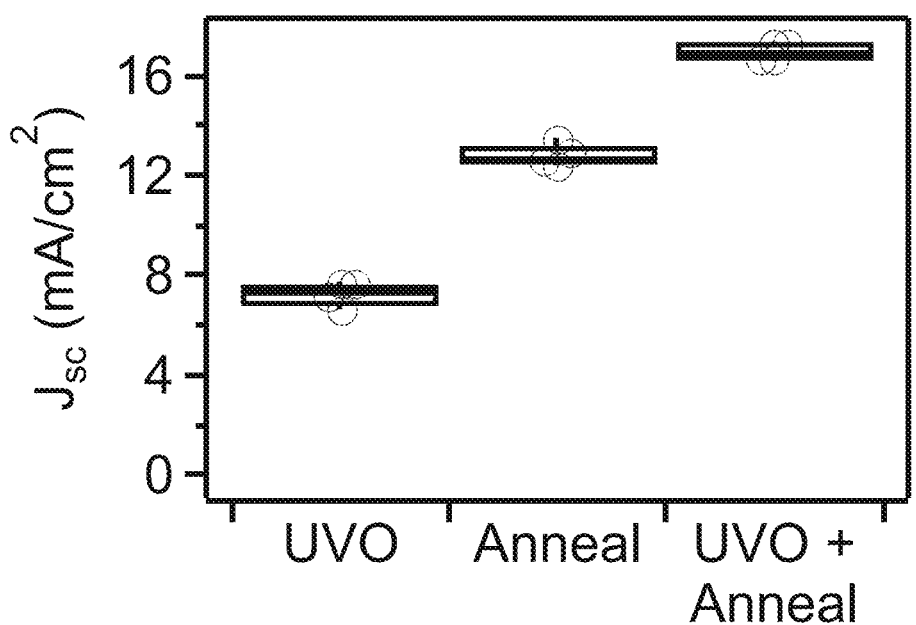
Figure 3B:
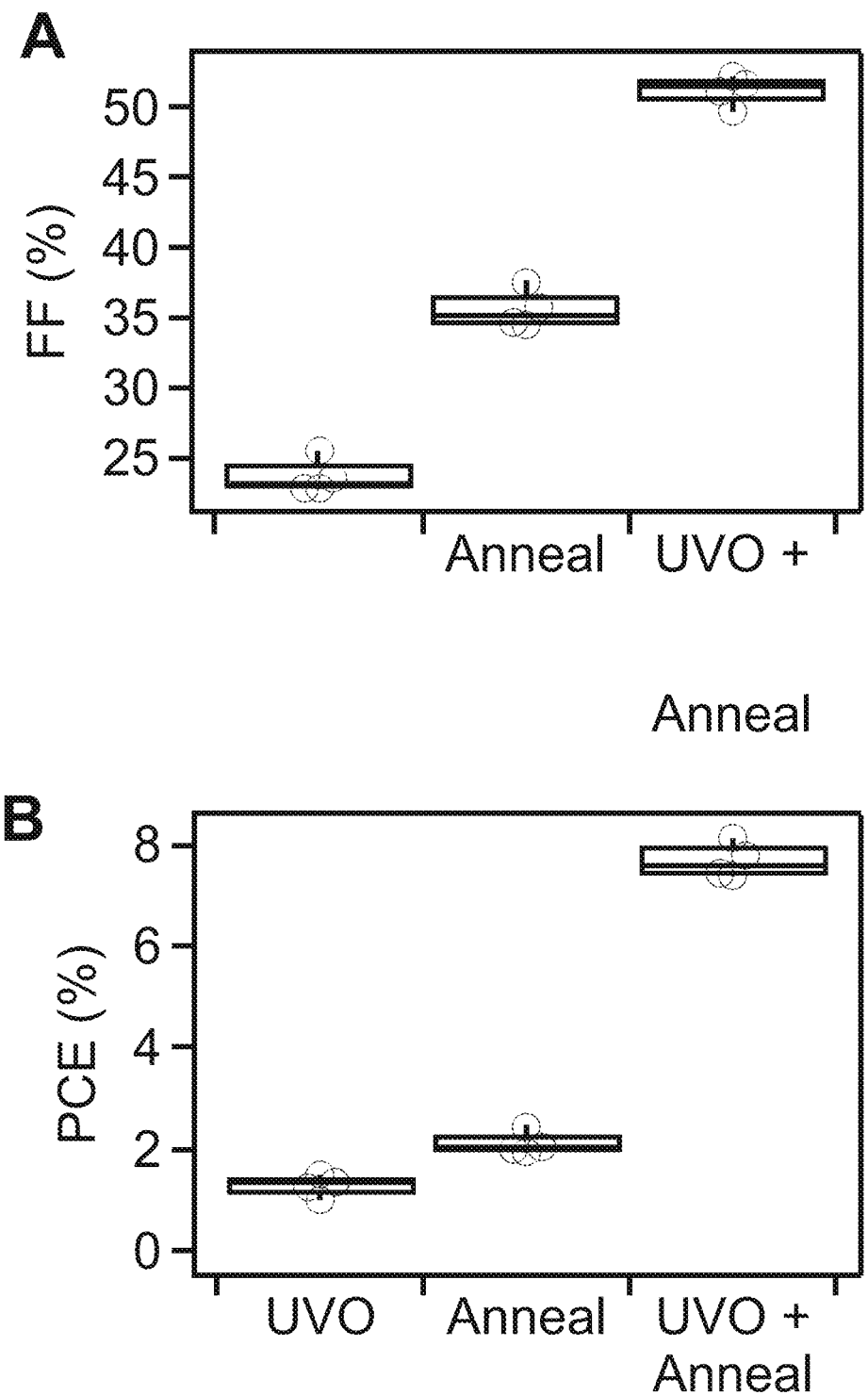
FIG. 3B illustrates box plots of reverse-scan device performance parameters from four devices at each interface treatment, according to some embodiments of the present disclosure. (Panel A) fill factor (FF) and (Panel B) solar-to-electric power conversion efficiency (PCE).
Figure 3C:
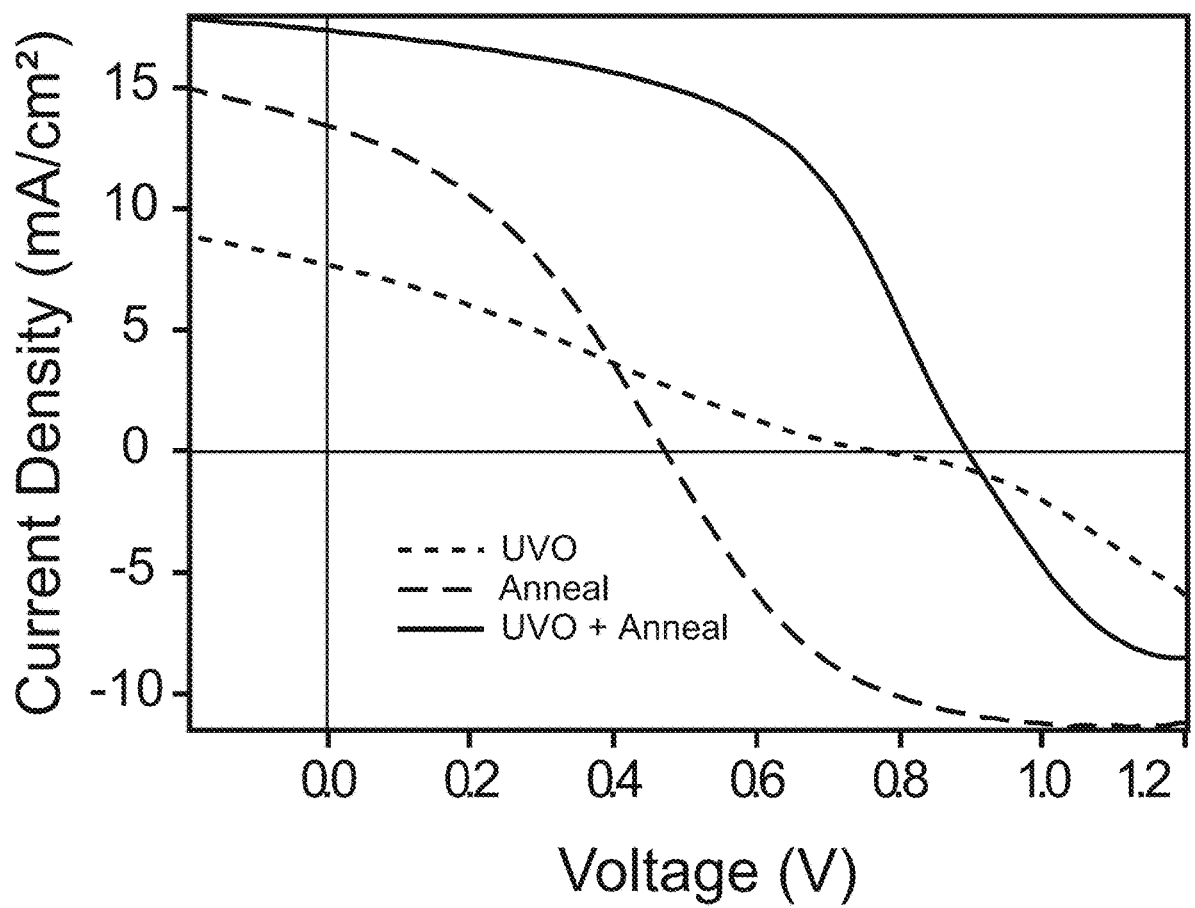
FIG. 3C illustrates a comparison of representative J-V curves for each treatment resulting in the data shown in FIGS. 3A and 3B, according to some embodiments of the present disclosure.
Figure 4:
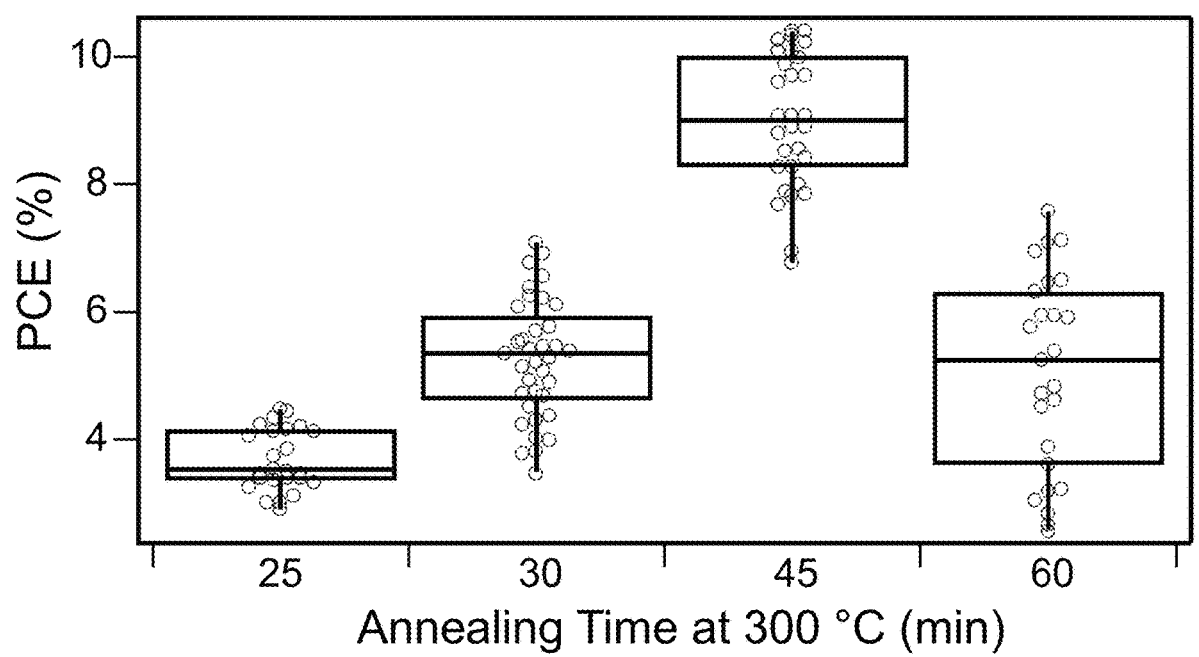
FIG. 4 illustrates PCE versus annealing times at 300° C. in air, according to some embodiments of the present disclosure. Thermal oxidation of metallic Ni to form $NiO_x$ at 300° C. in air, on a vertical p-i-n device was evaluated. Device stack consisted of ITO, 100 nm Ni partially oxidized in air at 300° C., $MAPbI_3$, C60, atomic-layer deposited $SnO_2$, sputtered IZO.
Figure 5:
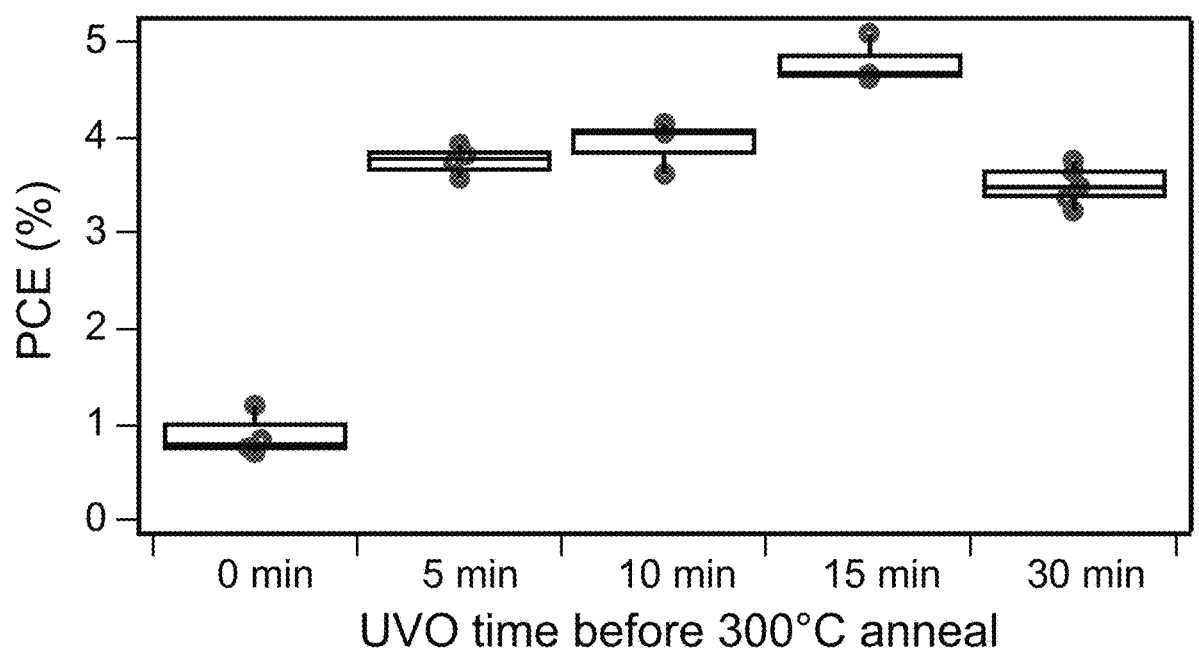
FIG. 5 illustrates PCE results obtained for an all-back-contact (ABC) device as a function of UV-ozone treatment times at an annealing temperature of 300° C. anneal in air, according to some embodiments of the present disclosure.

The interface processes applied to the exposed coupled electron and hole transport layer surfaces dramatically influenced device performance (see FIGS. 3A, 3B, and 3C). The annealing temperature and time were optimized at 300° C. for 15 minutes, respectively, by studying an analogous vertical device structure (see FIG. 4). UVO exposure time was optimized on an ABC architecture by fixing the annealing step to 300° C. at 45 minutes (see FIG. 5). UVO treatment alone increased the open-circuit voltage ($V_{oc}$) nearly two-fold compared to the samples that were only annealed (see FIG. 3A), but the fill factor (FF) and short circuit current densities ($J_{sc}$) were significantly lower (see FIGS. 3A and 3B). UVO exposure followed by annealing was synergistic for all parameters (see FIGS. 3A and 3B). Current density-voltage (V) curves exhibit unique characteristics, including a roll-over (i.e., forward current saturation) after $V_{oc}$ for the annealed samples and high series resistance for the sample subject to UVO treatment only (see FIG. 3C). Coupled interface processes are changing the near-surface chemical compositions and electronic nature of the transport layers.

Formation of the $NiO_x$ interface on the electrodes charge transport layer: The most sensitive process in the fabrication of an ABC device may be the formation of $NiO_x$ from metallic Ni on the second electrode 130. This charge transport layer 136 needs to be pin-hole free and have a composition suitable for selective hole transport and favorable energetic alignment with the valence band of the perovskite absorber. In some embodiments of the present disclosure, a compact, pin-hole-free $NiO_x$ layer with favorable transport properties was formed by first exposing the nickel to (UV-ozone) UVO to form a clean, uniform seed layer, then annealing the layer at 300° C.

Figure 6A:
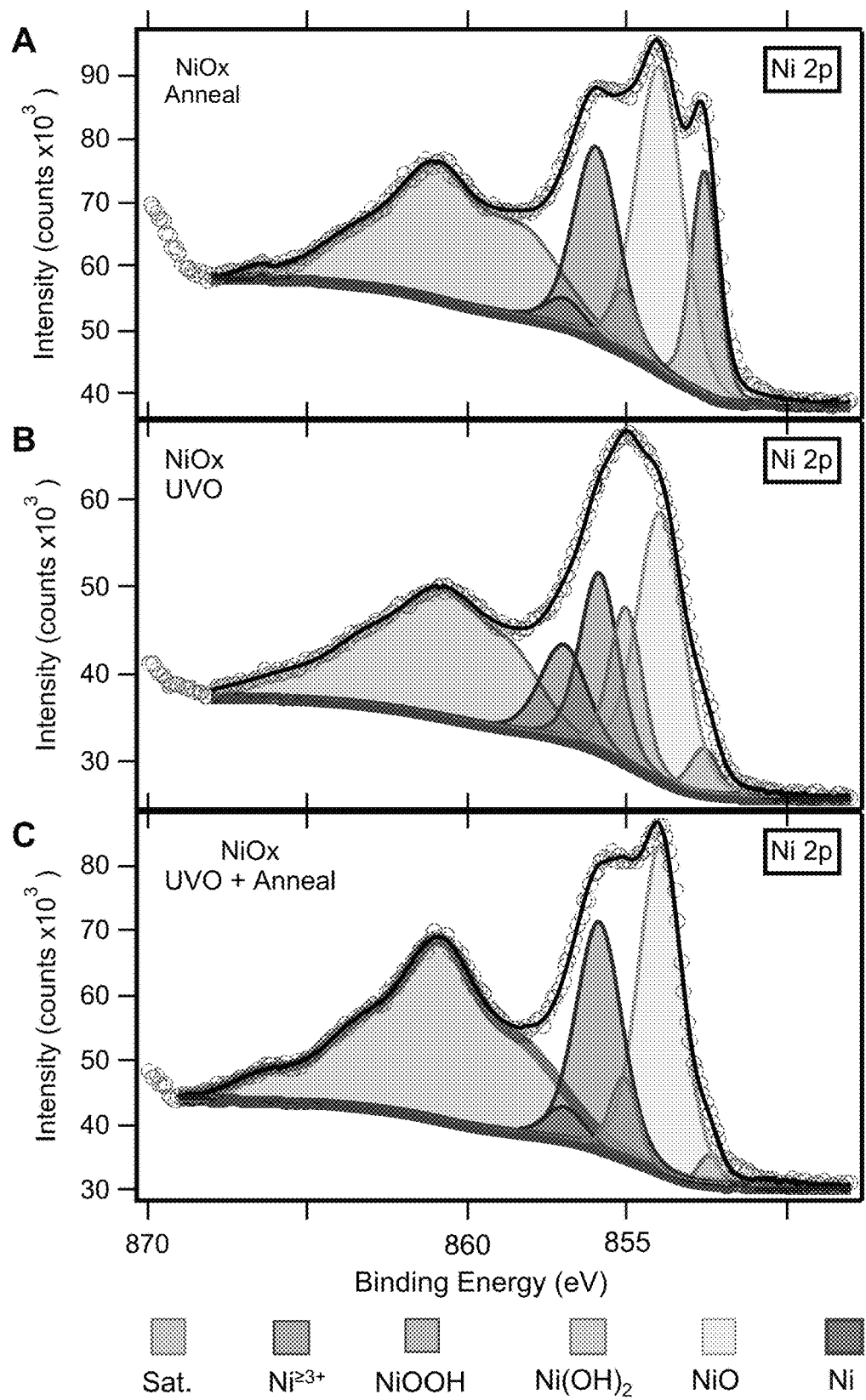
FIG. 6A illustrates XPS spectra of the Ni 2p core-levels of the Ni—$NiO_x$ surface after (Panel A) annealing at 300° C. in air for 45 minutes, (Panel B) UVO exposure for 15 minutes, and (Panel C) sequential UVO exposure followed by a 300° C. anneal in air for 45 minutes, according to some embodiments of the present disclosure.

X-ray photoelectron spectroscopy (XPS) and ultraviolet photoelectron spectroscopy (UPS) tracked the near-surface chemical composition and valence band spectra of the Ni—$NiO_x$ surfaces through the coupled interface processes (see FIG. 6A). $NiO_x$ surface properties are highly complex and process dependent with films presenting a mixture of $Ni^{2+}$ and $Ni^{3+}$. The data was fit based on prior rational approaches to provide qualitative insight regarding changes in near-surface composition. Our XPS analysis, self-consistent between the O1s and Ni2p core-level spectra, indicates five species: (1) metallic nickel from the substrate (852.6±0.1 eV), (2) NiO (853.9±0.05 eV), (3) $Ni(OH)_2$ (855.0±0.09 eV), (4) NiOOH (855.9±0.07 eV), and (5) a higher binding energy contribution (856.9±0.09 eV) classified as $Ni^{\geq 3+}$ (see FIGS. 3A and 3B). NiO, $Ni(OH)_2$, and NiOOH are commonly observed in $NiO_x$ films. The $Ni^{\geq 3+}$ peak was required in the constrained fitting procedure and could include $Ni_2O_3$, γ-NiOOH (mixture of $Ni^{2+}$ and $Ni^{4+}$), or β-NiOOH (mixture of $Ni^{2+}$, $Ni^{3+}$, and $Ni^{4+}$).

Figure 6B:
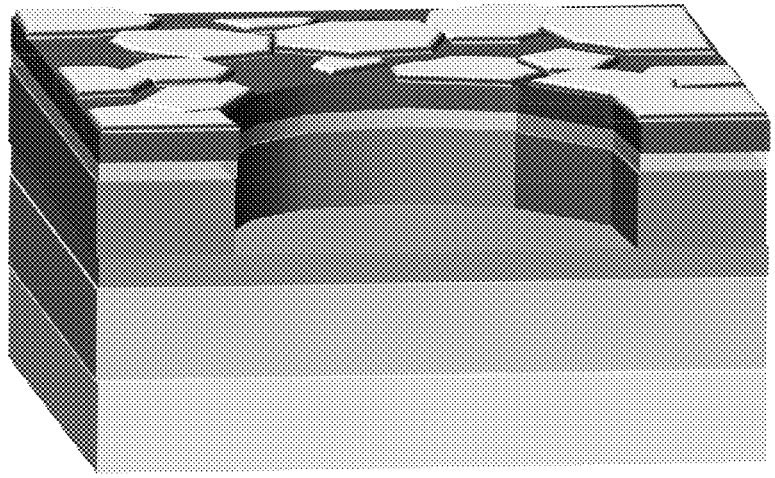
FIG. 6B illustrates a schematic of ABC devices illustrating incomplete $NiO_x$ formation on the patterned metallic Ni electrode after only annealing at 300° C. and complete $NiO_x$ formation after the UVO process, according to some embodiments of the present disclosure.
Figure 6B:
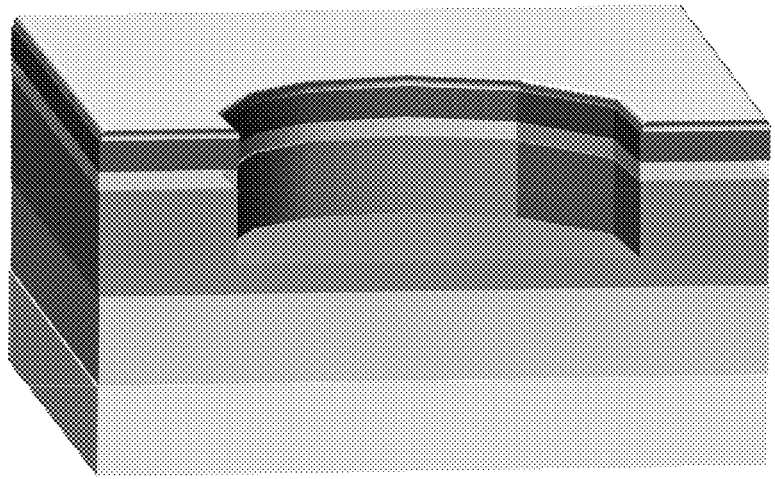
Figure 6C:
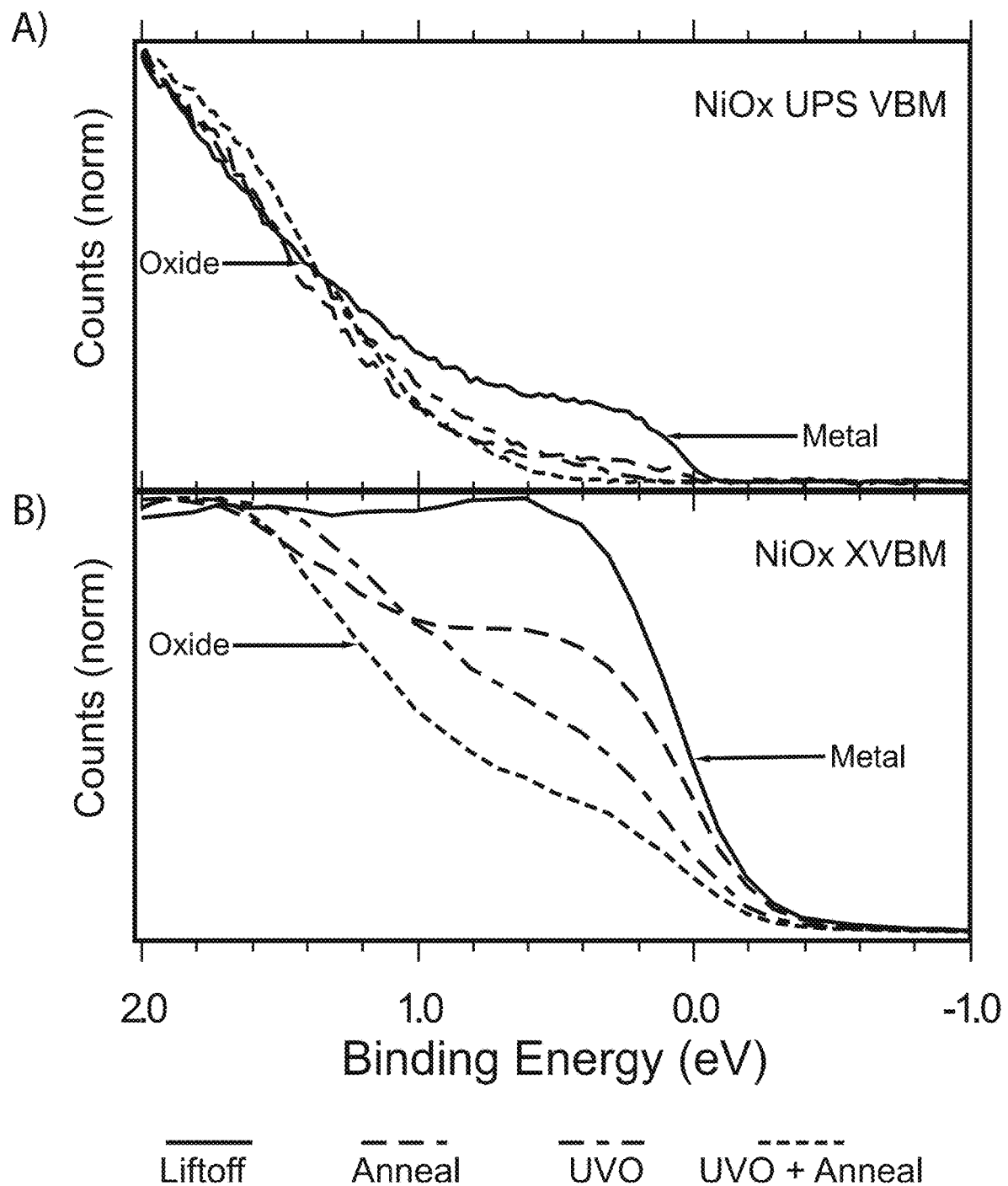
FIG. 6C illustrates (Panel A) UPS valence band maximum (VBM) spectra and (Panel B) XPS valence band maximum (XVBM) spectra of the Ni—$NiO_x$ surfaces through the same processes, according to some embodiments of the present disclosure.
Figure 7:
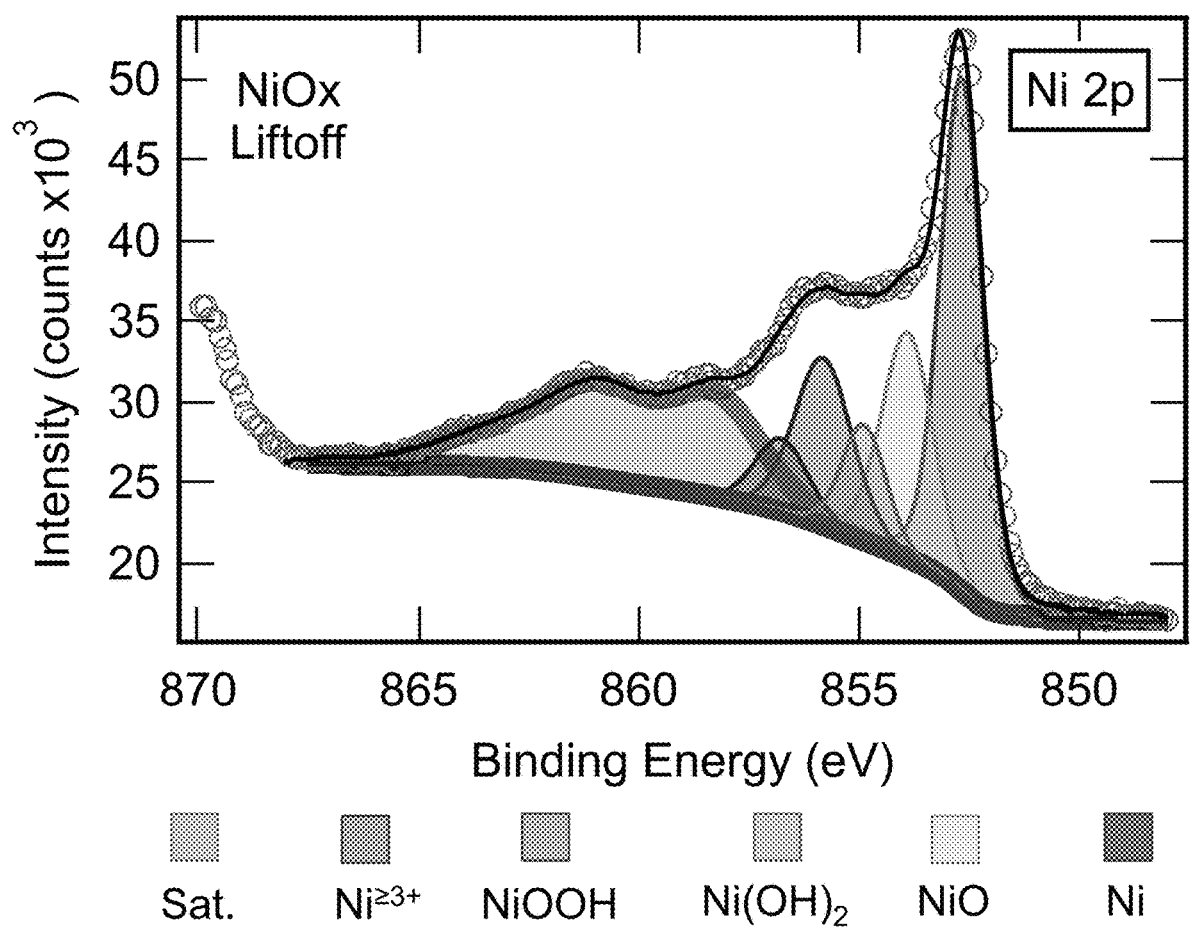
FIG. 7 illustrates X-ray photoelectron spectroscopy (XPS) Ni 2p core-level spectra of the Ni surface after liftoff confirming that the surface is predominantly metallic Ni, according to some embodiments of the present disclosure.
Figure 8A:
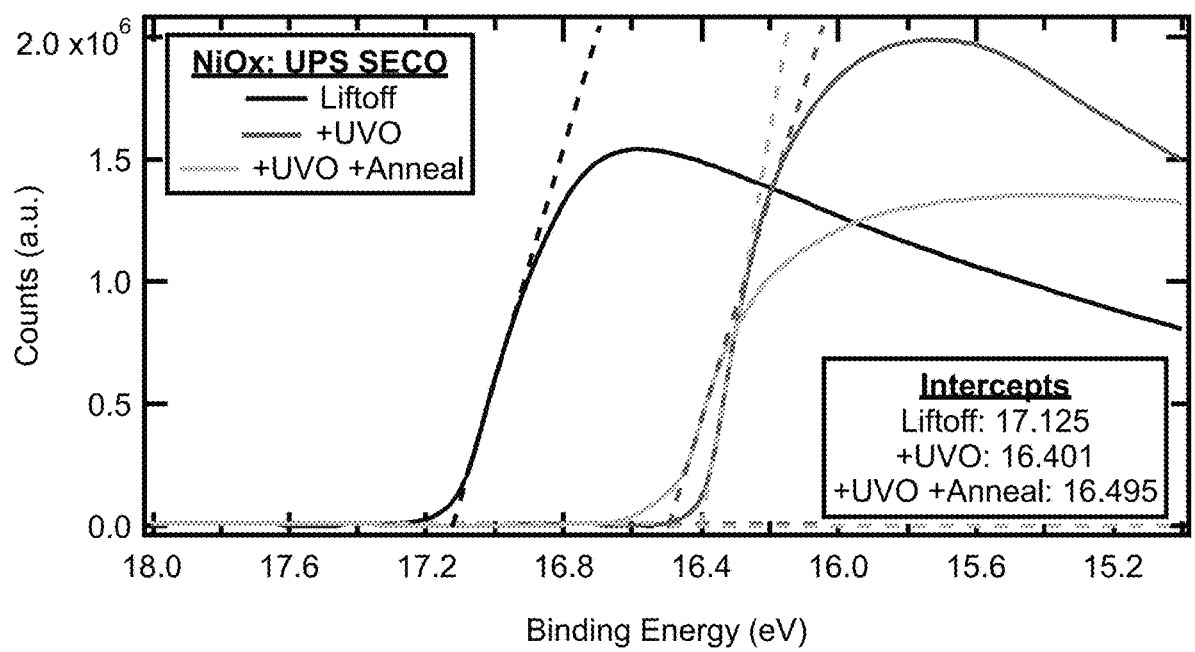
FIGS. 8A and 8B illustrate for $NiO_x$ secondary electron cut-off fits from UPS spectra (21.2 eV He I source) with fits to both the baseline and smaller secondary feature, according to some embodiments of the present disclosure. The table illustrates the corresponding intercept and work function values.
Figure 8B:
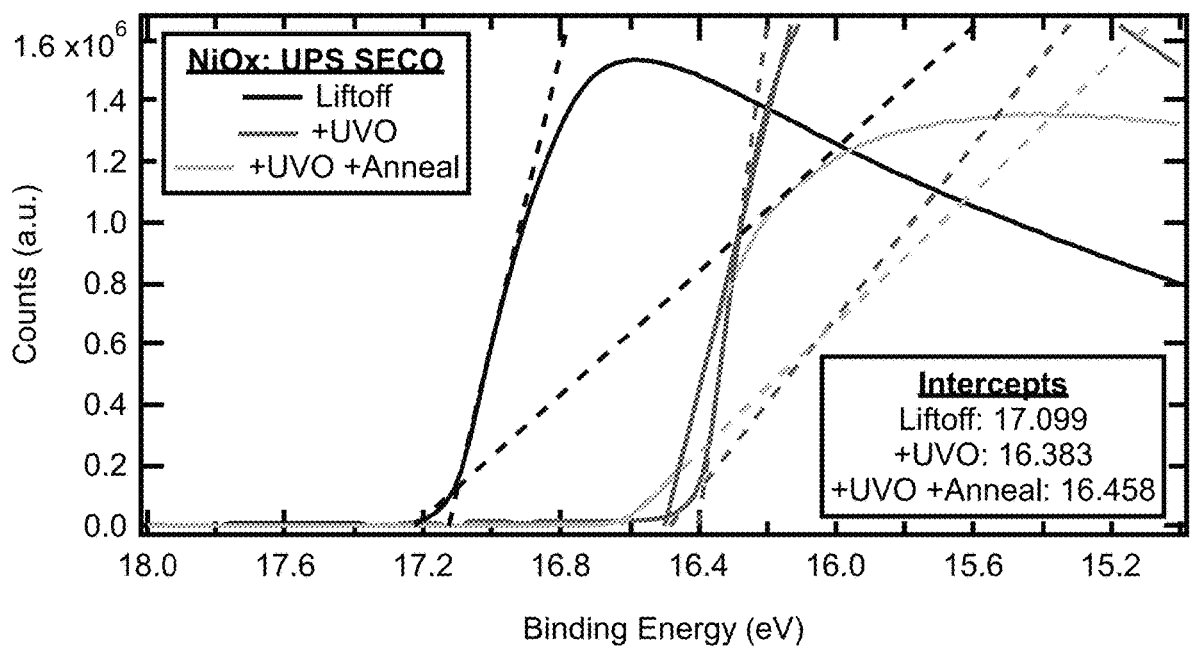
Figure 8C:
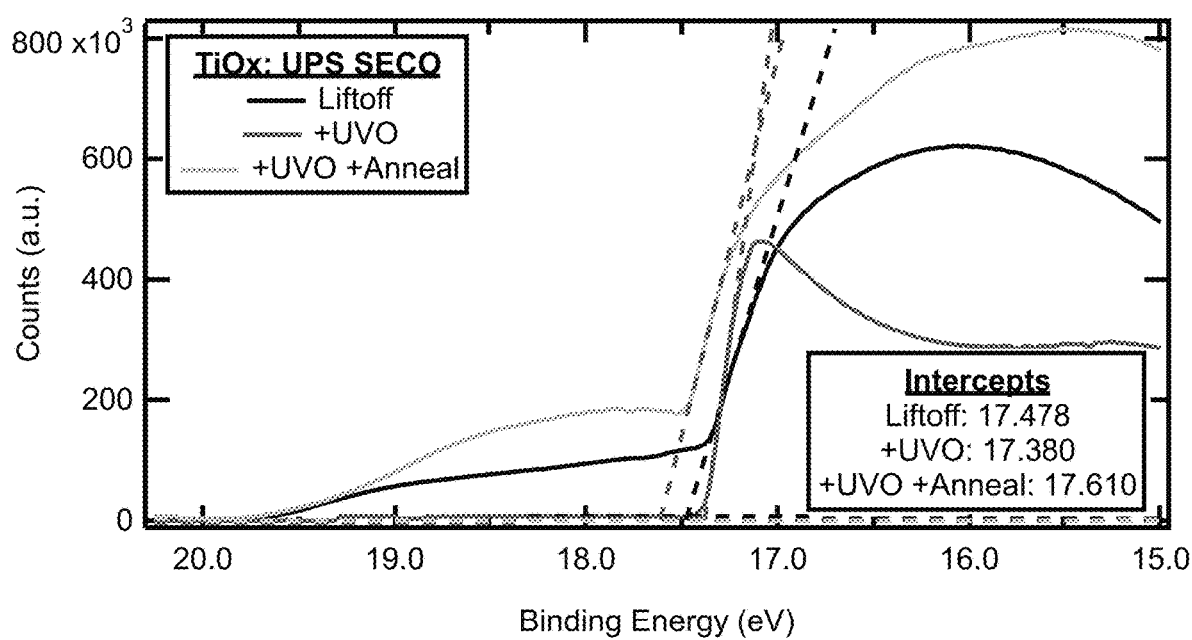
FIGS. 8C and 8D illustrate for $TiO_x$ secondary electron cut-off fits from UPS spectra (21.2 eV He I source) with fits to both the baseline and smaller secondary feature, according to some embodiments of the present disclosure. The table illustrates the corresponding intercept and work function values.
Figure 8D:
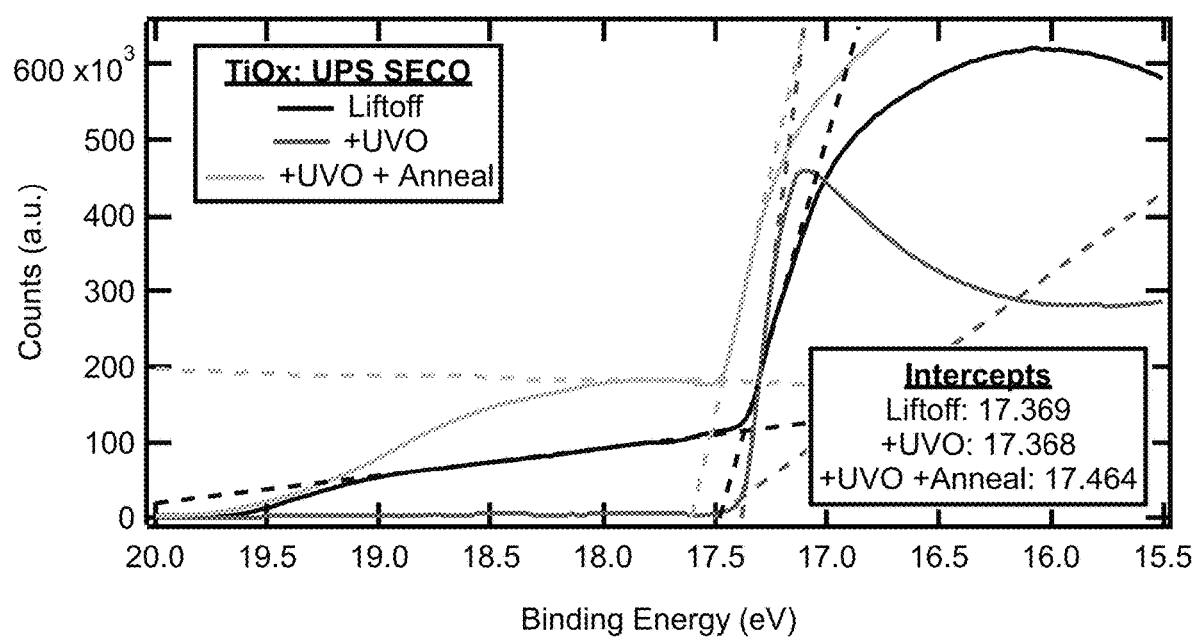
Figure 9A:
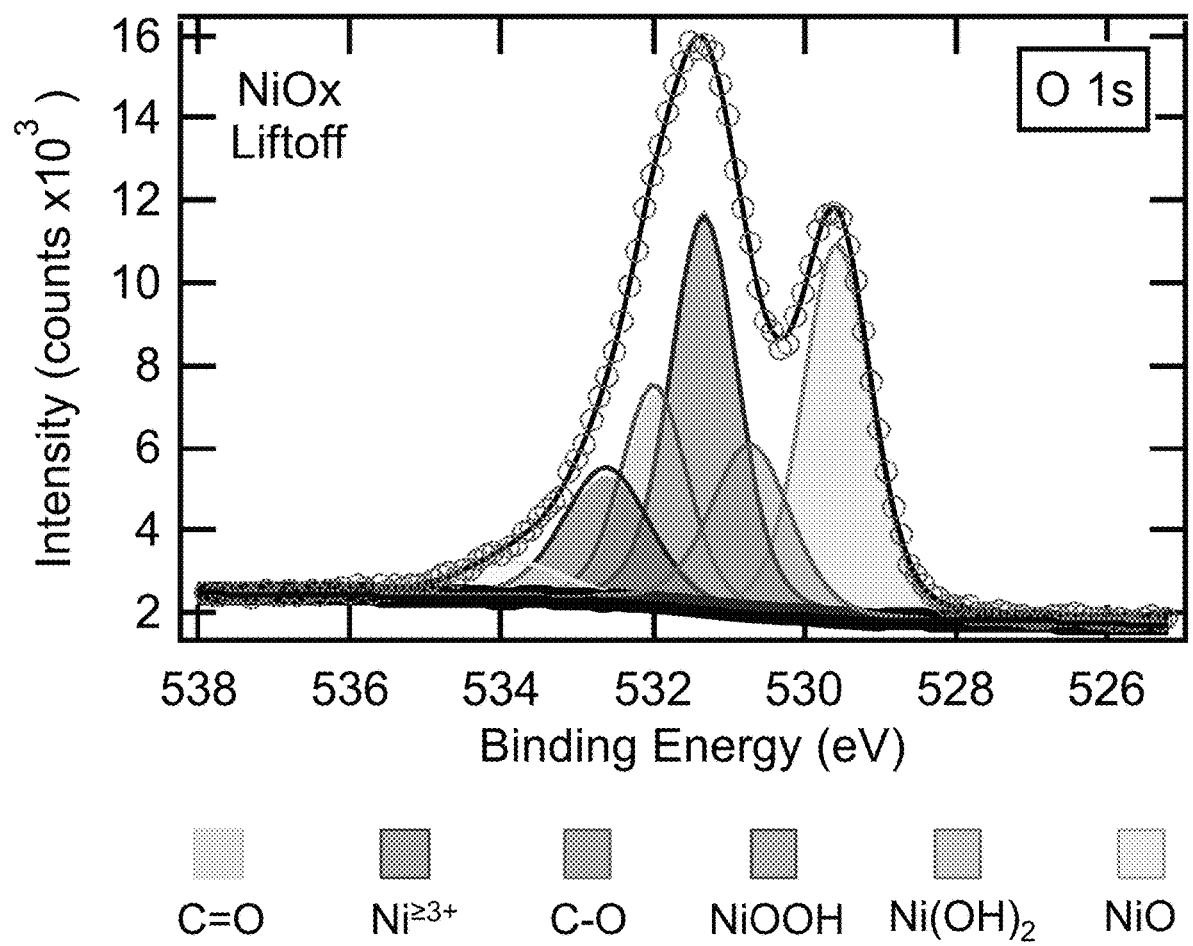
FIGS. 9A-9D illustrate XPS O1s core-level spectra and fitting analysis of the Ni—$NiO_x$ surfaces consistent with the Ni-2p core-level spectra, according to some embodiments of the present disclosure.
Figure 9B:
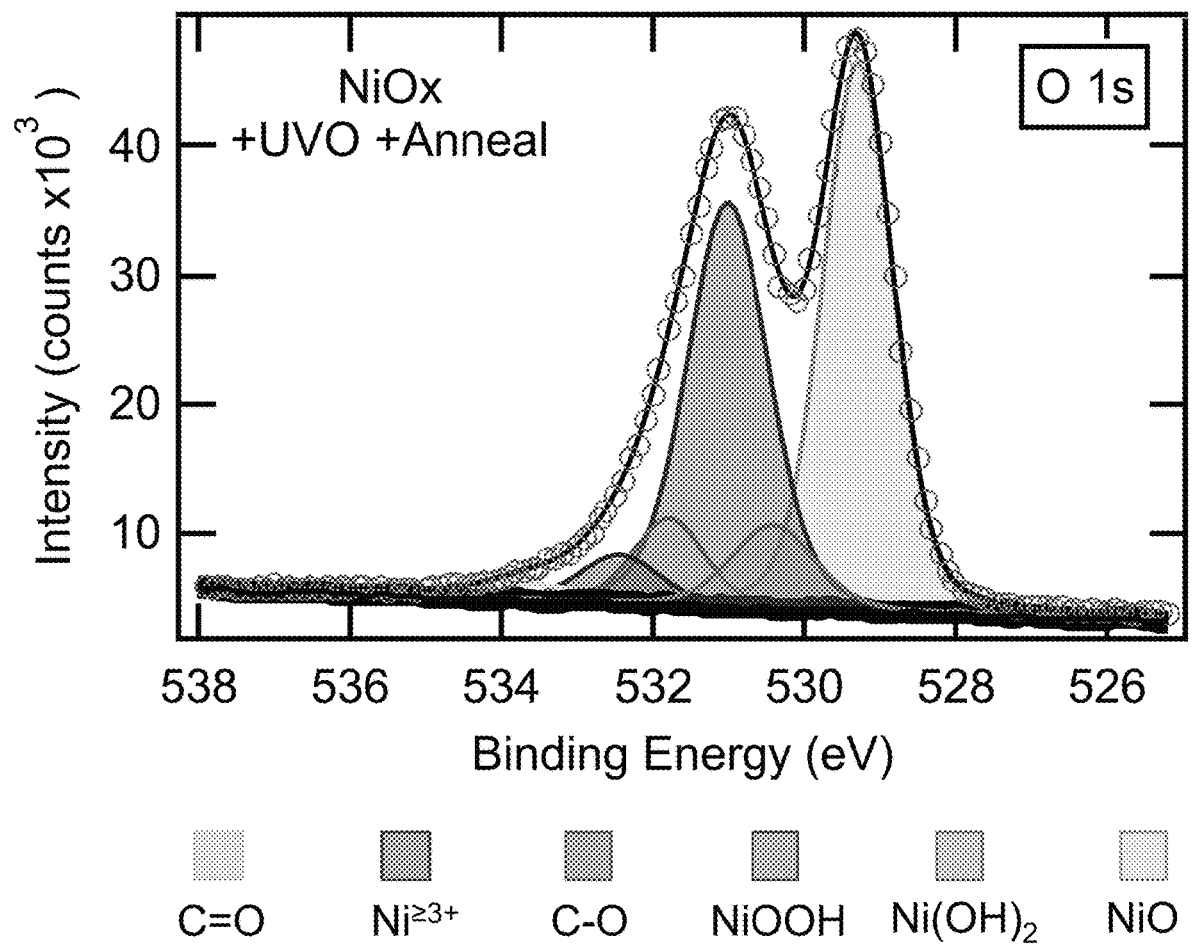
Figure 9C:
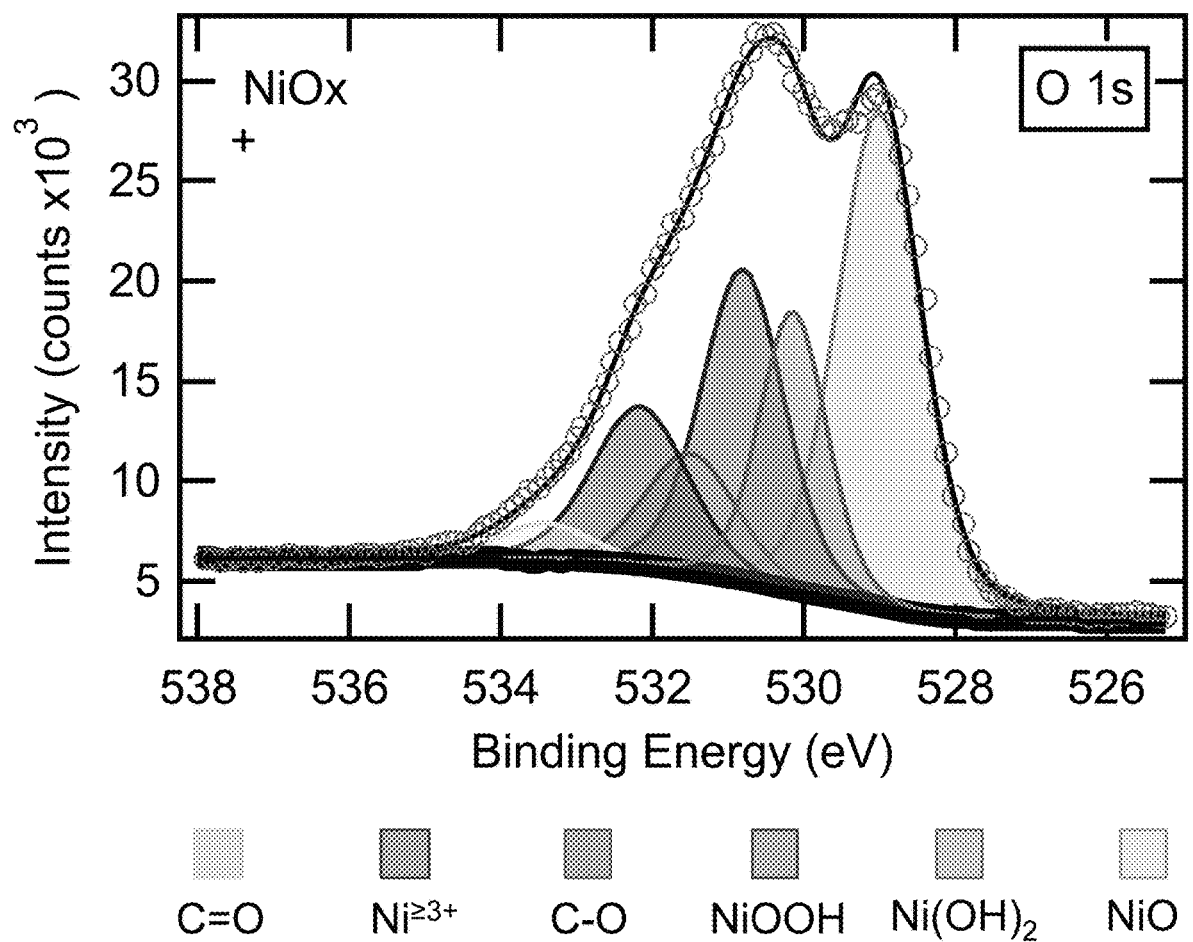
Figure 9D:
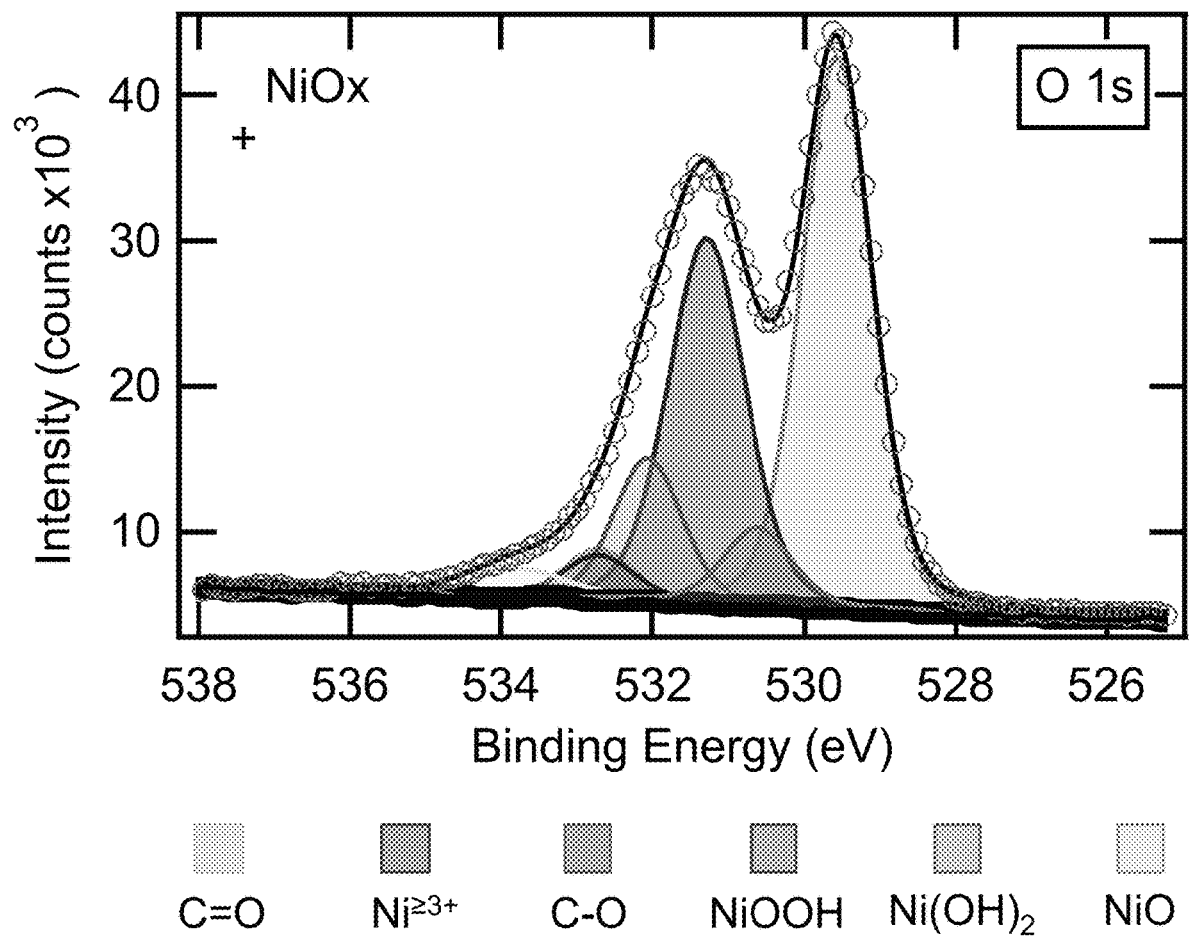
Figure 10A:
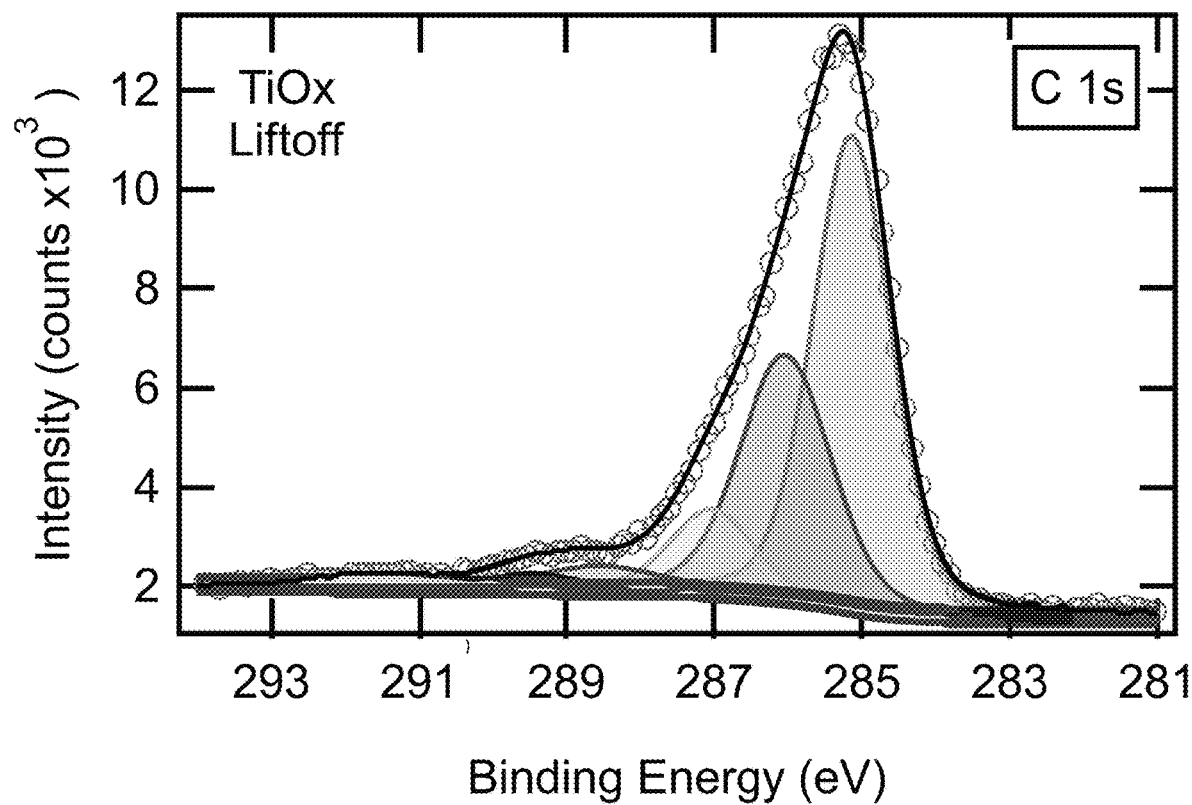
FIGS. 10A-10D illustrate XPS C1s core-level spectra and fitting analysis of the $TiO_2$ surface, according to some embodiments of the present disclosure.
Figure 10B:
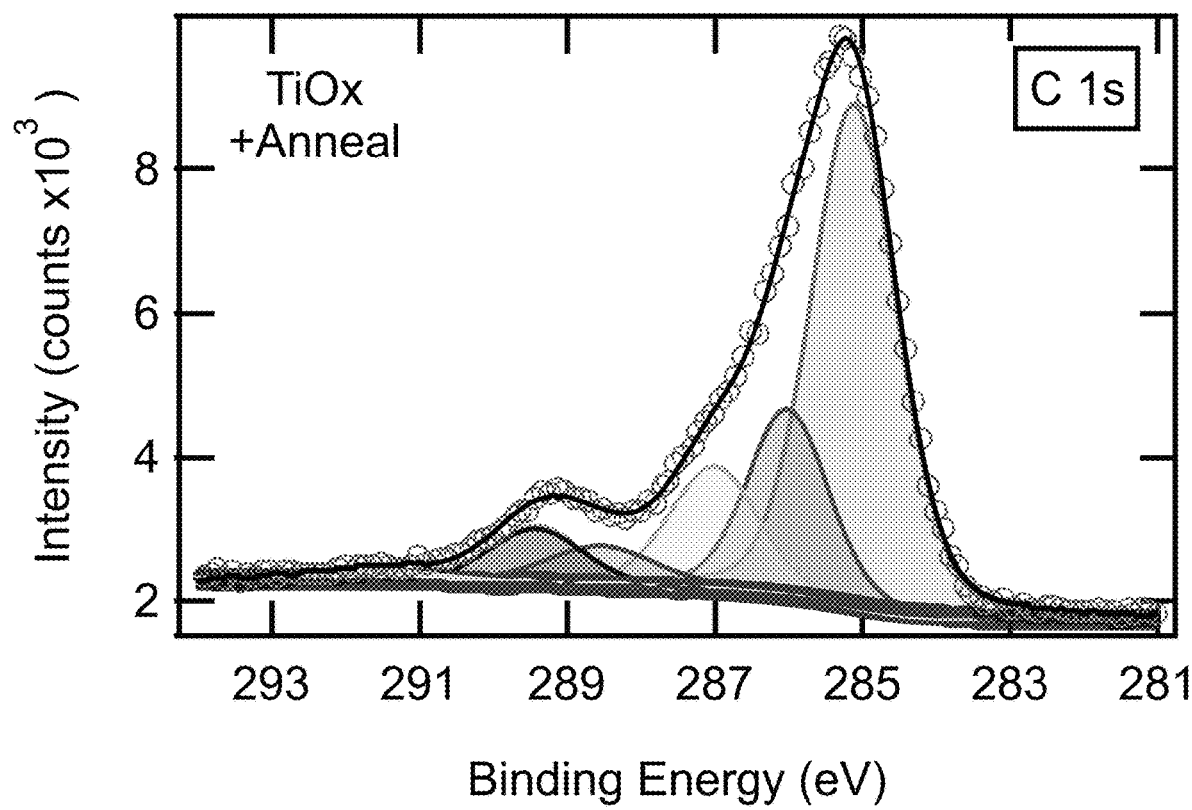
Figure 10C:
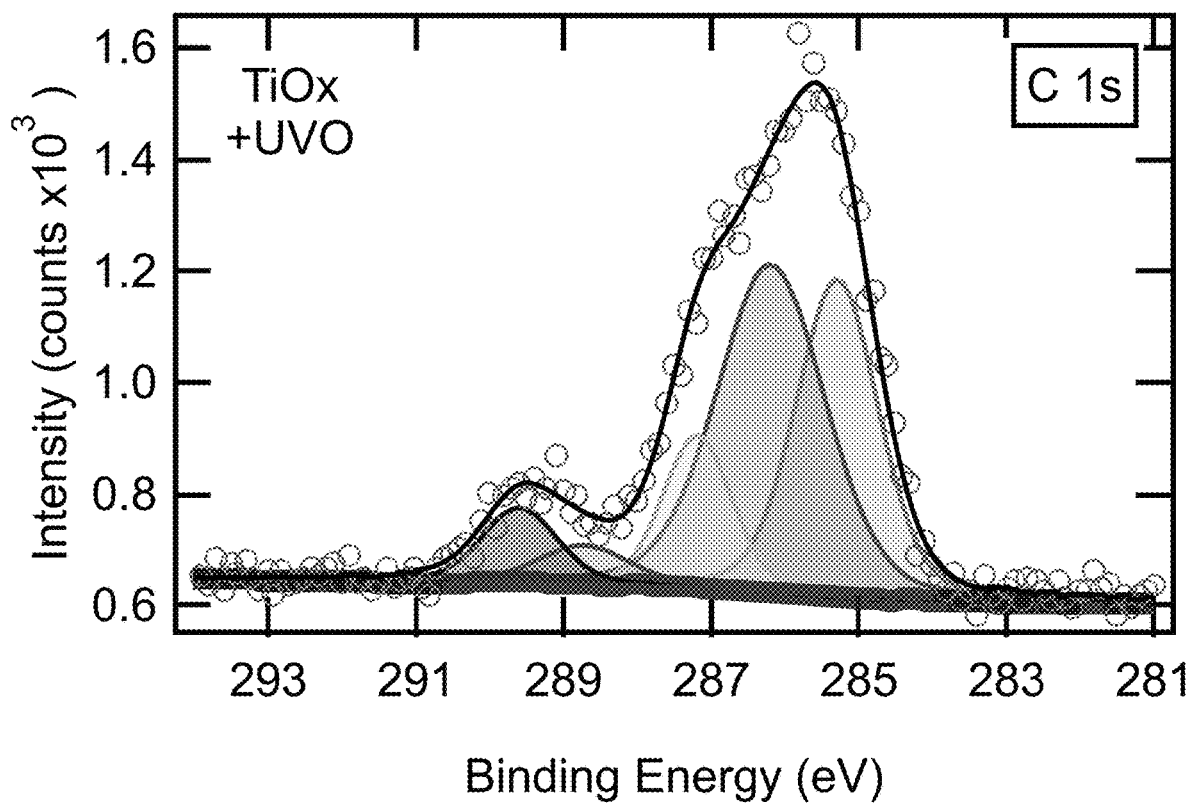
Figure 10D:
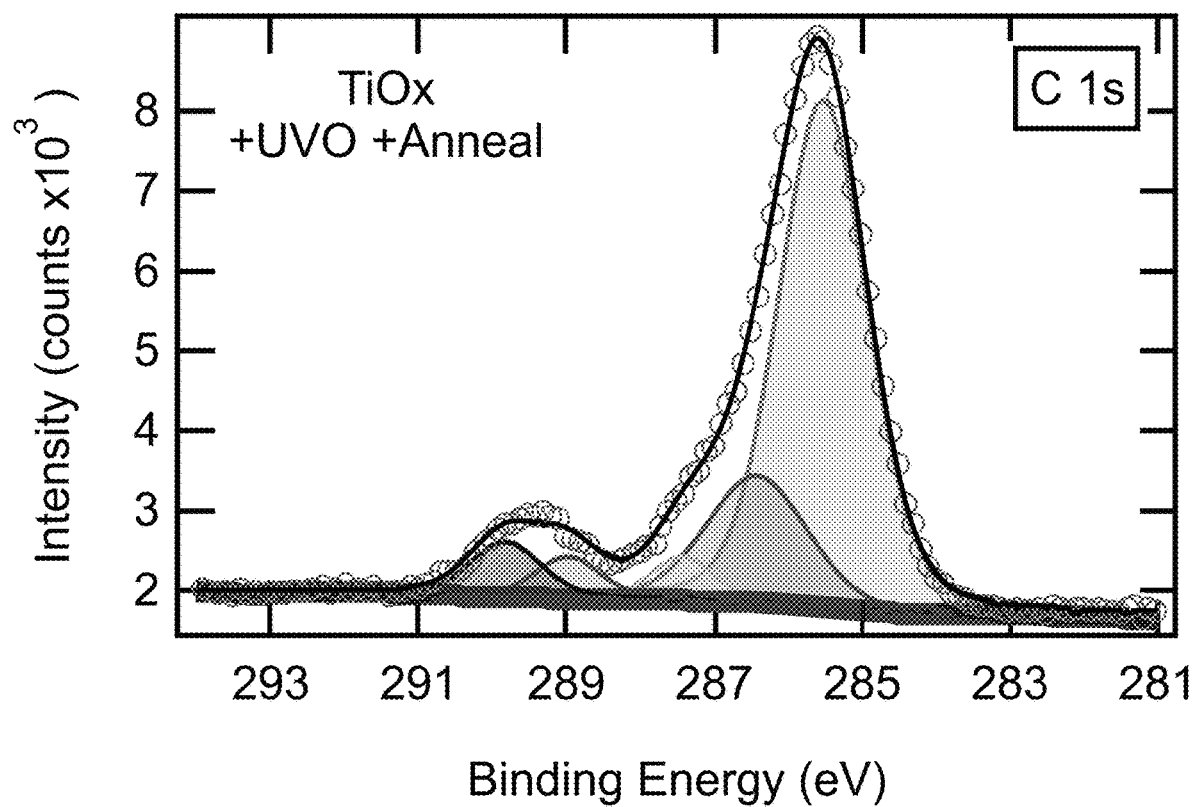

The coupled interface processes described herein controlled the composition and energetics of the $NiO_x$ charge transport layer 136, which significantly influenced the resultant ABC device performance. The nickel surface after liftoff and before exposure to UVO or annealing was confirmed to be metallic nickel rich (see FIG. 7). A strong metallic nickel contribution remained in the XPS Ni 2p core-level spectra from the Ni—$NiO_x$ surface after 300° C. anneal (see FIG. 6A). The UPS valence band maximum spectrum also confirmed the presence of metallic nickel after the 300° C. anneal (see FIG. 6C). The metallic nickel peaks may be due to incomplete $NiO_x$ layer formation, leaving metallic nickel domains on the surface (see FIG. 6B). For the example of a perovskite active material 150, metallic nickel in direct contact with the perovskite can limit the achievable quasi-fermi level splitting and $V_{oc}$ and is known to introduce deep trap levels creating nonradiative recombination centers. The metallic nickel features present at the surface are consistent with ABC devices exhibiting significantly lower $V_{oc}$.

UVO exposure formed a more continuous $NiO_x$ film on metallic nickel and the resultant second electrode 130, with its $NiO_x$ modified charge transport layer 136, lowered the work function to increase $V_{oc}$ of ABC devices. Both XPS Ni 2p core-levels (see FIG. 6A) and UPS valence band spectra (see Panel A of FIG. 6C) confirmed the metallic nickel contribution was dramatically reduced after UVO exposure compared to unexposed samples and samples only annealed. It also lowered the work function of the Ni—$NiO_x$ surface considerably (Δϕ ~0.65 eV) from the state immediately following liftoff (see FIGS. 8A-8D). A lower work-function is commensurate with the observation of a drastic increase in $V_{oc}$ in the UV-ozone treated samples. These are summarized below in Table 2.

TABLE 2

| Sample | Intercept | Work Function (Φ) |
| --- | --- | --- |
| $NiO_x$ Liftoff | 17.125 (A) | 4.08 |
| | 17.099 (B) | 4.10 |
| $NiO_x$ + UVO | 16.401 (A) | 4.80 |
| | 16.383 (B) | 4.82 |
| $NO_x$ + UVO + Anneal | 16.495 (A) | 4.71 |
| | 16.458 (B) | 4.74 |
| $TiO_x$ Liftoff | 17.478 (C) | 3.72 |
| | 17.369 (D) | 3.83 |
| $TiO_x$ + UVO | 17.380 (C) | 3.82 |
| | 17.368 (D) | 3.83 |
| $TiO_x$ + UVO + Anneal | 17.610 (C) | 3.60 |
| | 17.464 (D) | 3.74 |

The fill factor and $J_{sc}$ of ABC devices was increased dramatically when annealed at 300° C. after UVO exposure. $V_{OC}$ also increased by ~130 mV. The increased performance may be attributed to two effects: 1) UVO exposure increased the relative intensity of $Ni^{\geq 3+}$ to NiO (see FIG. 6A), consistent with the O1s core-level spectra (see FIGS. 9A-9D). Again, for the exemplary case of a perovskite active layer, e.g., organic lead halide perovskites, in some embodiments of the present disclosure, $PbI_{2-x}Br_x$ rich layer may act as an extraction barrier that limits $V_{oc}$. A thick $PbI_{2-x}Br_x$-rich layer will may also add series resistance to the device to lower fill factor and $J_{sc}$. Subsequent annealing significantly reduced the intensity of the $Ni^{\geq 3+}$ peak and mitigates the extraction barrier issue. 2) Annealing increased the relative intensity of NiOOH to NiO (from 0.55 to 0.75 Table 3).

TABLE 3

| | Ni 2p Core Level Species Ratios | | | |
| --- | --- | --- | --- | --- |
| Sample | Ni:NiO | $Ni(OH)_2$:NiO | NiOOH:NiO | $Ni^{\geq 3+}$:NiO |
| Liftoff | 1.92 | 0.46 | 0.90 | 0.38 |
| Anneal | 0.44 | 0.13 | 0.64 | 0.08 |
| UVO | 0.11 | 0.42 | 0.55 | 0.35 |
| UVO + Anneal | 0.05 | 0.13 | 0.75 | 0.10 |

Corresponding Effects on the $TiO_2$ Interface: Processing the $NiO_x$ interface simultaneously improved the $TiO_2$ charge transport layer 126 by removing carbon species left over from photolithography and reducing the defect density at the surface. $TiO_2$ surfaces at the bottom of the holes in the patterned ABC bare electrodes were exposed to the same treatments as the Ni—$NiO_x$ surfaces. XPS and UPS were used to track the near-surface chemical environment and valence band spectra of the $TiO_2$ surfaces after liftoff and through each fabrication step to study the corresponding effects.

Figure 11A:
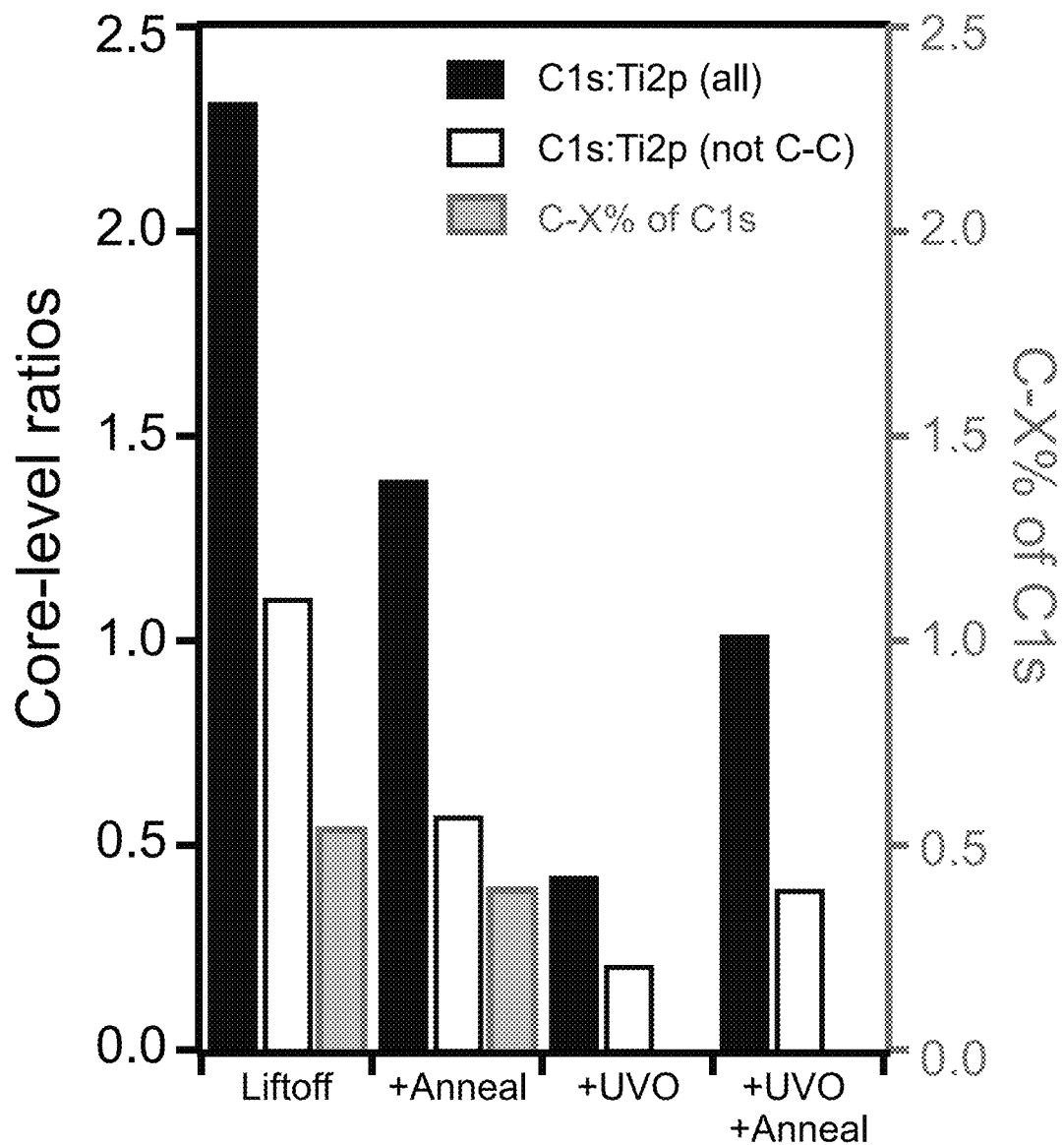
FIG. 11A illustrates C1s:Ti2p core-level ratios and C-X % of the C1s peak, according to some embodiments of the present disclosure.

UVO exposure removed carbon species from the $TiO_2$ charge transport layer 126 surface residual from the photolithography process. Chemical analysis on the $TiO_2$ XPS core-levels (see FIGS. 10A-10D) revealed a lower relative ratio of C1s:Ti2p for surfaces exposed to UVO (see FIG. 11A). In addition, a unique carbon-halide peak was only present on the $TiO_2$ surfaces not subject to UV-ozone (see FIG. 11A). The carbon-halide species is most likely from a C—F bond in a surfactant in the photoresist. UVO treatment has previously been shown to enhance $TiO_2$-perovskite interfaces by removing surface carbon contaminants, improving wettability, and increasing conductivity.

Figure 11B:
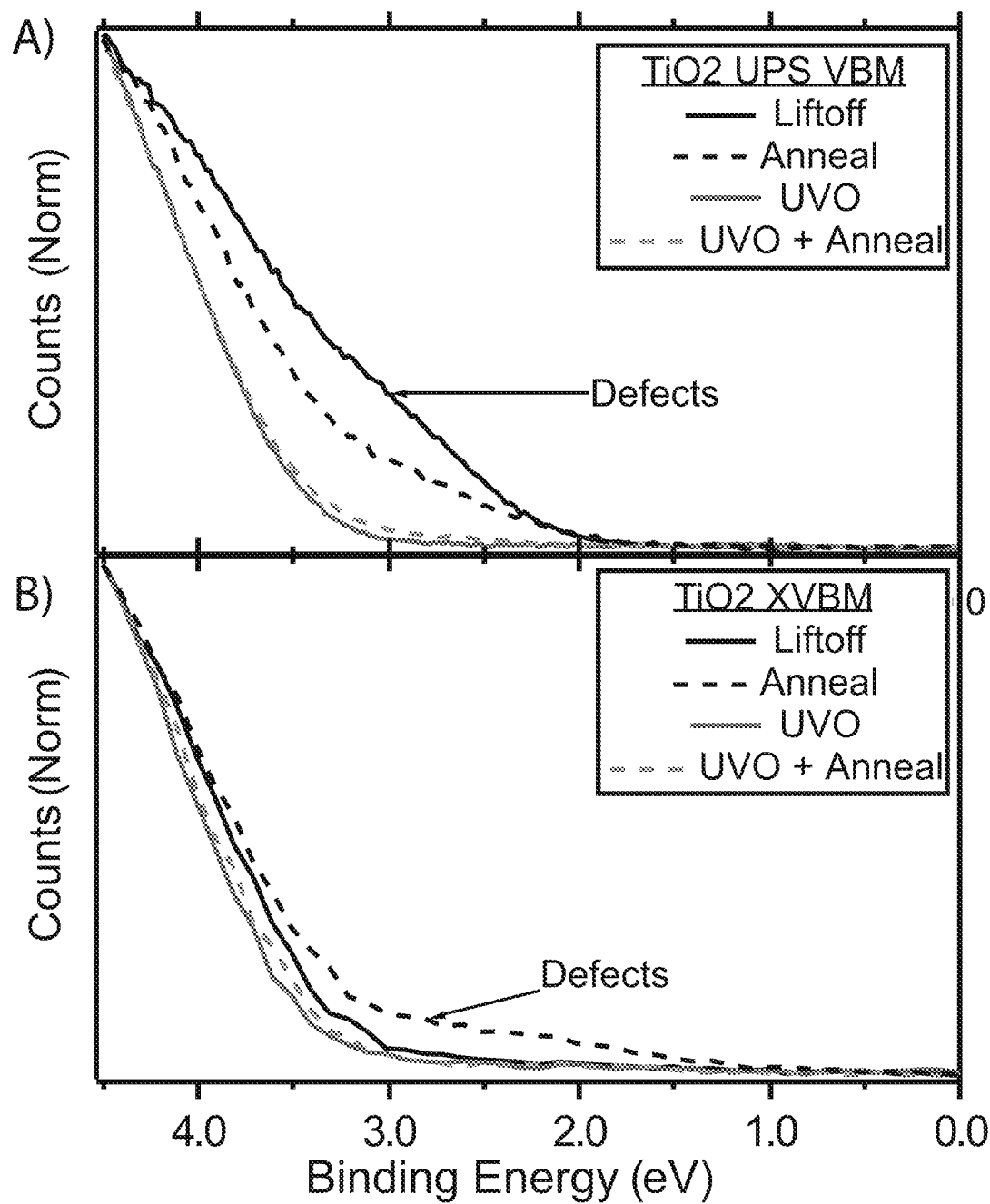
FIG. 11B illustrates (Panel A) UPS valence band maximum spectra with an information depth of ~2 nm and (Panel B) XPS valence band maximum spectra with an information depth ~10 nm, according to some embodiments of the present disclosure.
Figure 12A:
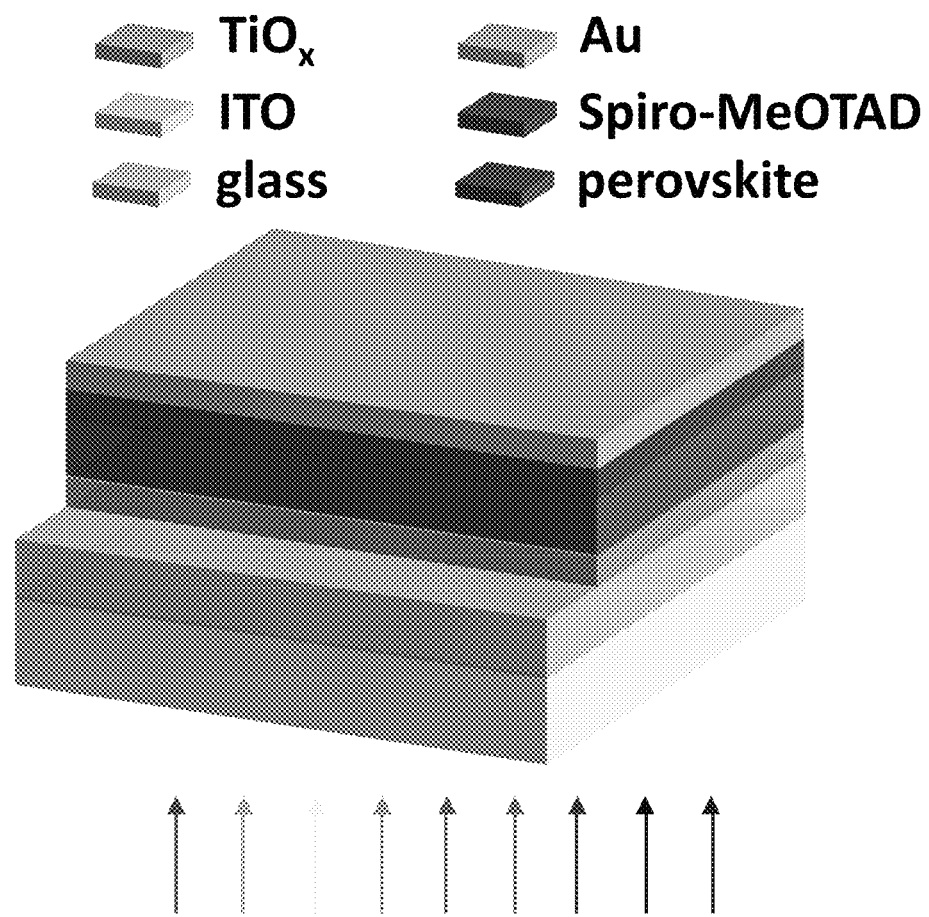
FIG. 12A illustrates vertical device experiment of the $TiO_2$ contact in a standard n-i-p perovskite architecture, according to some embodiments of the present disclosure. Different colors are different pixels/devices on the same substrate. No roll-over was observed for the $TiO_2$ contact when subjected to the photolithography process.
Figure 12B:
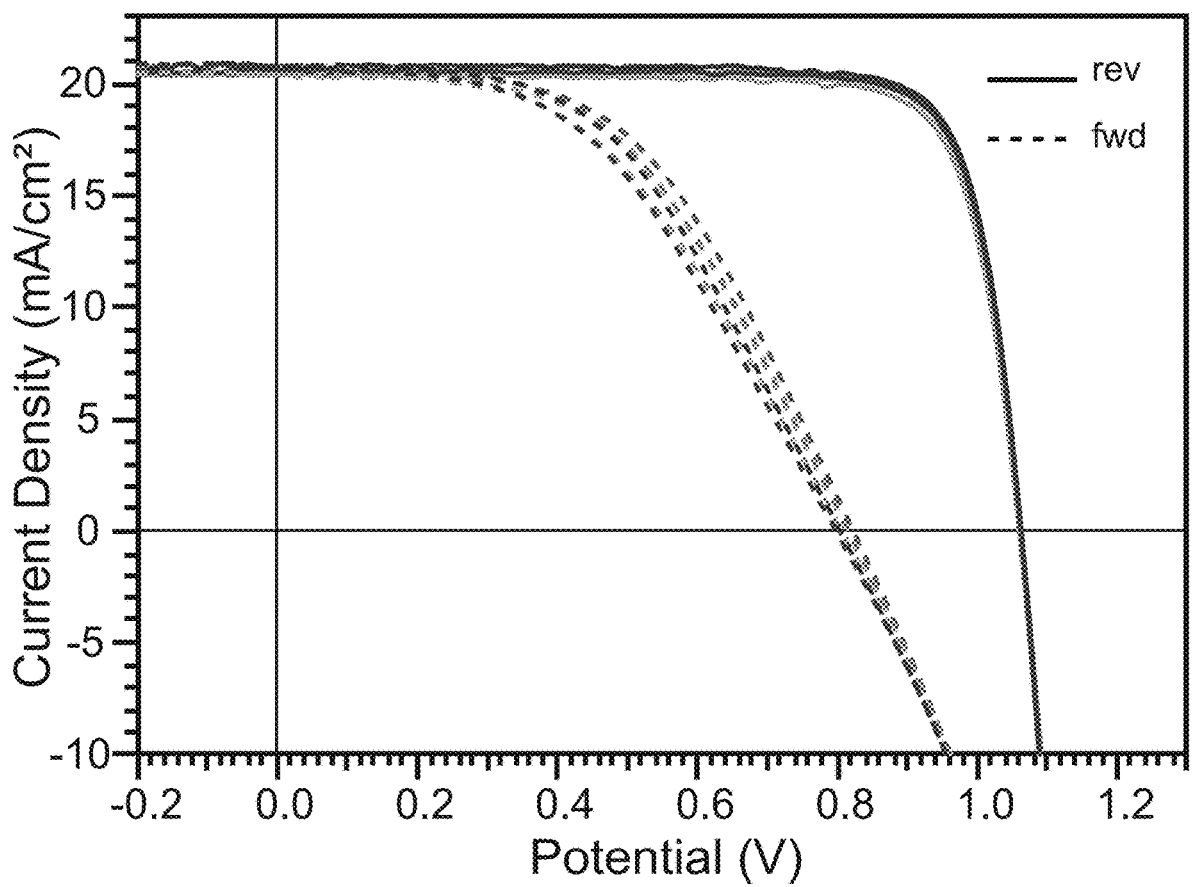
FIG. 12B illustrates current-voltage curves resulting from the device illustrated in FIG. 12A, according to some embodiments of the present disclosure.
Figure 13A:
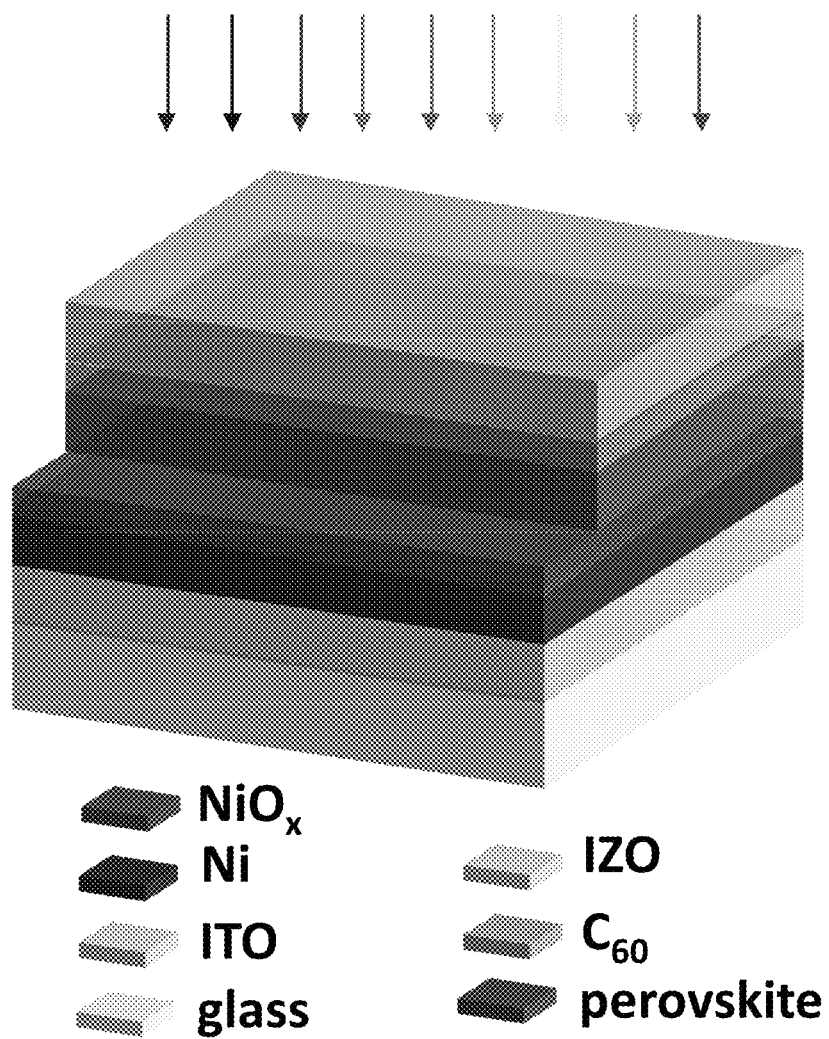
FIG. 13A illustrates vertical device experiment of the Ni—$NiO_x$ contact with a standard top contact for p-i-n perovskite architecture, according to some embodiments of the present disclosure. Different colors are different pixels/devices on the same substrate. Roll-over starts to appear after in forward current.
Figure 13B:
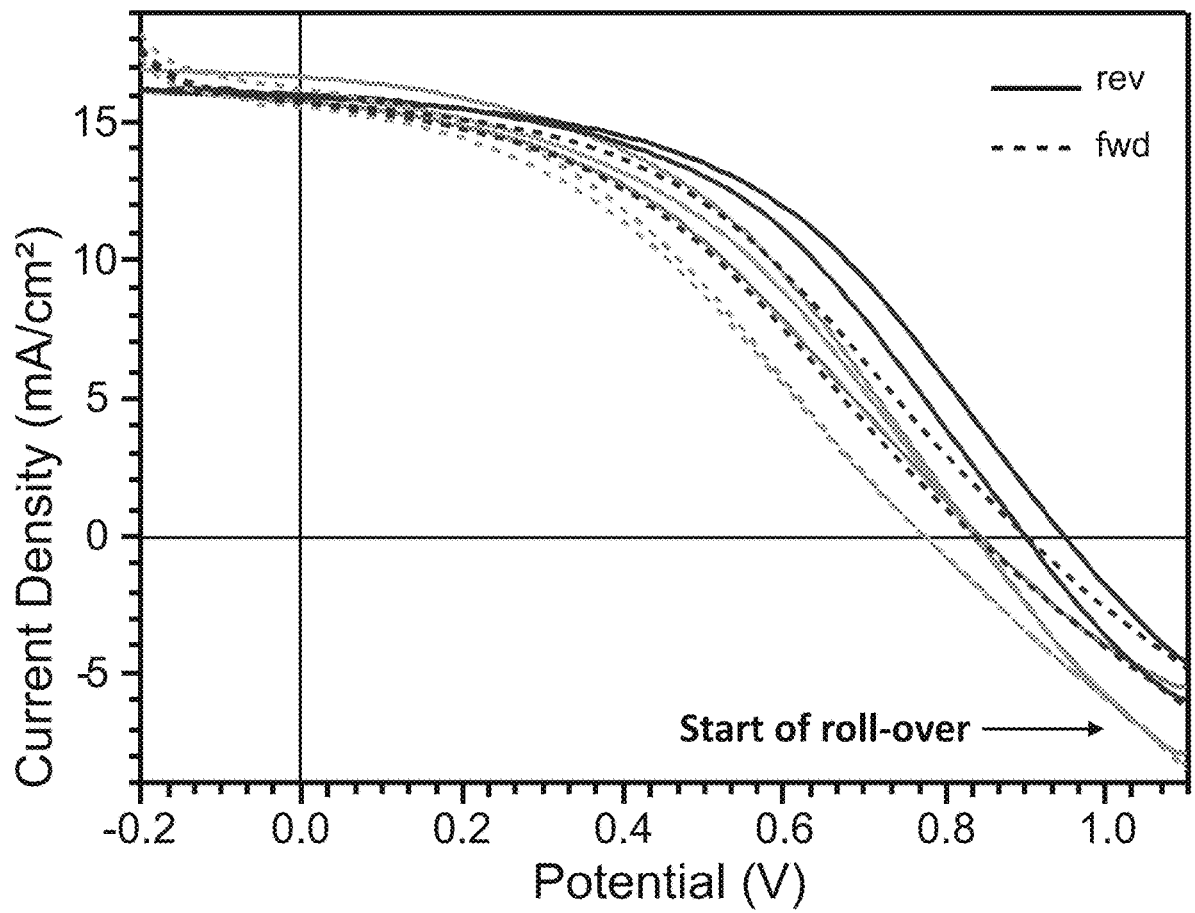
FIG. 13B illustrates current-voltage curves resulting from the device illustrated in FIG. 13A, according to some embodiments of the present disclosure.

UVO exposure removed near-surface defect states in the $TiO_2$ charge transport layers 126. The similarity seen between UPS (see Panel A of FIG. 11B) and XPS (see Panel B of FIG. 11B) valence band spectra, where the approximate information depths are 2 nm and 10 nm respectively, reveal different populations of defect states for the samples across the surface treatments. In addition, the similarity of signal across the XPS valence band spectra in contrast to the UPS for the samples with and without UVO exposure, indicates these defects are more concentrated at the surface (see Panel B of FIG. 11B). Removing these surface defect states reduces interfacial trap-assisted recombination and enhances device performance, consistent with increased $V_{OC}$ from devices exposed to UVO.

2D Device Modeling: JV curves of ABC devices have a number of unique features, depending on interface process conditions: (i) pronounced roll-over of the curves under forward bias; (ii) significant increase in $V_{oc}$ for the contacts with UVO treatment compared to annealing only; and (iii) reduced $J_{sc}$ and high series resistance for the contacts only exposed to UVO. Two-dimensional (2D) device modeling to investigate the origin of these JV features based on interface properties inferred from the XPS/UPS analysis. Major assumptions were: (1) an ohmic $TiO_2$ charge transport layer 126 (see FIGS. 12A, 12B, 13A, and 13B), (2) model for devices only exposed to annealing did not include a $NiO_x$ layer charge transport layer 136 above the Ni contact layer 134, inferred from the XPS/UPS data, (3) models exposed to UVO had a 10 nm-thick $NiO_x$ layer. The semiconductor transport equations were solved in a 2D, axially symmetric domain to account for both lateral and transverse charge transport.

Figure 14A:
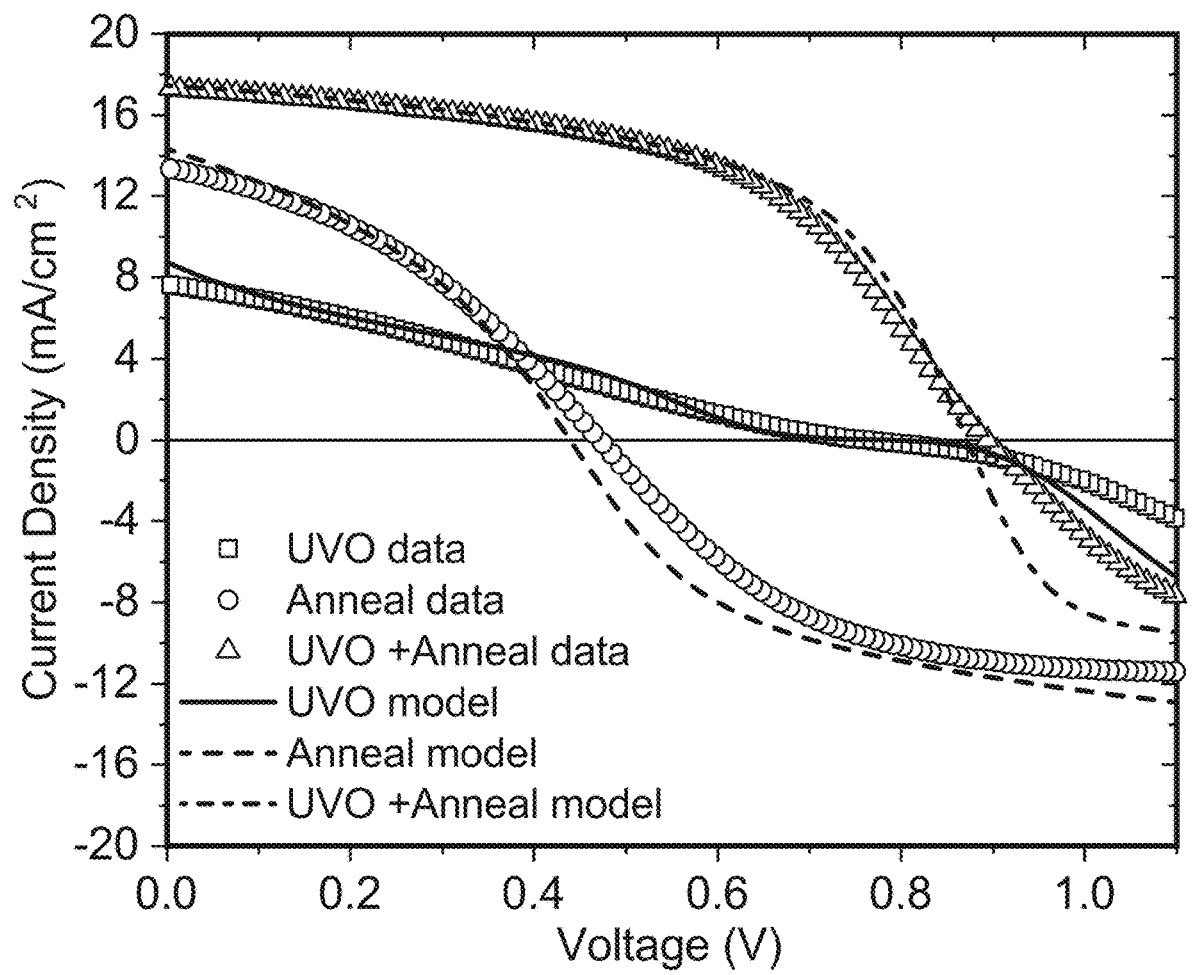
FIG. 14A illustrates modeled JV curves plotted against experimental data, according to some embodiments of the present disclosure.

The 2D model suggests the origin of the features in our JV curves (see FIG. 14A) are dominated by three factors: (1) density of interface defects leading to recombination, (2) the identity of the interface defects, and (3) the work-function of the Ni—NiO$_x$ contact ($\phi_{Ni}$) charge transport layer 136. First, the general effects of defect densities at the perovskite/NiO$_x$ (N$_{i,NiOx}$) and perovskite/TiO$_2$ (N$_{i,TiO2}$) (active material 150/ charge transport layer 126) interfaces were studied. The Ni work function was set to $\phi_{Ni}$=5.5 eV to minimize the hole injection barrier and defect states were assumed to be discrete with mid-gap energy levels. Equal defect densities at both interfaces (N$_{i,NiOx}$=N$_{i,TiO2}$) within a range of $10^{10}$ to $10^{14}$ cm$^{-2}$ were assumed in each case (see FIG. 14B). Interface defect charge states were set as neutral (n), acceptor (a) or donor (d), where the charge depends on the occupation probability of the defect. Five charge combinations were studied with the defect types at the NiO$_x$/TiO$_2$ surfaces, respectively, as neutral/neutral, acceptor/acceptor, donor/donor, acceptor/donor, or donor/acceptor.

Figure 14B:
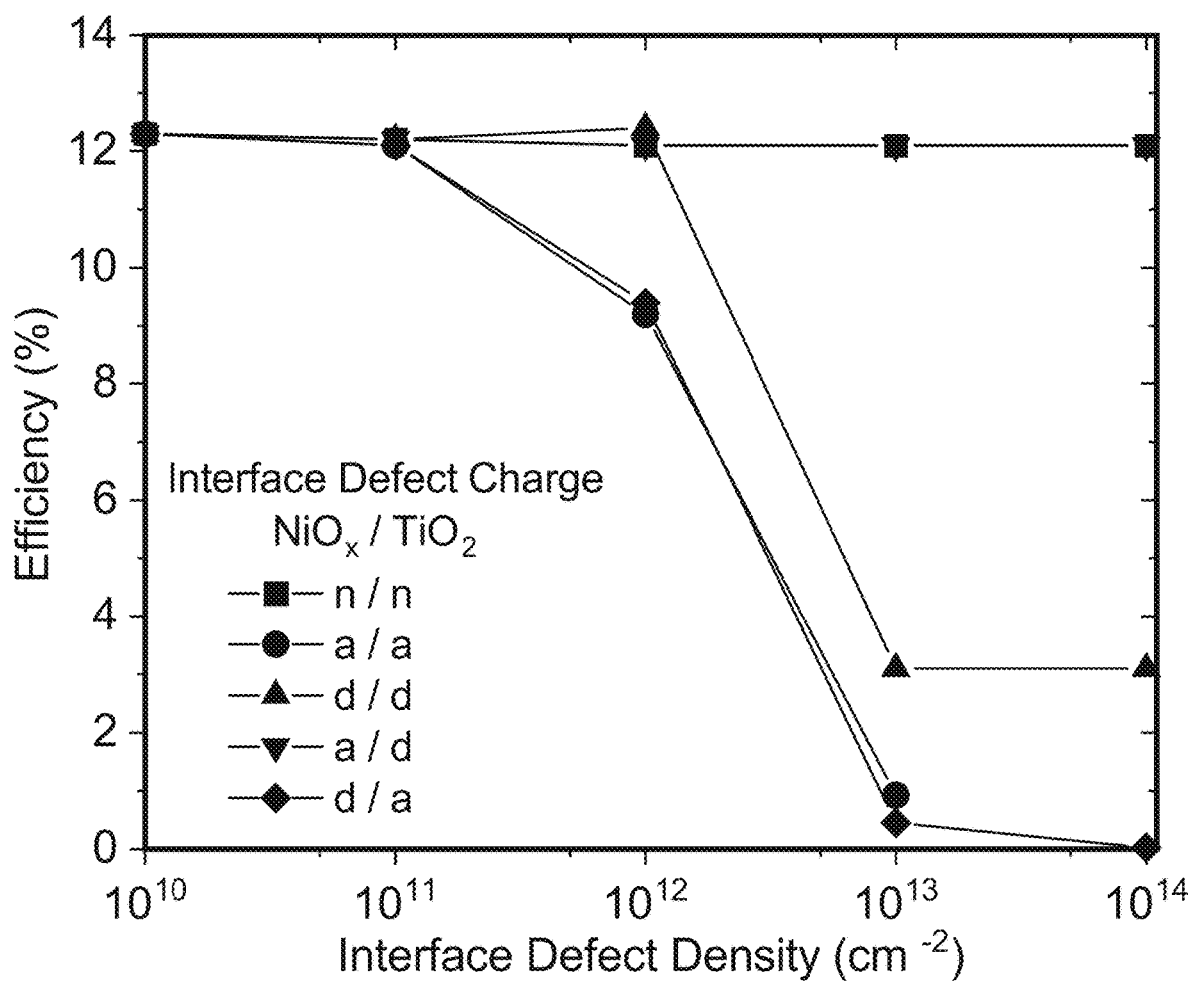
FIG. 14B illustrates efficiency vs. interface defect density plot highlighting the importance of charge defects, according to some embodiments of the present disclosure. Defect charge combinations for the perovskite-$NiO_x$/perovskite-$TiO_2$ interfaces were neutral/neutral, acceptor/acceptor, donor/donor, acceptor/donor, or donor/acceptor.

Neutral defects (recombination only, no charge density) and the acceptor/donor combination had negligible effects on device performance (see FIG. 14B). Significant performance loss was observed with charge combinations of acceptor/acceptor, donor/donor, and donor/acceptor as defect densities increased beyond $10^{11}$ cm$^{-2}$ (see FIG. 14B). When the interface defect charge is of opposite sign to that of the dopant in the adjacent oxide layer and when the defect density is sufficiently high, interface charge significantly reduces the built-in electric field within the perovskite absorber. Mobile perovskite ions, such as halide vacancies accumulating at hole-transport layer interfaces to screen the electric field, could be the identity of these charges in experimental devices. The electric field is impacted when the equivalent volume interface defect density, Ni$^2$, is of opposite charge and greater density than the doping of the adjacent oxide layer; here assumed to be $10^{17}$ cm$^{-3}$ with donor-type and acceptor-type doping in the TiO$_2$ and NiO$_x$, respectively. Significant performance loss occurs at N$_i$>$10^{11}$ cm$^{-2}$ (equivalently, $(10^{11})^{2/3}$=1.5×$10^{17}$ cm$^{-3}$) with acceptors and donors at the perovskite/TiO$_2$ and perovskite/NiO$_x$ interfaces, respectively (see FIG. 14B).

Figure 15:
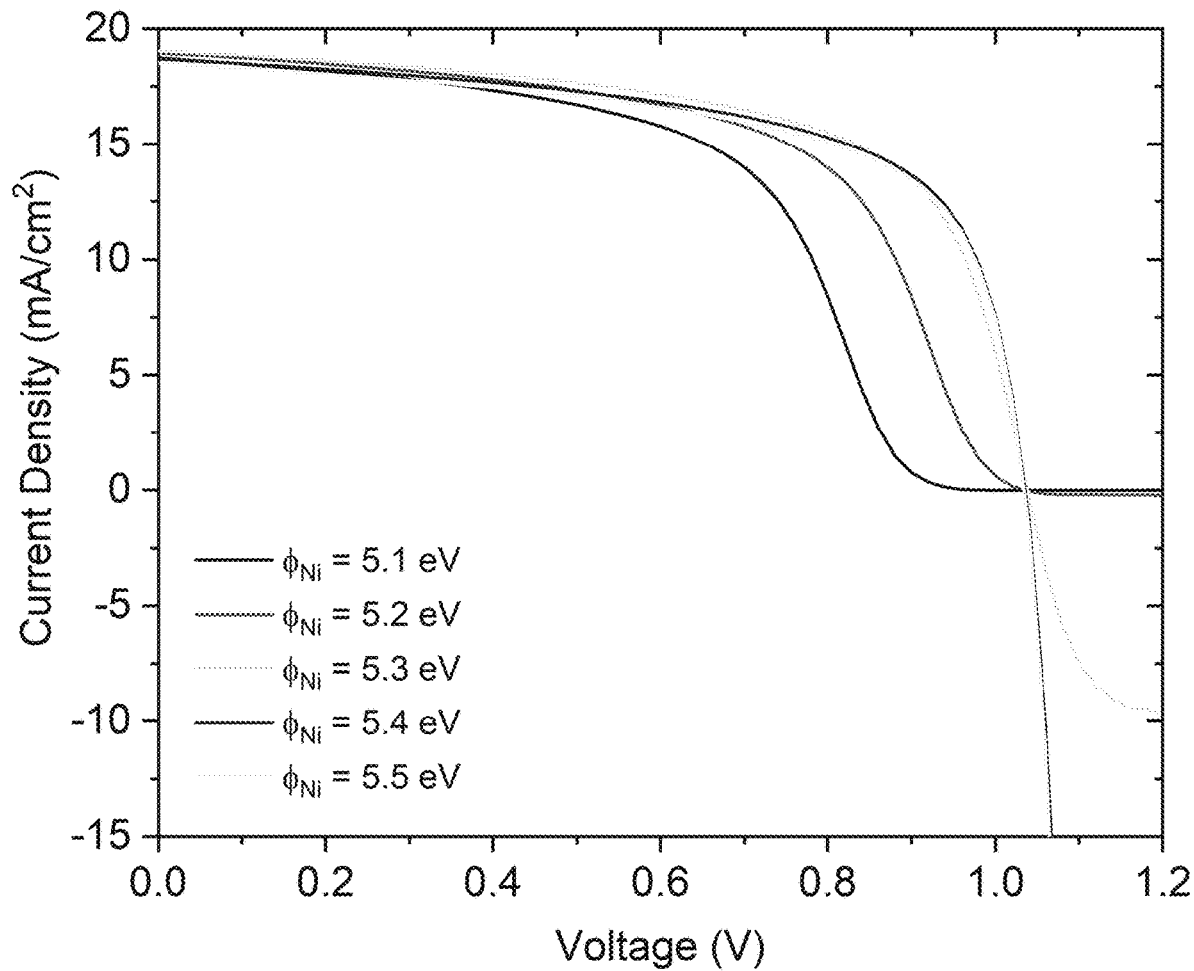
FIG. 15 illustrates light JV curves for different values of the Ni—$NiO_x$ contact work function, according to some embodiments of the present disclosure. Equal interface defect densities were assumed $N_{i,NiOx}=N_{i,TiO2}=10^{10}$ $cm^{-2}$.

It was determined in this work that a hole-injection barrier at the Ni—NiO$_x$-perovskite junction caused the observed roll-over in our experimental JV curves. JV roll-over is often associated with a barrier to majority carrier injection. For models with the NiO$_x$ layer, we determined the barrier height, $\phi_{bp}$, by the work function at the Ni/NiO$_x$ contact, $\phi_{Ni}$, the NiO$_x$ band gap, E$_{g,NiO}$, and NiO$_x$ electron affinity, $\phi_{NiO}$, according to $\phi_{bp}$=$\chi_{NiO}$+E$_{g,NiO}$−$\phi_{Ni}$. Models for devices that were only annealed did not include the NiO$_x$ layer and assumed that the perovskite was in direct contact with Ni, inferred from the XPS/UPS analysis. In those cases, the hole injection barrier was $\phi_{bp}$=$\chi_p$+E$_{g,p}$−$\phi_{Ni}$, where $\chi_p$ and E$_{g,p}$ are the electron affinity and band gap of the perovskite, respectively. Without the NiO$_x$ layer, a value of $\phi_{Ni}$=4.8 eV ($\phi_{bp}$=0.72 eV) represented the roll-over of the JV curve from the device subject to only a 300° C. anneal (see FIG. 14A). For models with the NiO$_x$ layer, a value of $\phi_{Ni}$=5.3 eV ($\phi_{bp}$=0.41 eV) provided a degree of roll-over similar to experimental JV data (see FIG. 14A), found by varying the work function as a model parameter (see FIG. 15). Increase in work function with UVO exposure is consistent with UPS data (see FIGS. 8A-8D) and accounts for the observed increase in V$_{oc}$.

Figure 14C:
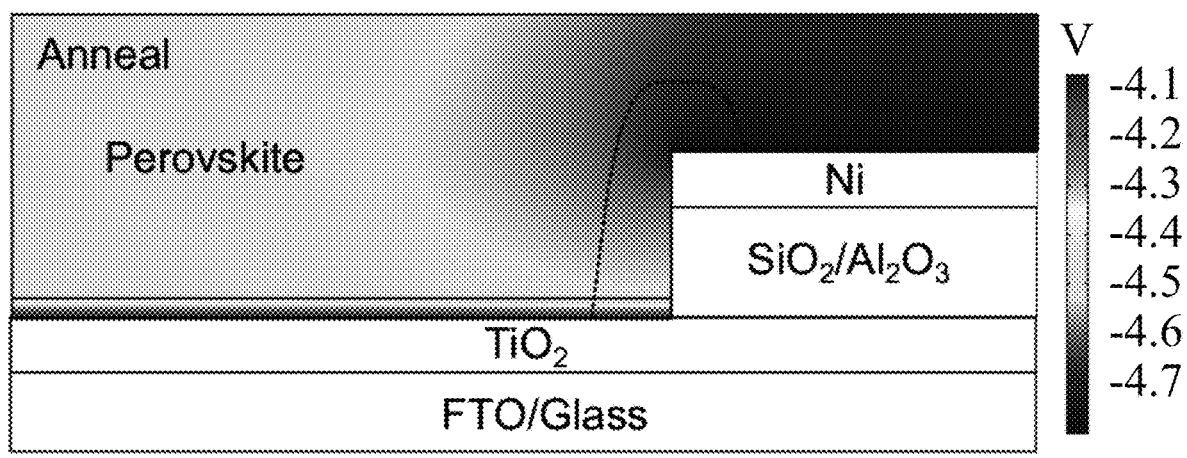
FIGS. 14C and 14D illustrate 2D potential maps and 1D energy band diagrams, respectively, along the corresponding curved dashed line of each model for devices subjected to 300° C. annealing process, according to some embodiments of the present disclosure. The main parameters differentiating each model are summarized in Table 4.
Figure 14D:
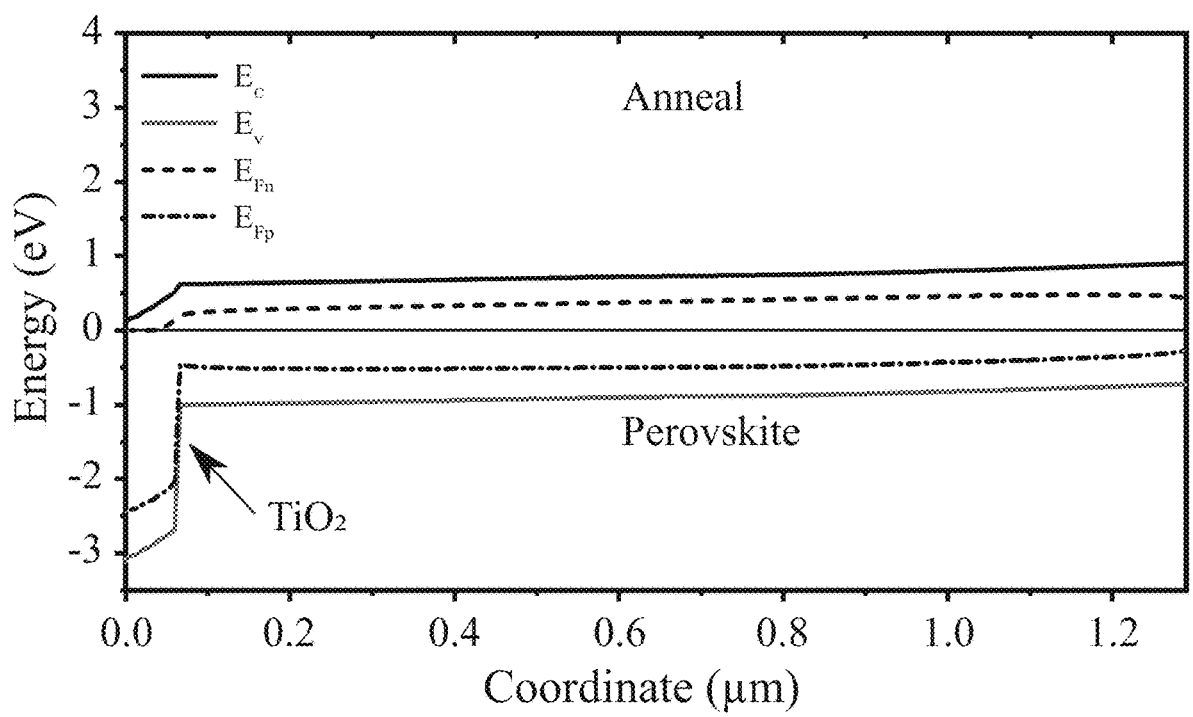

Physical phenomena that dominate experimental JV curves are nicely visualized using 2D potential maps and 1D energy band diagrams. Devices with lower work function and absence of NiO$_x$ reduced the quasi-fermi level splitting, which reduced V$_{oc}$ (see FIGS. 14C and 14D). The 2D potential maps indicate a greater lateral electric field in the same devices compared to devices only exposed to UVO. The greater lateral potential gradient assists with drift-based carrier transport and collection and explains higher J$_{sc}$.

Figure 14E:
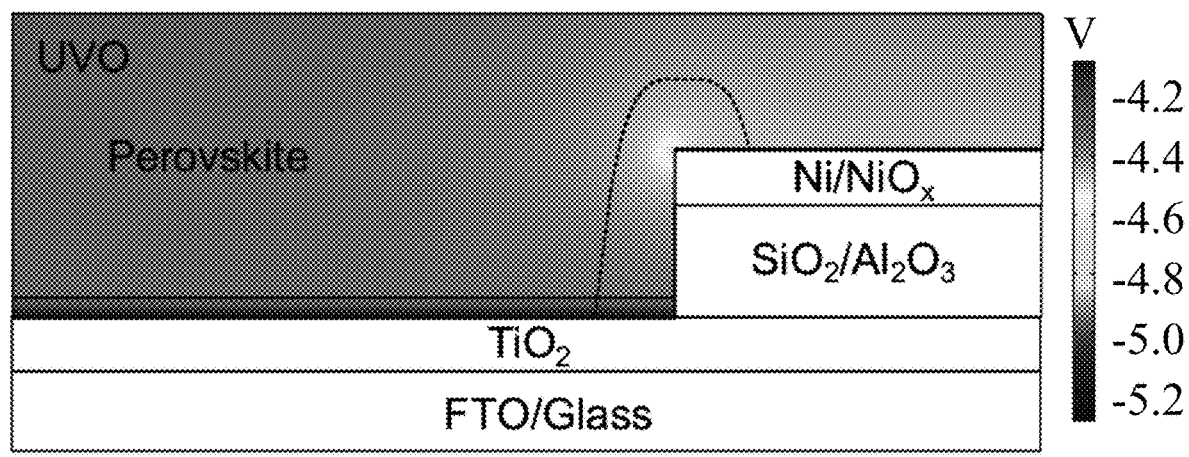
FIGS. 14E and 14F illustrate 2D potential maps and 1D energy band diagrams, respectively, along the corresponding curved dashed line of each model for devices subjected to UVO exposure, according to some embodiments of the present disclosure. The main parameters differentiating each model are summarized in Table 4.
Figure 14F:
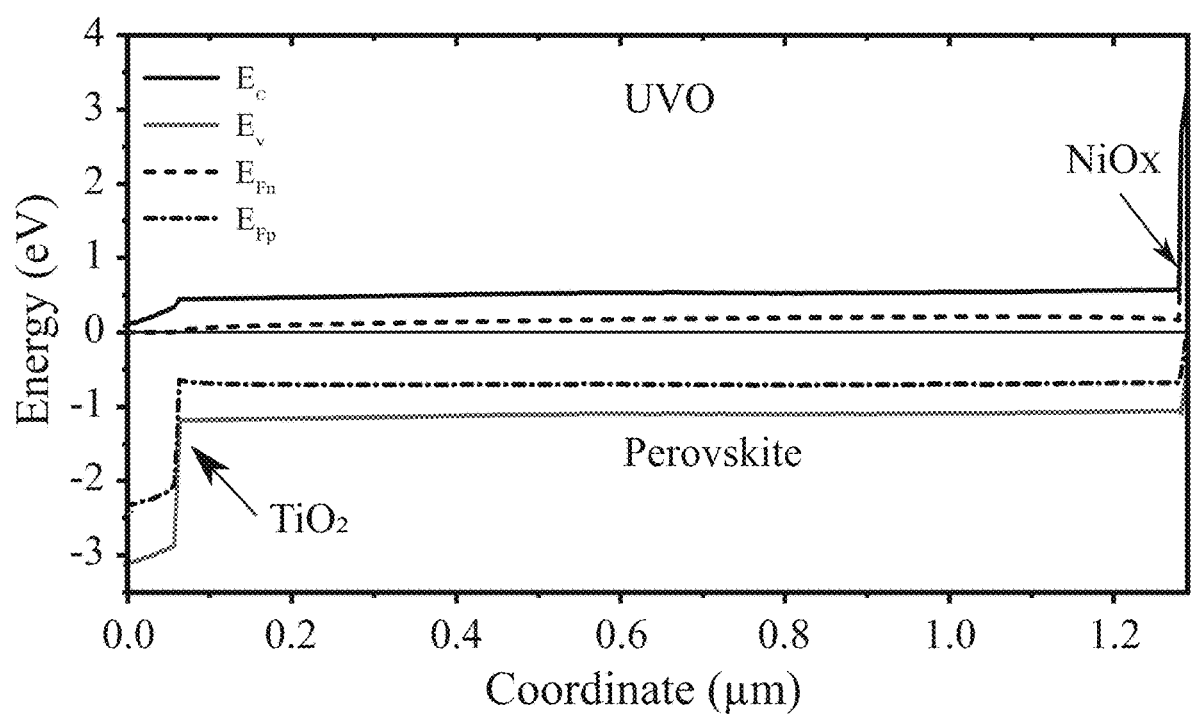

The high density of charged defects at the perovskite/NiO$_x$ interface (see Table 4) for devices exposed to UVO screened the electric field (see FIG. 14E), which reduced J$_{sc}$ and flattened the JV curve. The high defect density correlates with the increased Ni$^{\leq 3+}$ defects from the XPS analysis. The 1D energy band diagram reveals almost flat valence and conduction bands across the perovskite region (see FIG. 14F), limiting carrier transport mainly to diffusion within the bulk of the perovskite. Though chemical identity of the charged defects in the model are not identified, the interface defects may account for mobile ions in the perovskite film that migrate to toward the interfaces and screen the electric field, generating a similar flat band condition within the bulk of the perovskite film. A small extraction barrier or valence band offset between the perovskite and NiO$_x$ of 0.19 eV (see inset of FIG. 14H) was needed to model the J$_{sc}$. This may represent a PbI$_{2-x}$Br$_x$-rich layer formed as a result the reaction between the Ni$^{\leq 3+}$ defects and perovskite precursors.

TABLE 4

Key Model Parameters

| | N$_{i, NiOx}$ (cm$^{-2}$) | N$_{i, TiO2}$ (cm$^{-2}$) | $\phi_{Ni}$ (eV) |
|---|---|---|---|
| Anneal | NA | 1.5 × $10^{12}$ (acceptors) | 4.8 |
| UVO | 5 × $10^{12}$ (donors) | 1 × $10^{12}$ (acceptors) | 5.3 |
| UVO + Anneal | 1 × $10^{10}$ (donors) | 1 × $10^{12}$ (acceptors) | 5.3 |

Figure 14G:
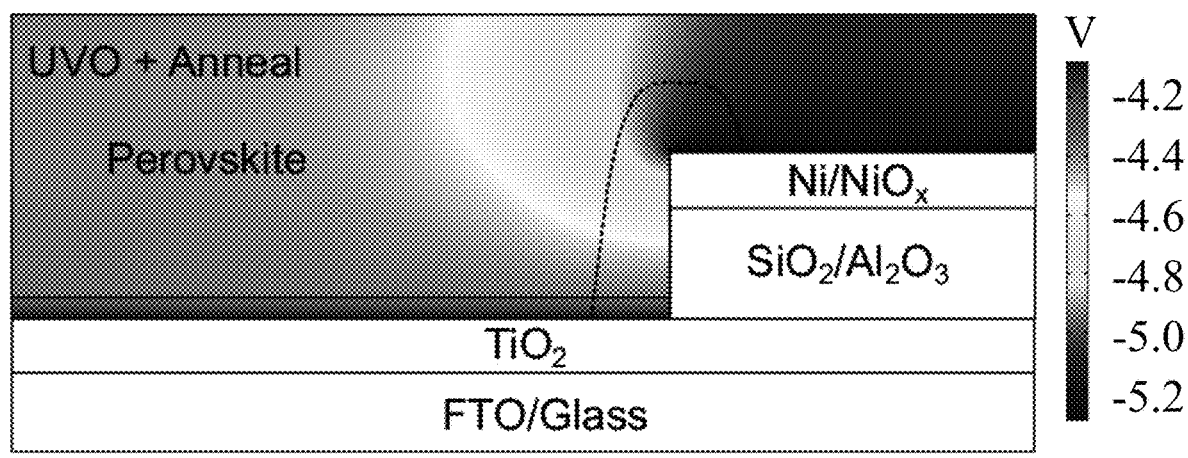
FIGS. 14G and 14H illustrate 2D potential maps and 1D energy band diagrams, respectively, along the corresponding curved dashed line of each model for devices subjected to UVO followed by the 300° C. annealing process according to some embodiments of the present disclosure. The main parameters differentiating each model are summarized in Table 4.
Figure 14H:
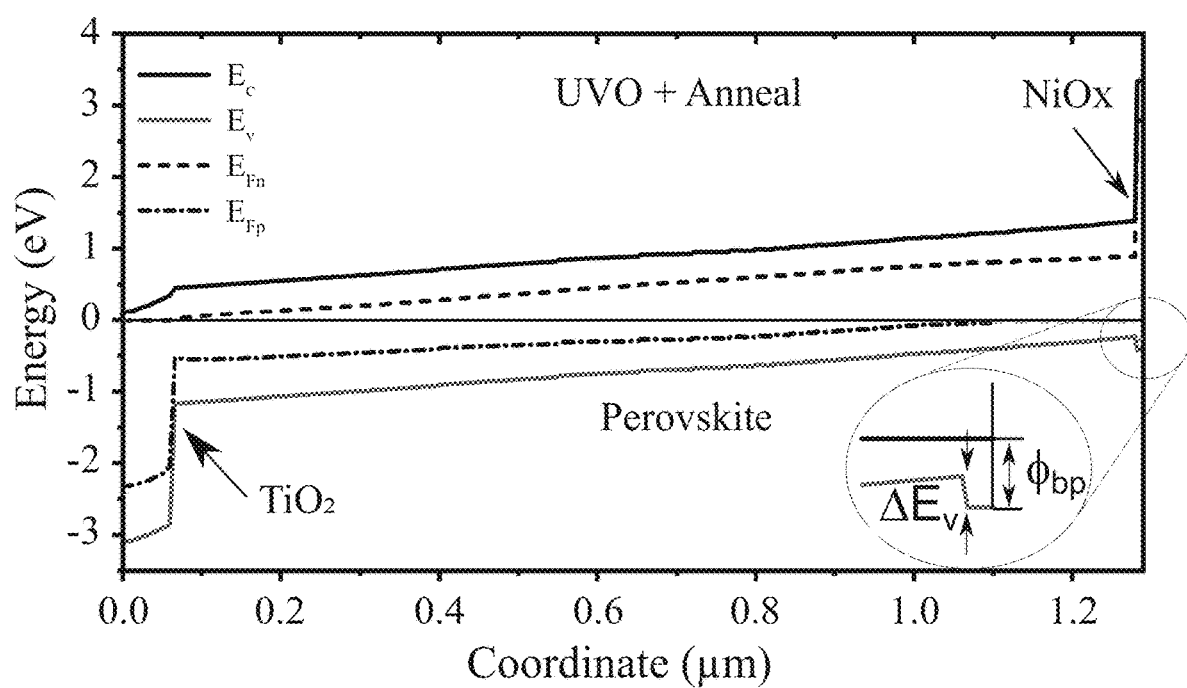

Devices that are sequentially exposed to UVO and annealed had the largest potential drop across the perovskite due to a reduction in defect density by two-orders of magnitude at the perovskite/NiO$_x$ interface (see Table 3) to yield increased J$_{sc}$ and FF (see FIGS. 14G and 14H). An improved model fit was established by slightly decreasing the interface defect density at the perovskite/TiO$_2$ interface relative to the device that was not UVO-treated, corresponding to the XPS/UPS observation of reduced defects on the TiO$_2$ surface after UVO exposure. Sufficient mitigation of charged defects at the interfaces creates a de facto p-i-n solar cell structure with a strong electric field maintained across the full perovskite absorber that enhances carrier collection efficiency (see FIGS. 14G and 14H).

Figure 16:
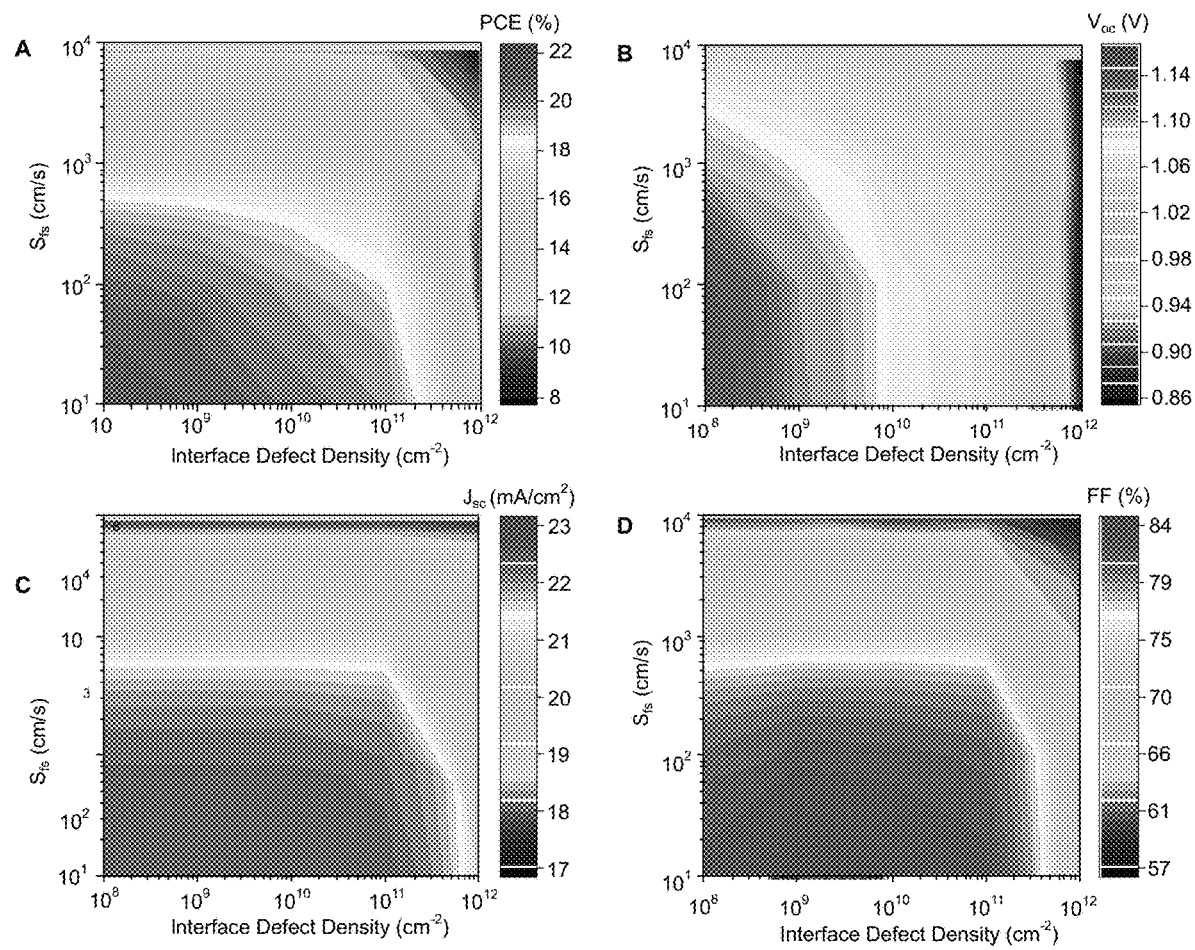
FIG. 16 illustrates extending 2D device modeling to understand how to improve the ABC perovskite solar cells past 20% PCE, according to some embodiments of the present disclosure. (A) PCE (B) $V_{oc}$ (C) $J_{sc}$ (D) FF as a function of $S_{fs}$ and interface defect density. The work function was set to $\phi_{Ni}=5.5$ eV to avoid a majority carrier injection barrier.

Pathway to >20% PCE for ABC perovskite solar cells: By careful consideration of interfaces before a perovskite absorber is deposited, a robust ABC device architecture has been developed herein. The perovskite deposition process may also affect the interfaces by altering defect densities and band alignment. The front surface of the perovskite absorber is the final interface that may be managed during fabrication. In addition to a lowered work function of the Ni—NiO$_x$ contact and mitigating charged defect densities, the front surface recombination velocity (S$_{fs}$) must be minimized to achieve >20% PCE (see Panel A of FIG. 16). Increasing V$_{oc}$ beyond the 1.0 V was demonstrated to be strongly dependent on both S$_{fs}$ and interface defect density (see Panel B of FIG. 16), whereas J$_{sc}$ and FF are more dependent on S$_{fs}$ when interface defect densities are below $10^{11}$ cm$^{-2}$ (see Panels C and D of FIG. 16). $S_{fs}$<100 cm/s and interface defect density two orders of magnitude lower than what we have demonstrated ($10^{12}$–$10^{16}$ cm$^{-2}$) are required to reach >20% PCE (see Panel A of FIG. 16).

Figure 17A:
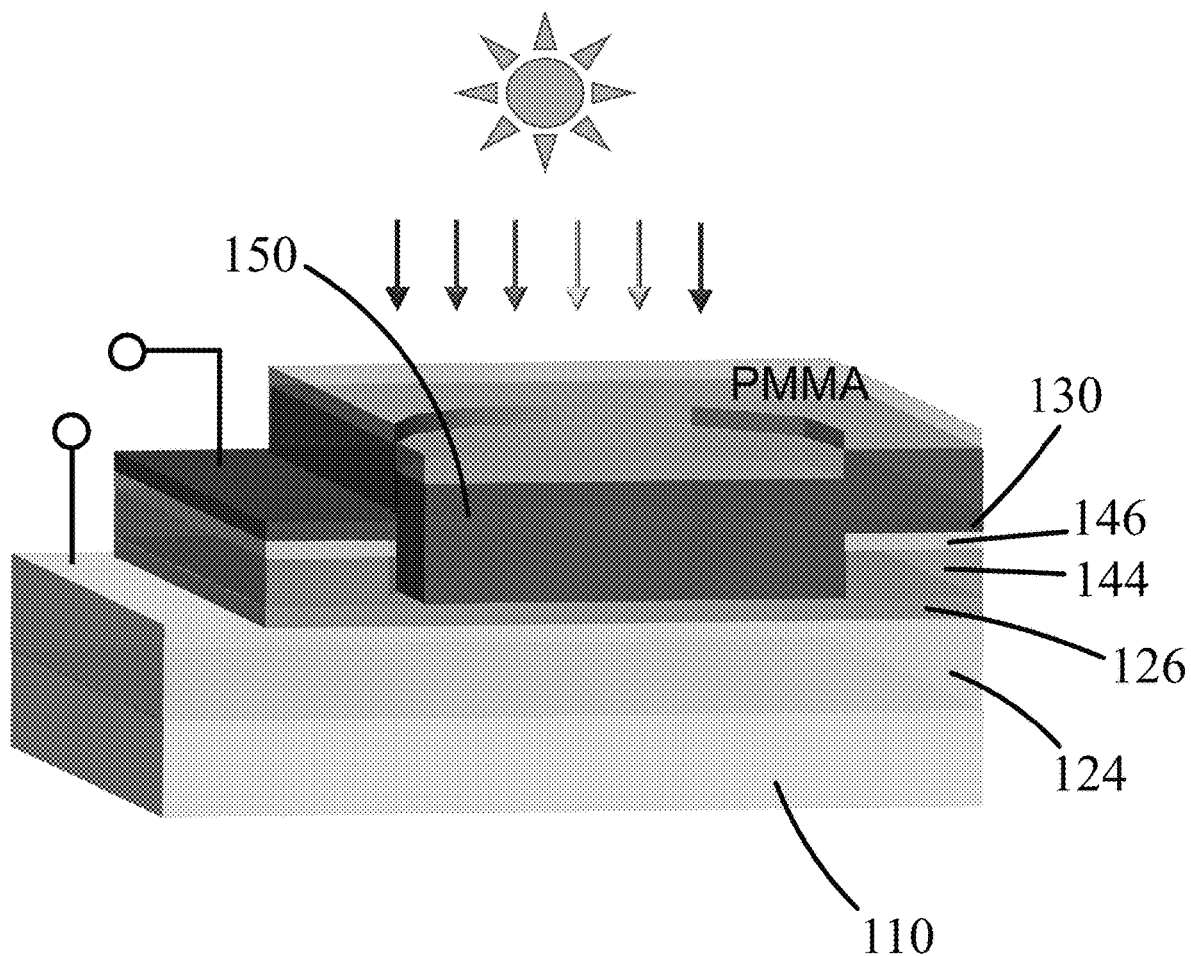
FIG. 17A illustrates an exemplary device schematic with added poly(methyl methacrylate) (PMMA) front-surface coating, according to some embodiments of the present disclosure.
Figure 17B:
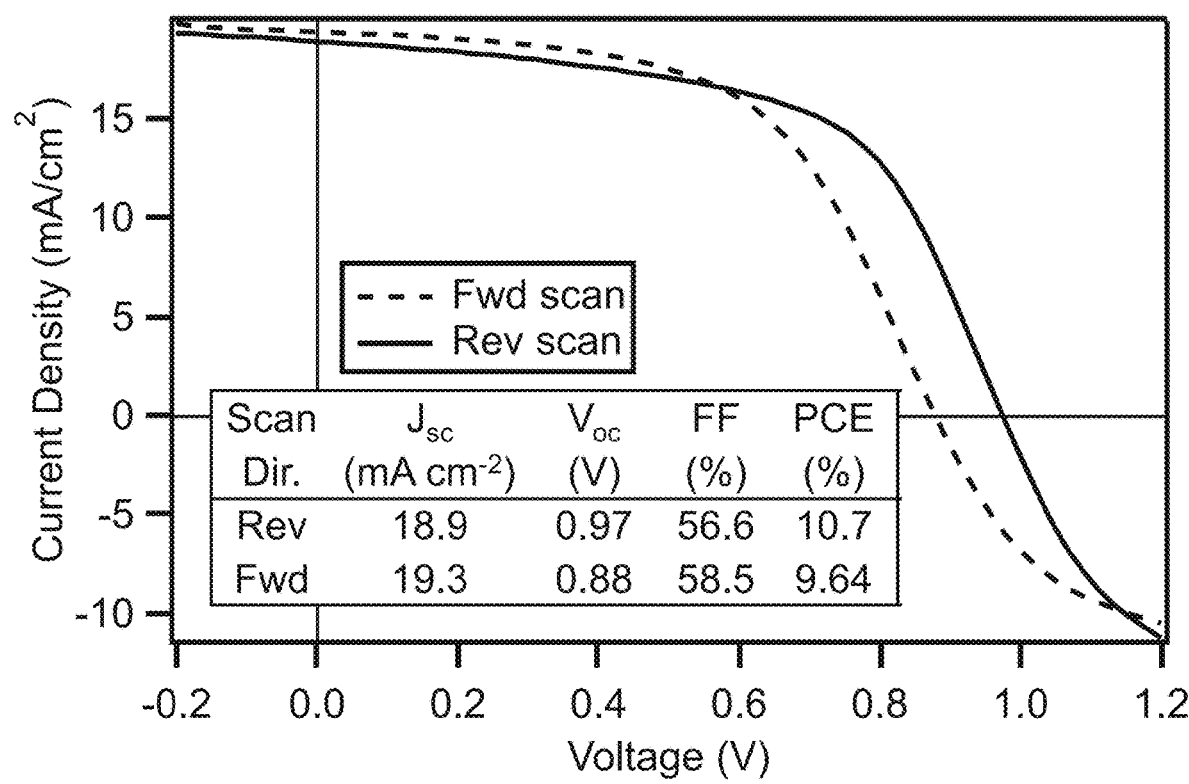
FIG. 17B illustrates forward and reverse JV-scans and solar cell metrics of obtained from the best performing device having the architecture illustrated in FIG. 17A with lower solvent vapor concentration during perovskite deposition and front PMMA coating, according to some embodiments of the present disclosure.

$S_{fs}$ was experimentally reduced, which further reduced electrode defect density, by limiting solvent vapor concentration during perovskite deposition and by applying a poly(methyl methacrylate) (PMMA) coating to our exposed perovskite surface (see FIG. 17A). PMMA coatings chemically passivate the front surface of the perovskite and acts as an antireflection coating. An increase in $J_{sc}$ was observed from reduced front-surface reflection and an increase in $V_{oc}$ (see FIG. 17B). Modeling suggests the increase in $V_{oc}$ is a result of reduced $S_{fs}$ and a reduction of defect density at the TiO$_2$-perovskite interface.

Figure 18:
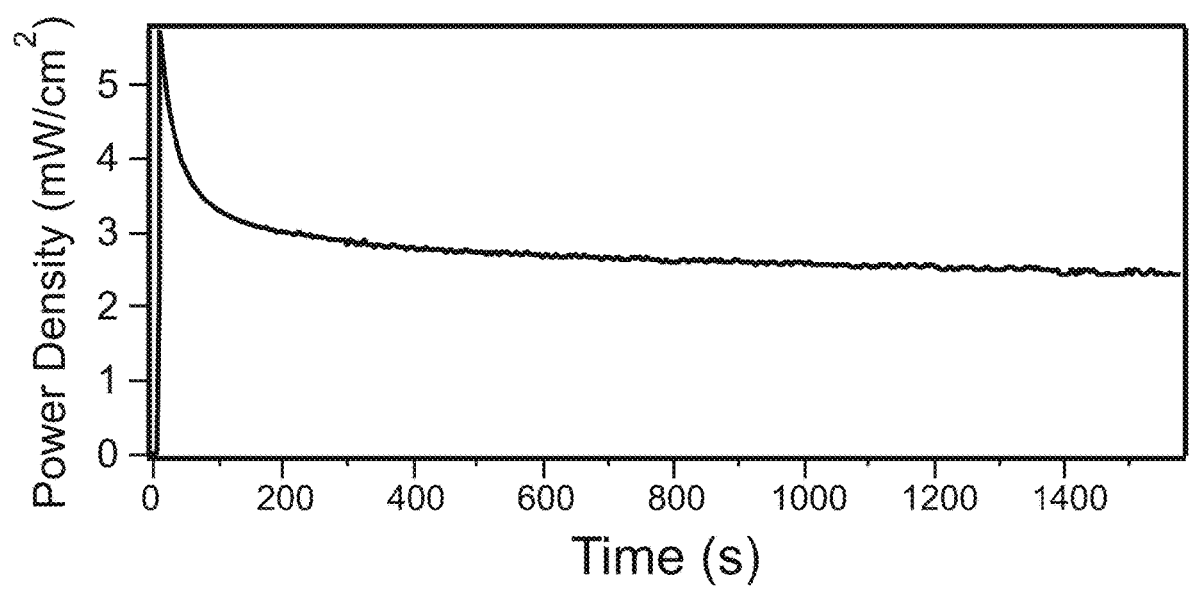
FIG. 18 illustrates power out-put of a best-performing cell with PMMA and perovskite deposited with lid-off the spin-coater held at 0.65 V, according to some embodiments of the present disclosure.

Tailoring the front surface and crystallization conditions yielded an ABC device with 10.7% reverse scan PCE and 9.64% forward-scan PCE. JV hysteresis (see FIG. 17B) and mismatch between JV scan efficiencies and stabilized power output are present and likely linked to interfacial chemistry. The stabilized power output decreased significantly below the reverse scan JV efficiency (see FIG. 18), which may be linked to unstable interfacial species at max power point conditions.

Figure 19:
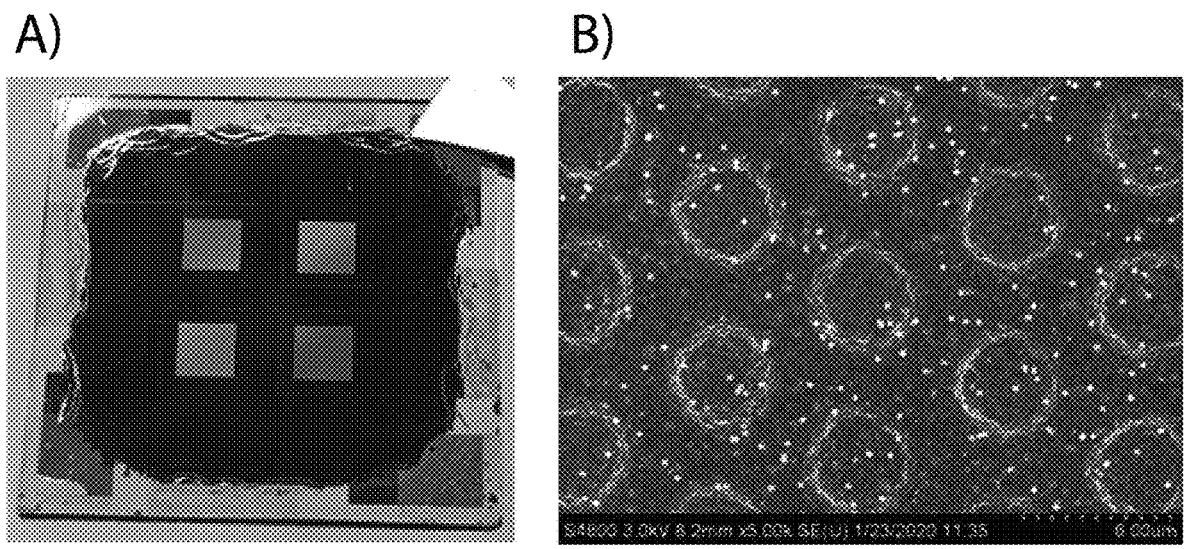
FIG. 19 illustrates an exemplary all-back-contact perovskite solar device, (Panel A) photograph of cells and (Panel B) SEM image, according to some embodiments of the present disclosure.
Figure 20:
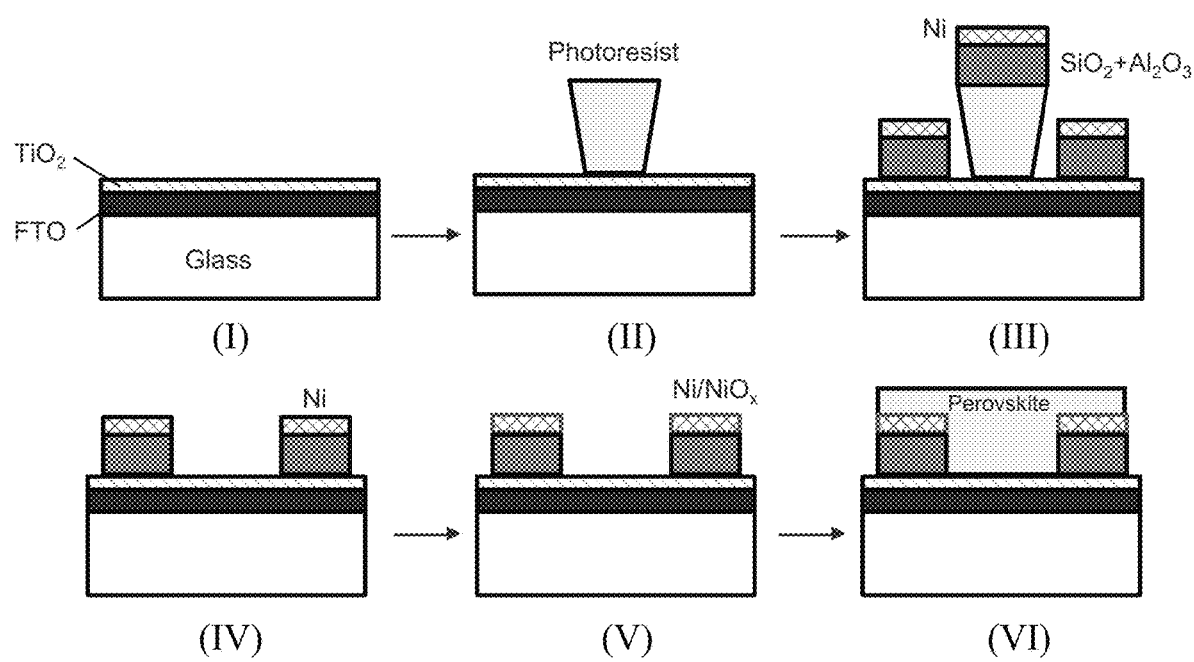
FIG. 20 illustrates an exemplary method for manufacturing the device shown in FIG. 19, according to some embodiments of the present disclosure.

FIG. 19 illustrates an exemplary all-back-contact perovskite solar device, according to some embodiments of the present disclosure. Panel A illustrates 1×1" substrate with four 0.1 cm$^2$ all-back contact perovskite solar cells. Panel B illustrates a view scanning electron microscopy (SEM) image of the completed cell showing the perovskite conformably coating the honeycomb electrode pattern (7 μm pitch and 4 μm diameter holes). These were made according to method summarized in FIG. 20. (I) Clean pre-patterned fluorine-doped tin-oxide glass substrate and deposit TiO$_2$. (II) Photolithography process to form the honeycomb pattern with an undercut sidewall for liftoff. (III) Electron-beam evaporate the SiO$_2$, Al$_2$O$_3$, and Ni. (IV) Liftoff the resist with an organic solvent to expose the honeycomb patterned electrodes. (V) Interface engineering to form a NiO$_x$ shell around the Ni electrode while optimizing the TiO$_2$ surface to interface with the perovskite. (VI) Deposit perovskite film through spin-coating.

Referring to FIGS. 1 and 2, some embodiments of all-back-contact (ABC) perovskite solar cell device designs described herein utilized two insulator layers (144 and 146) in series to electrically isolate the two electrodes (120 and 130), the first electrode 120 constructed of a c-TiO$_2$ electron transport layer (ETL or first charge transport layer 126) and an FTO contact layer 124 and a second electrode 130 constructed of an oxidized shell of NiO$_x$ hole transport layer (HTL or second charge transport layer 136) covering an underlying second contact layer 134 of metallic Ni. Other embodiments where also tested, as described below. The following data highlights some changes to the initial design that resulted in some improved performance metrics, including improved stabilized photocurrent and power-conversion efficiency. These changes include: (1) replacing c-TiO$_2$ with SnO$_2$ used to construct the first charge transport layer 126 (i.e., ETL), (2) adding a sputter evaporated NiO$_x$ to the second transport layer 136 (i.e., HTL), (3) decreasing the height of the dual insulator 140 stack, and (4) increasing the area of SnO$_2$ of the first charge transport layer 126 relative to NiO$_x$ of the second transport layer.

Figure 21A:
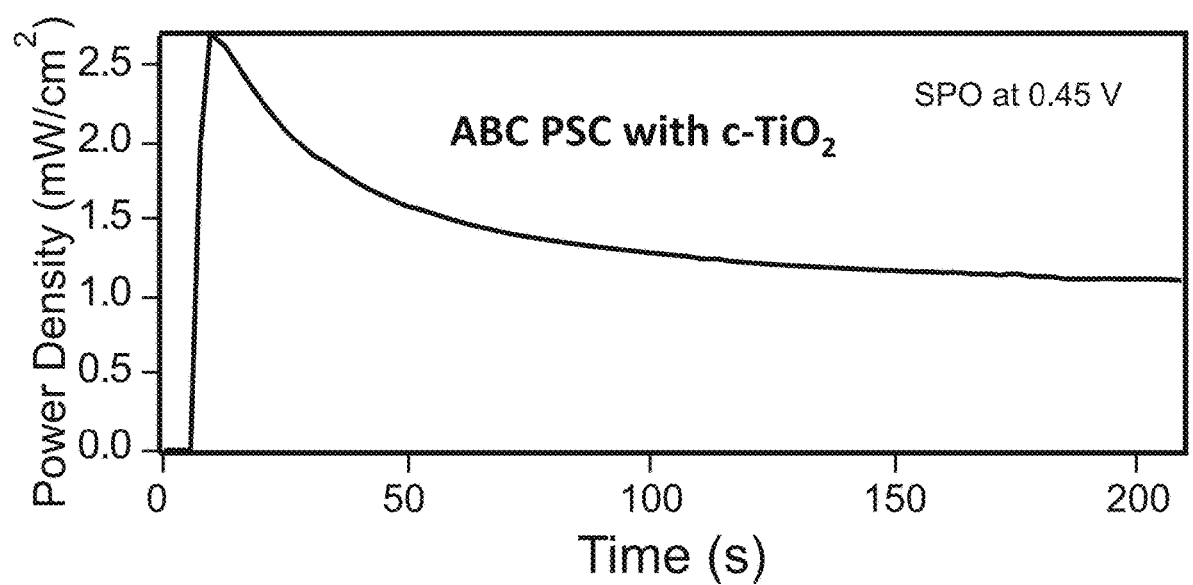
FIGS. 21A and 21B illustrate a comparison of power density curves for two devices using different materials for an electron transfer layer, according to some embodiments of the present disclosure.
Figure 21B:
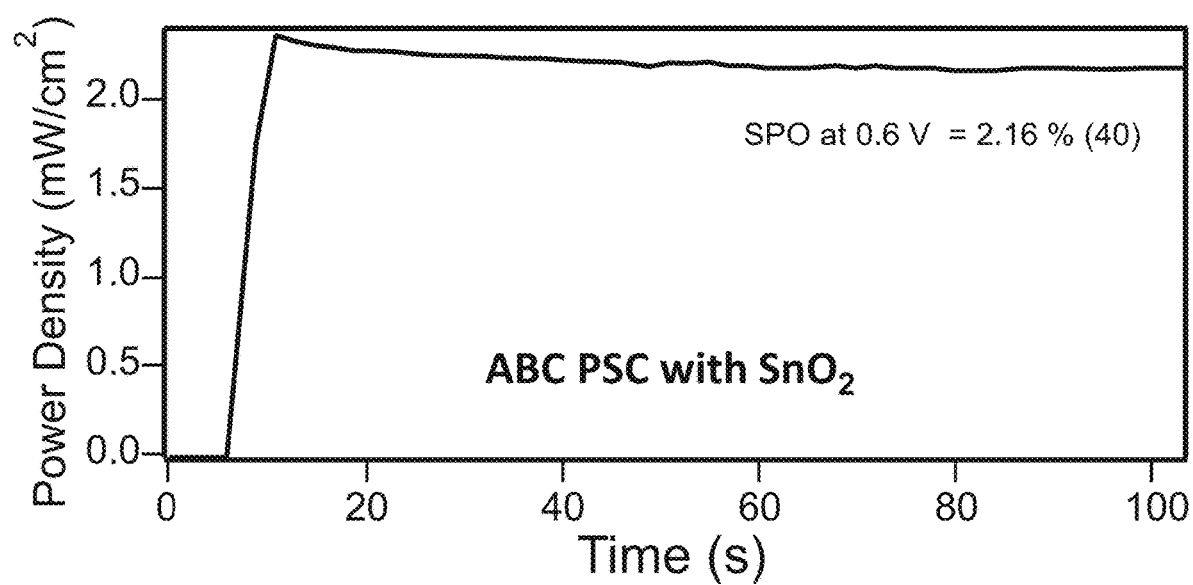
Figure 22A:
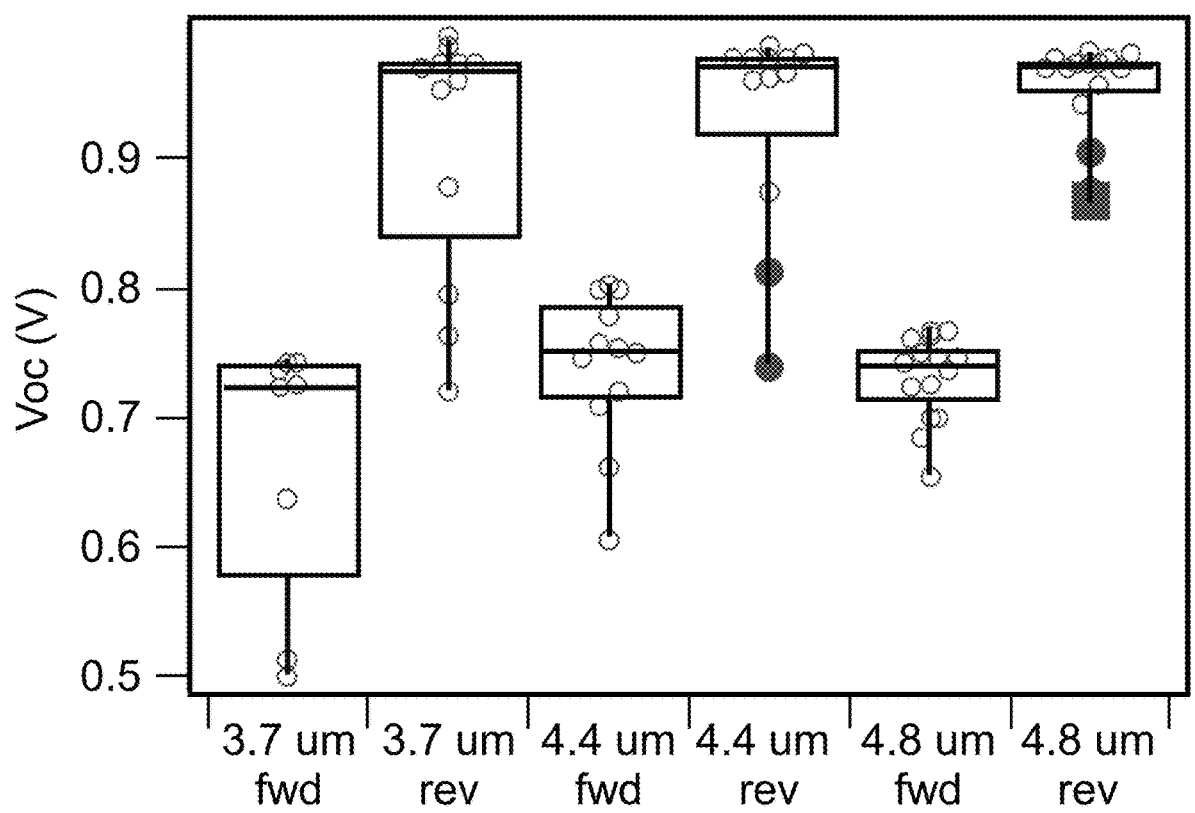
FIG. 22A corresponds c-TiO$_2$ and FIG. 22B to SnO$_2$.
Figure 22B:
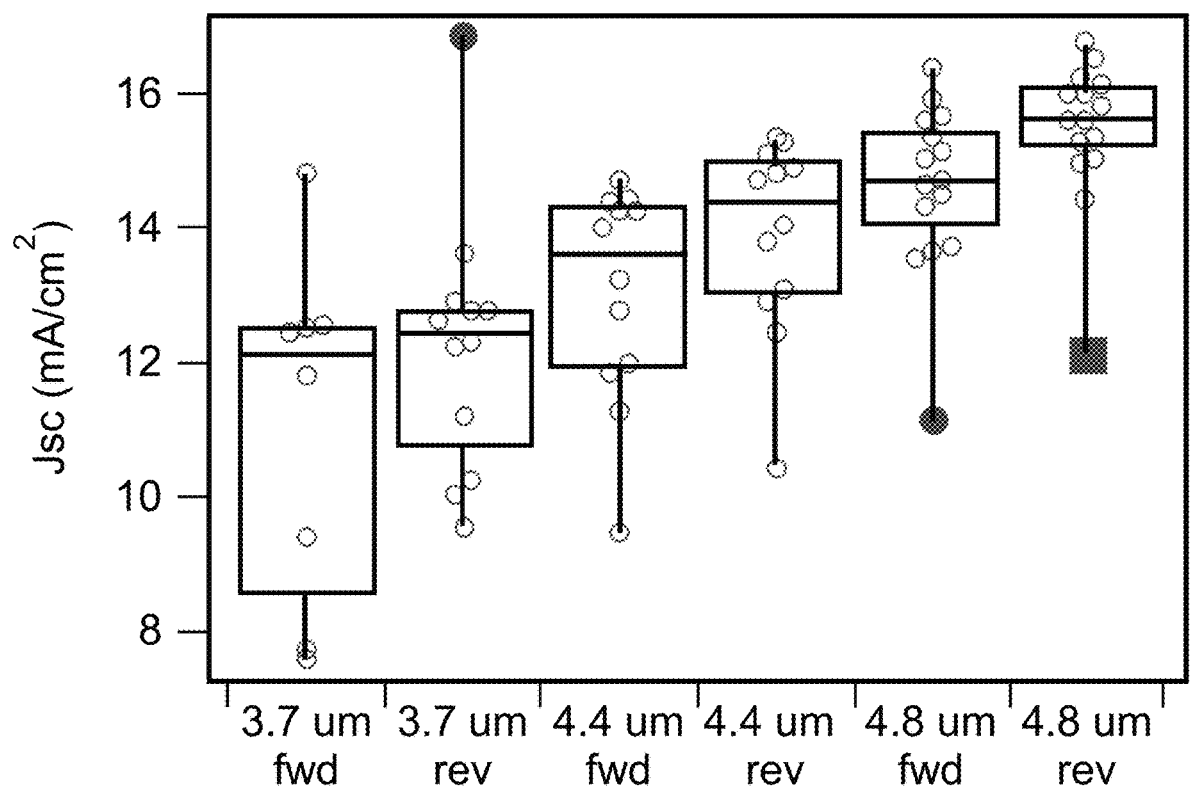
Figure 22C:
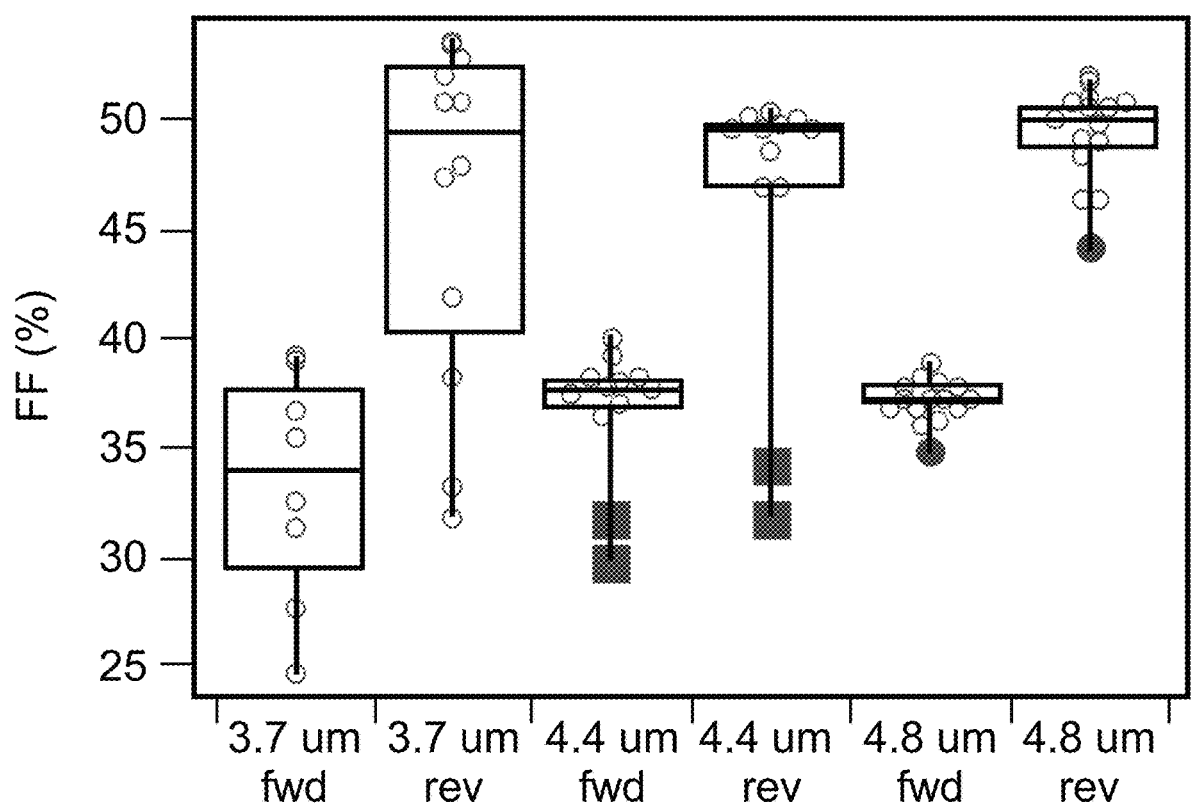
Figure 22D:
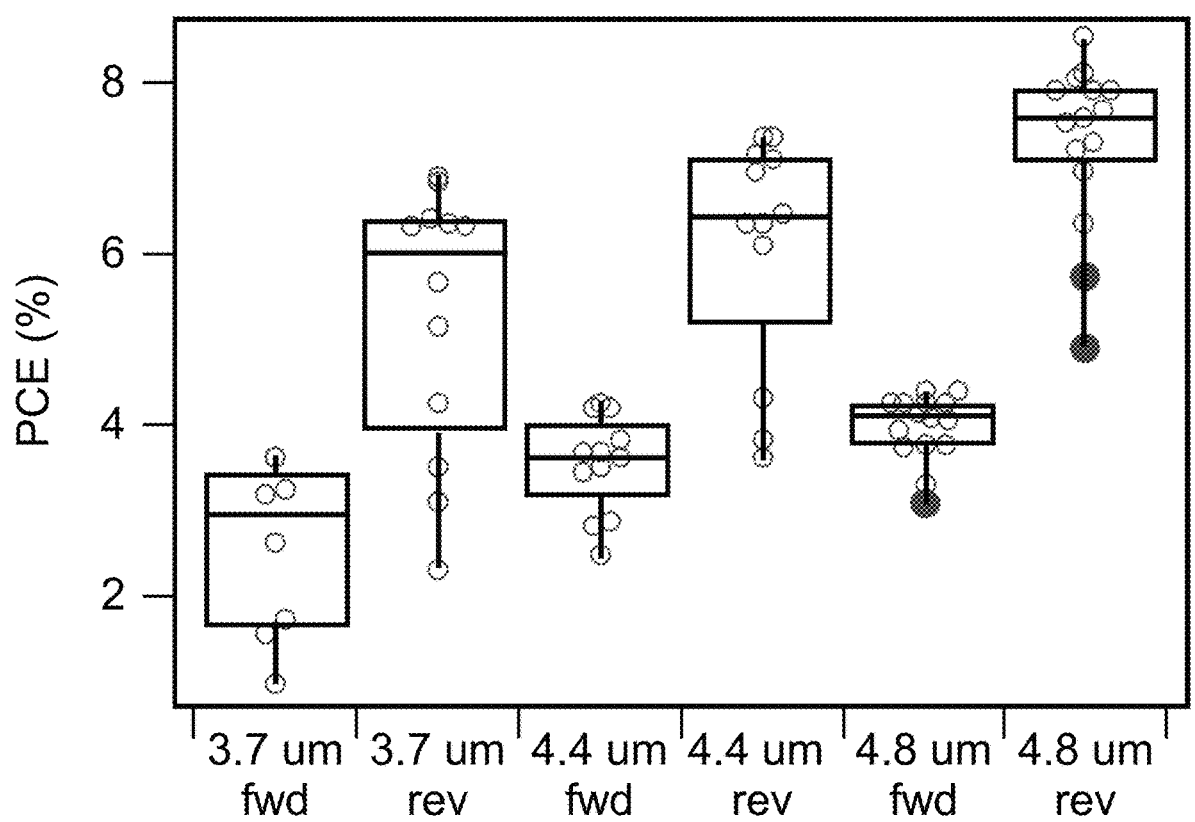

FIGS. 21A and 21B illustrate a comparison of power density curves for two devices using different materials for an electron transfer layer, according to some embodiments of the present disclosure. FIG. 21A corresponds c-TiO$_2$ and FIG. 21B to SnO$_2$. The c-TiO$_2$/perovskite interface has previously been shown to be reactive and a source for degradation over time. This is a possible reason why a non-stabilized power-output is observed in FIG. 21A for the all-back-contact (ABC) perovskite solar cells that used c-TiO$_2$ as the electron transport layer (ETL). An alternative inorganic ETL that is compatible with the perovskite band edges is SnO$_2$. So, the c-TiO$_2$ was replaced with SnO$_2$ which stabilized the power-output both in planar devices and ABC devices. The SnO$_2$ layer is formed through a nanoparticle solution.

In addition, the ETL and HTL contact areas need to be optimized to maximize photocurrent and performance of ABC perovskite solar cells. The areas of the SnO$_2$ and NiO$_x$ were systematically varied by adjusting the photoresist diameter (i.e., the diameter D of the resultant cavities 142 as shown in FIG. 1) while maintaining a constant pitch of 7.0 μm. FIGS. 22A-D illustrate statistical data for various PV metrics as a function of the diameter of the pillars at a fixed pitch, according to some embodiments of the present disclosure. These data show, that by increasing the SnO$_2$ hole diameter and contact area increased photocurrent ($J_{sc}$) while the other performance parameters ($V_{oc}$ and FF) remained largely unchanged. Time-resolved photoluminescence mapping data suggests a more defective NiO$_x$/perovskite interface compared to SnO$_2$ perovskite/interface. Thus, increasing the SnO$_2$ area relative to NiO$_x$ area should lead to less interface recombination and more photocarrier collection.

Figure 23:
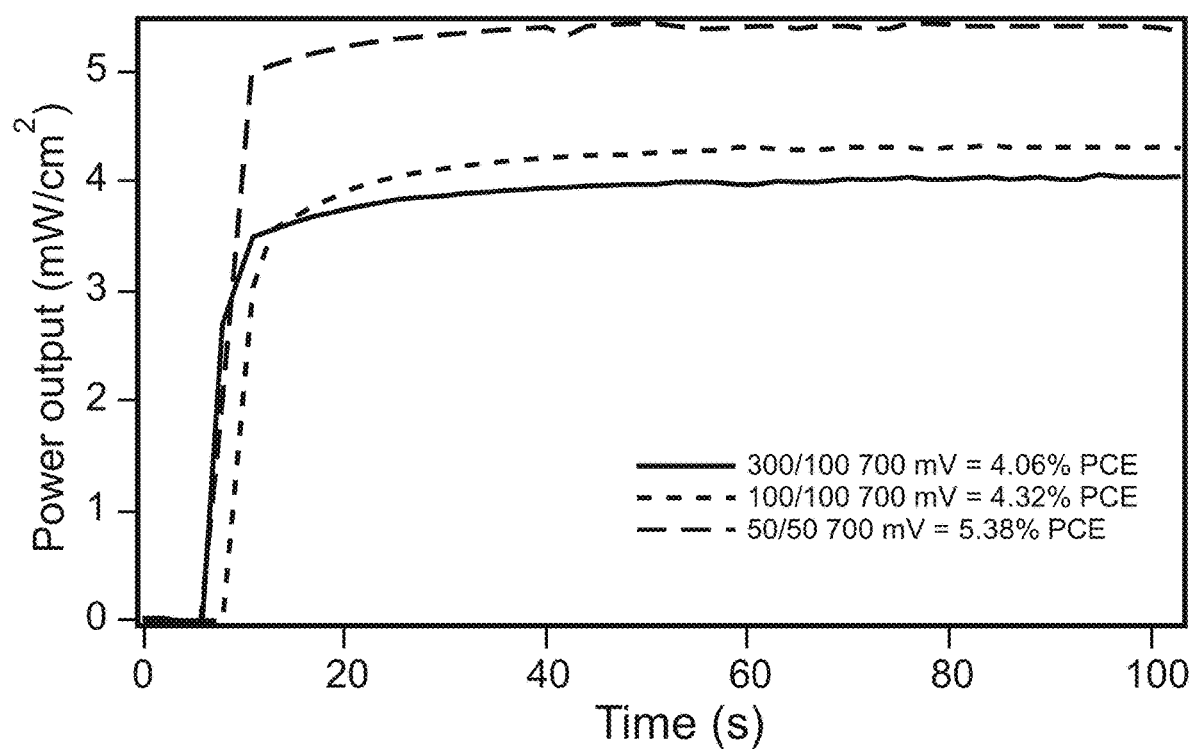
FIG. 23 illustrates power density versus time data as a function of layer thickness, according to some embodiments of the present disclosure.

FIG. 23 illustrates power density versus time data as a function of layer thickness, according to some embodiments of the present disclosure. These data show that an insulator 140 made of two insulator layers (144 and 146) in series successfully electrically isolates the two contacts from one-another at varying thicknesses. The greatest stabilized power-output was achieved using the thinnest insulator 140 made of a first insulator layer 144 of SiO$_2$ having a 50 nm thickness and a second insulator layer 146 of Al$_2$O$_3$, also having a 50 nm thickness. A shorter insulator stack leads to a smaller junction between the two contacts, which may enhance the electric field strength and assist with drift current.

Experimental Methods:

Substrate Preparation: 1"×1"×1.1 mm fluorine-doped-tin-oxide (FTO) patterned substrates were purchased from Thin Film Devices Inc. The substrates were submerged and sonicated for 15 min sequentially in Liquinox diluted in DI water, DI water, acetone, IPA, followed by 15 minutes of UV-ozone from a commercial UVO cleaner (Jelight 342).

Spin-coated TiO$_2$ electron transport layer: Titanium diisopropoxide bis(acetylacetone) solution was purchased from Sigma-Aldrich (75 wt % in isopropanol) and diluted in 2-butanol (Aldrich, 99%) to make a 0.2 M TiO$_2$-precursor solution. 180 μL was dispensed onto the patterned FTO substrates and spun at 2000 rpm for 30 s, and the films were annealed at 500° C. for 1 hr.

ABC Photolithography Patterning: AZ-5214E photoresist was purchased from Integrated Micro Materials. The resist was spun at 4000 rpm for 30 s, soft-baked at 110° C. for 1.5 minutes, exposed for 1.2 s with (CITE) a standard i-g-h line UV-light source, reverse-baked at 114° C. for 1.5 minutes, and developed in AZ-300 MIF developer for 23 s to create an optimal liftoff profile.

SiO$_2$, Al$_2$O$_3$, Ni electron-beam evaporation and liftoff: 300 nm of SiO$_2$ was deposited at 5 Å/s 300 mA, followed by 100 nm of Al$_2$O$_3$ at 2 Å/s 300 mA and 100 nm of Ni at 5 Å/s 600 mA. This stack was lifted in Remover-PG for 20 min stagnant and 2 min with sonication.

Interface Processing: Samples were subject to UV-Ozone treatment by placing samples <1 cm from a UV lamp of a commercial UVO cleaner (Jelight 342) operated in air. Samples were annealed in air using a Fisher Scientific Isotemp Muffle Furnace, Model 550-14.

Perovskite Deposition: Triple cation double halide perovskite films of the form $FA_xMA_yCs_{1-x-y}Pb(I_zBr_{1-z})_3$ were formed following a reported method.[65] Briefly, 22.4 mg MABr, 73.4 mg $PbBr_2$, 172 mg FAI, 507 mg $PbI_2$, (0.2:0.2:1:1.1 mole ratio) and 40 µL of CsI stock solution (1.5 M In DMSO) were dissolved in 1 mL of 4:1 DMF:DMSO to form the perovskite precursor solution. Samples were transferred into a glovebox, 50 µl of solution was deposited onto the patterned substrate, and spun at 2000 rpm for 10 s, and 6000 rpm for 20 s. During the spin process, 120 µL of chlorobenzene was dispensed onto the spinning substrate with 8-9 s remaining. Samples were annealed at 100° C. for 1 hr. Solvent vapor concentration present during deposition was limited by removing the lid of the spin-coater for the results in FIG. 7.

Device Testing: JV measurements were performed in a nitrogen glovebox using a Newport Oriel 94043A Sol3A Class AAA solar simulator that was calibrated each time before use with a silicon photodiode with a KG2 filter to 1-sun intensity. All devices in this study have an unmasked active area of 0.10 $cm^2$. For the champion device, masked areas were 0.6 $cm^2$.

Photoelectron Spectroscopy Methods: Measurements were performed on a Physical Electronics 5600 photoelectron spectrometer, which has been discussed in detail previously.[66] Briefly, XPS radiation was produced by a monochromatic 350 W Al Kα excitation centered at 1486.7 eV. UPS radiation was generated by a He-gas discharge lamp (He I=21.22 eV). All XPS core-level spectra were collected using a step size of 0.1 eV and pass energy of 23.50 eV while UPS spectra and XPS work function measurements were conducted with a step side of 0.025 and pass energy of 2.95 eV. The electron binding energy scale was calibrated using the Fermi edge and core levels of gold and copper substrates, cleaned with Argon ion bombardment. UPS spectra were numerically corrected for satellite peaks that arise from the polychromic He I radiation. Peak areas were fit using a Gaussian-Lorentzian peak fitting algorithm with a Shirley background. Work functions were determined using the intersection between both the baseline and a small secondary feature and a linear fit to the main feature. VBMs were calculated using linear extrapolation of the main feature in the valence band region to the background signal.

Device Modeling: The Poisson equation coupled with continuity equations for electrons and holes were solved in a 2D axially symmetric domain. Equations were solved using the finite element method with COMSOL Multiphysics®. The dominant recombination mechanism in the bulk layers and interfaces (front and back surfaces) was Shockley-Read-Hall. Recombination velocities at interfaces and surfaces were set by specifying the interface defect density, N, using $S=\sigma v_{th} N$ with capture cross-section $\sigma=10^{-14}$ $cm^{-2}$ and thermal velocity $v_{th}=10^7$ cm/s. Recombination at the front surface was set to $S_{fs}=100$ or $10^4$ cm/s, depending on the study. Optical generation assumed exponential light decay with an absorption coefficient for each material given by $\alpha=A\sqrt{hv-E_g}$, where $A=1.5\times10^5$ $cm^{-1}$ $eV^{-1/2}$, h is Planck's constant, ν is the photon frequency, and $E_g$ is the band gap. Reflectivity of the front surface was 5%. Light intensity was 100 $mW/cm^2$ over the AM1.5G spectrum. Contacts were Ohmic at the $FTO-TiO_2$ contact and Schottky at the Ni—NiO contact with specified work functions, $\phi_{Ni}$, and recombination velocity, $S_m=10^6$ cm/s. No external series resistance was included.

The model domain was a cylindrical region centered on one of the circular $FTO-TiO_2$ contacts extending half-way to an adjacent circle (see the cross-section in FIG. 5D). The hole diameter was 4.5 mm and the center-to-center distance between holes was 7 mm. The perovskite thickness was 970 nm above the FTO-TiO2 contact and 460 nm above the Ni—$NiO_x$ contact. Parameter values are provided in Table 4 for the perovskite, $NiO_x$, and $TiO_2$ layers. Doping densities for the $TiO_2$ and $NiO_x$ were $10^{17}$ $cm^{-3}$ because there was no extrinsic doping.

TABLE 4

Bulk parameter values for device simulations

| Parameter | Symbol | Unit | Perovskite | $TiO_2$ | $NiO_x$ |
|---|---|---|---|---|---|
| Thickness | h | nm | 460-970 | 70 | 10 |
| Band Gap | $E_g$ | eV | 1.62 | 3.2 | 3.75 |
| Electron Affinity | χ | eV | 3.9 | 4.0 | 1.96 |
| Rel. Permittivity | ε | | 6.5 | 31 | 10.3 |
| DOS, cond. band | $N_C$ | $cm^{-3}$ | $2.2 \times 10^{18}$ | $2.0 \times 10^{18}$ | $2.0 \times 10^{18}$ |
| DOS, val. band | $N_V$ | $cm^{-3}$ | $1.8 \times 10^{19}$ | $2.0 \times 10^{19}$ | $2.0 \times 10^{19}$ |
| Mobility, elec. | $\mu_n$ | $cm^2/V\ s$ | 20 | 2 | 2 |
| Mobility, holes | $\mu_p$ | $cm^2/V\ s$ | 20 | 2 | 2 |
| Lifetime, elec. | $\tau_n$ | ns | 192 | 0.1 | 0.1 |
| Lifetime, holes | $\tau_p$ | ns | 192 | 0.1 | 0.1 |
| Doping (acceptor, donor) | $N_A, N_D$ | $cm^{-3}$ | n: $2.6 \times 10^{13}$ | n: $10^{17}$ | p: $10^{17}$ |

EXAMPLES

Example 1. An all-back-contact photovoltaic device comprising, in order: a substrate; a first electrode having a first surface; an insulator; a second electrode having a second surface; and an active material, wherein: the insulator and the second electrode form a cavity, the active material substantially fills the cavity and is in physical contact with the first surface and the second surface, the insulator comprises a first layer and a second layer, the second layer is positioned between the first layer and the second contact, and the first layer is constructed of a first material that is different than a second material used to construct the second layer.

Example 2. The device of Example 1, wherein the active material comprises at least one of a perovskite, CdTe, a CIGS material, a CZTS material, silicon or an organic material.

Example 3. The device of Example 1, wherein the first material comprises at least one of a first polymer or a first inorganic material.

Example 4. The device of Example 3, wherein the first polymer comprises at least one of poly(methyl methacrylate), a cellulose, a polyimide, a polychloroprene, polyethylene terephthalate, a polyester, a polyolefin, polystyrene, or polyvinylchloride.

Example 5. The device of Example 3, wherein the first metal oxide comprises at least one of aluminum oxide, silicon dioxide, zirconium dioxide, beryllium oxide, magnesium oxide, iron oxide, aluminum nitride, silicon carbide, or hafnium oxide.

Example 6. The device of Example 1, wherein the second material comprises at least one of a second polymer or a second inorganic material.

Example 7. The device of Example 6, wherein the second polymer comprises at least one of poly(methyl methacrylate), a cellulose, a polyimide, a polychloroprene, polyethylene terephthalate, a polyester, a polyolefin, polystyrene, or polyvinylchloride.

Example 8. The device of Example 6, wherein the second metal oxide comprises at least one of aluminum oxide, silica, beryllium oxide, magnesium oxide, iron oxide, aluminum nitride, silicon carbide, or hafnium oxide.

Example 9. The device of Example 1, wherein: the first layer comprises silica, and the second layer comprises alumina.

Example 10. The device of Example 1, wherein the first layer has a thickness between about 1 nm and about 100 µm.

Example 11. The device of Example 1, wherein the second layer has a thickness between about 1 nm and about 100 µm.

Example 12. The device of Example 1, wherein the insulator has a resistance greater than $10^9$ Ohm*cm.

Example 13. The device of Example 1, wherein the cavity has a cross-sectional area between about 1 $nm^2$ and about 1 $mm^2$ or between about 10 $nm^2$ an about 100 $µm^2$.

Example 14. The device of Example 1, wherein: the first electrode comprises a first contact layer and a first charge transport layer, and the first contact layer is between the first charge transport layer and the substrate.

Example 15. The device of Example 14, wherein the first contact layer comprises at least one of a metal or a doped metal oxide.

Example 16. The device of Example 15, wherein the metal comprises at least one of gold, silver, aluminum, copper, or titanium, Example 17. The device of Example 15, wherein the doped metal oxide comprises at least one of indium-doped tin oxide, aluminum-doped zinc oxide, or indium-doped zinc oxide.

Example 18. The device of Example 1, wherein the first charge transport material comprises an electron transport material.

Example 19. The device of Example 18, wherein the electron transfer material comprises at least one of $TiO_2$, $SnO_2$, ZnO, CeO, $WO_3$, $In_2O_3$, $Fe_2O_3$, $Nb_2O_5$, C60, or PCBM.

Example 20. The device of Example 1, wherein the first charge transport material comprises a hole transport material.

Example 21. The device of Example 20, wherein the hole transport material comprises at least one of nickel oxide, copper oxide, spiro-MeOTAD, a family member of polytriarylamine, or EH44.

Example 22. The device of Example 14, wherein: the second contact comprises a second contact layer and a second charge transport layer, and the second contact layer is between the insulator and the second charge transport layer.

Example 23. The device of Example 22, wherein the second contact layer comprises at least one of a metal or a doped metal oxide.

Example 24. The device of Example 23, wherein the metal comprises at least one of gold, silver, aluminum, copper, or titanium, Example 25. The device of Example 23, wherein the doped metal oxide comprises at least one of indium-doped tin oxide, aluminum-doped zinc oxide, or indium-doped zinc oxide.

Example 26. The device of Example 1, wherein the second charge transport material comprises an electron transport material.

Example 27. The device of Example 26, wherein the electron transfer material comprises at least one of $TiO_2$, $SnO_2$, ZnO, CeO, $WO_3$, $In_2O_3$, $Fe_2O_3$, $Nb_2O_5$, C60, or PCBM.

Example 28. The device of Example 1, wherein the second charge transport material comprises a hole transport material.

Example 29. The device of Example 28, wherein the hole transport material comprises at least one of nickel oxide, copper oxide, spiro-MeOTAD, a family member of polytriarylamine, or EH44.

Example 30. The device of Example 22, wherein each of the first contact layer, the second contact layer, the first charge transport layer, and the second charge transport layer have a thickness greater than about 10 nm.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. An all-back-contact photovoltaic device comprising:
   a substrate;
   a first electrode comprising a first contact layer and a first charge transport layer;
   a layer comprising a perovskite;
   an insulator comprising a first layer and a second layer; and
   a second electrode comprising a second contact layer and a second charge transport layer, wherein:
   the first contact layer is positioned between the substrate and the first charge transport layer,
   the insulator is positioned between the first electrode and the second electrode,
   the second layer of the insulator is positioned between the first layer of the insulator and the second electrode, the second contact layer is positioned between the insulator and the second charge transport layer, the insulator and the second electrode form a stack covering a first portion of the first electrode, the insulator, the second electrode, and a second portion of the first electrode form a cavity having a substantially circular cross section with a diameter between greater than 10 μm and less than or equal to 20 μm, the layer of perovskite at least partially fills the cavity such that the layer of perovskite is in contact with both the first electrode and the second electrode, the first layer of the insulator has a thickness between 250 nm and 450 nm and comprises silica, the second layer of the insulator comprises alumina, the insulator has a resistance greater than $10^9$ Ohm*cm, as measured across the first layer and the second layer, the second contact layer comprises nickel metal, and the second charge transport layer comprises nickel oxide.

2. The device of claim 1, wherein the first contact layer has a thickness between about 1 nm and about 100 μm.

3. The device of claim 1, wherein the second contact layer has a thickness between about 1 nm and about 100 μm.

4. The device of claim 1, wherein the cavity has a cross-sectional area between 315 μm² and 1260 μm².

5. The device of claim 1, wherein the first contact layer comprises at least one of a metal or a doped metal oxide.

6. The device of claim 5, wherein the metal comprises at least one of gold, silver, aluminum, copper, or titanium.

7. The device of claim 5, wherein the doped metal oxide comprises at least one of indium-doped tin oxide, aluminum-doped zinc oxide, or indium-doped zinc oxide.

8. The device of claim 1, wherein the first charge transport material comprises an electron transport material.

9. The device of claim 8, wherein the electron transfer material comprises at least one of $TiO_2$, $SnO_2$, ZnO, CeO, $WO_3$, $In_2O_3$, $Fe_2O_3$, $Nb_2O_5$, C60, or PCBM.

10. The device of claim 1, wherein the nickel oxide is in the form of a layer surrounding the nickel metal.

11. The device of claim 10, wherein the nickel oxide is the result of oxidizing an outer portion of the nickel metal using ozone and ultraviolet light.

12. The device of claim 1, wherein a distance between the center of the cavity and the center of a neighboring cavity is between about 1 μm and about 50 μm.

13. The device of claim 1, wherein the thickness of the second layer of the insulator is between about 50 nm and about 150 nm.

* * * * *